US012757481B2

(12) United States Patent
Kudou et al.

(10) Patent No.: US 12,757,481 B2
(45) Date of Patent: Oct. 6, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Hiroyoshi Kudou, Tokyo (JP); Hideki Niwayama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 481 days.

(21) Appl. No.: 18/471,662

(22) Filed: Sep. 21, 2023

(65) Prior Publication Data

US 2024/0162221 A1 May 16, 2024

(30) Foreign Application Priority Data

Nov. 15, 2022 (JP) ................................ 2022-182554

(51) Int. Cl.
*H10D 1/47* (2025.01)
*H10D 30/01* (2025.01)
(Continued)

(52) U.S. Cl.
CPC ............ *H10D 84/811* (2025.01); *H10D 1/47* (2025.01); *H10D 30/0297* (2025.01); *H10D 30/66* (2025.01); *H10D 30/668* (2025.01); *H10D 62/109* (2025.01); *H10D 84/014* (2025.01); *H10D 84/0149* (2025.01); *H10D 84/0151* (2025.01); *H10D 84/0156* (2025.01);
(Continued)

(58) Field of Classification Search
None
See application file for complete search history.

(56) References Cited

U.S. PATENT DOCUMENTS 8,723,295 B2 5/2014 Fukui et al.
11,164,797 B2 * 11/2021 Toyoda ................ H10D 12/038
(Continued)

FOREIGN PATENT DOCUMENTS

JP 2002-299619 A 10/2002
JP 2007-281195 A 10/2007
(Continued)

OTHER PUBLICATIONS

Office Action dated Nov. 11, 2025, issued in corresponding Japan Patent Application No. 2022-182554.

*Primary Examiner* — Sue A Purvis
*Assistant Examiner* — Jordan M Klein
(74) *Attorney, Agent, or Firm* — Rimon P.C.

(57) ABSTRACT

Reliability of a semiconductor device is improved, and a decrease in yield is suppressed. A hard mask is formed on an upper surface of a semiconductor substrate. A trench is formed in the semiconductor substrate exposed out from the hard mask. A gate insulating film is formed in the trench. A conductive film is formed on the gate insulating film and the hard mask. The conductive film on the hard mask is removed, and a gate electrode is formed in the trench. A cap film is formed on an upper surface of the gate electrode. The hard mask is removed. A gate insulating film is formed on the upper surface of the semiconductor substrate. A conductive film is formed on the gate insulating film and the cap film. The conductive film on the cap film is removed, and a gate electrode is formed on the gate insulating film.

10 Claims, 43 Drawing Sheets

(51) Int. Cl.

| | |
|---|---|
| ***H10D 30/66*** | (2025.01) |
| ***H10D 62/10*** | (2025.01) |
| ***H10D 84/01*** | (2026.01) |
| ***H10D 84/03*** | (2025.01) |
| ***H10D 84/80*** | (2025.01) |
| ***H10P 14/60*** | (2026.01) |
| ***H10P 30/20*** | (2026.01) |
| ***H10P 30/22*** | (2026.01) |

(52) U.S. Cl.
CPC ....... *H10D 84/038* (2025.01); *H10P 14/6314* (2026.01); *H10P 14/6322* (2026.01); *H10P 30/204* (2026.01); *H10P 30/21* (2026.01); *H10P 30/22* (2026.01)

(56) References Cited

U.S. PATENT DOCUMENTS

| | | | | |
|---|---|---|---|---|
| 2005/0017294 | A1 | 1/2005 | Takemori et al. | |
| 2009/0273027 | A1* | 11/2009 | Adan ................. | H10D 30/0297 257/334 |
| 2014/0073102 | A1* | 3/2014 | Toyoda .............. | H10D 84/0195 438/270 |

FOREIGN PATENT DOCUMENTS

| | | | |
|---|---|---|---|
| JP | 2010-087133 | A | 4/2010 |
| JP | 2015-207787 | A | 11/2015 |
| JP | 2019-145537 | A | 8/2019 |
| WO | 2013-002129 | A1 | 1/2013 |

* cited by examiner

<FIRST EMBODIMENT>

<STUDY EXAMPLE 1>

<FIRST EMBODIMENT>

<STUDY EXAMPLE 1>

<FIRST EMBODIMENT>

<STUDY EXAMPLE 1>

<FIRST EMBODIMENT>

<STUDY EXAMPLE 1>

<FIRST EMBODIMENT>

<STUDY EXAMPLE 1>

<STUDY EXAMPLE 2>

<STUDY EXAMPLE 3>

| | SLIT | HYDROGEN ALLOY PROCESS |
|---|---|---|
| □ | WITHOUT SLIT | NOT APPLIED |
| △ | WITH SLIT | NOT APPLIED |
| ○ | WITH SLIT | APPLIED |

<SECOND EMBODIMENT>

<STUDY EXAMPLE 4>

SEMICONDUCTOR DEVICE AND METHOD OF MANUFACTURING THE SAME

CROSS-REFERENCE TO RELATED APPLICATION

The disclosure of Japanese Patent Application No. 2022-182554 filed on Nov. 15, 2022, including the specification, drawings and abstract is incorporated herein by reference in its entirety.

BACKGROUND

The present invention relates to a semiconductor device and a method of manufacturing the same, and particularly to a semiconductor device including a trench gate-type MOSFET and a method of manufacturing the same.

To a semiconductor device requiring a high withstand voltage, a semiconductor element such as a trench gate-type MOSFET (metal oxide semiconductor field effect transistor) in which a gate electrode is embedded into a trench is applied. A semiconductor device using the trench gate-type MOSFET as an output circuit and using a planar-type MOSFET as a control circuit that controls a gate potential of the output circuit has been developed. Such a semiconductor device is referred to as an IPD (intelligent power device).

A form of the semiconductor device constituting the IPD is a semiconductor module on which a semiconductor chip for an output circuit and a semiconductor chip for controlling a control circuit are mounted as one package. Another form of the semiconductor device is one in which MOSFETs respectively constituting an output circuit and a control circuit are formed on the same semiconductor substrate and are mounted in a mixed manner in one semiconductor chip.

There are disclosed techniques listed below.

[Patent Document 1] Japanese Unexamined Patent Application Publication No. 2010-87133

[Patent Document 2] Japanese Unexamined Patent Application Publication No. 2019-145537

[Patent Document 3] Japanese Unexamined Patent Application Publication No. 2015-207787

For example, each of the Patent Documents 1 to 3 discloses a semiconductor device in which MOSFETs respectively constituting an output circuit and a control circuit are formed on the same semiconductor substrate as an IPD. The Patent Document 1 also discloses a technique for respectively forming a gate electrode of a trench gate-type MOSFET and a gate electrode of a planar-type MOSFET in separate manufacturing processes in an IPD.

SUMMARY

Forming MOSFETs respectively constituting an output circuit and a control circuit on the same semiconductor substrate has an advantage in terms of, for example, a decrease in mounting cost and downsizing of a semiconductor device. However, a trench gate-type MOSFET for an output circuit and a planar-type MOSFET for a control circuit differ in device structure and also differ in characteristic to be required, and therefore, manufacturing processes tends to be complicated. Accordingly, a malfunction that has not individually occurred may occur in a process of manufacturing the trench gate-type MOSFET and a process of manufacturing the planar-type MOSFET, and therefore, a problem of a deterioration in the reliability of the semiconductor device and a problem of a decrease in yield arise.

A main object of the present invention is to provide a technique capable of improving reliability of a semiconductor device and suppressing a decrease in yield when a trench gate-type MOSFET and a planar-type MOSFET are formed on the same semiconductor substrate. Other problems and novel characteristics will be apparent from the description of the present specification and the accompanying drawings.

An outline of typical aspects of embodiments disclosed in the present application will be briefly described below.

A method of manufacturing a semiconductor device according to one embodiment includes a step (a) of preparing a semiconductor substrate of a first conductivity type having an upper surface and a lower surface, a step (b) of forming a first hard mask on the upper surface of the semiconductor substrate to selectively cover the upper surface of the semiconductor substrate after the step (a), a step (c) of forming a trench in the semiconductor substrate exposed from the first hard mask after the step (b), a step (d) of forming a first gate insulating film in the trench after the step (c), a step (e) of forming a first conductive film on the first gate insulating film and the first hard mask after the step (d), a step (f) of removing the first conductive film on the first hard mask by performing anisotropic etching process to the first conductive film and forming a first gate electrode in the trench to be embedded into the trench to interpose the first gate insulating film therebetween after the step (e), a step (g) of forming a first cap film composed of an insulating film on an upper surface of the first gate electrode after the step (f), a step (h) of removing the first hard mask after the step (g), a step (i) of forming a second gate insulating film on the upper surface of the semiconductor substrate after the step (h), a step (j) of forming a second conductive film on the second gate insulating film and the first cap film after the step (i), and a step (k) of removing the second conductive film on the first cap film and forming a second gate electrode on the upper surface of the semiconductor substrate to interpose the second gate insulating film therebetween by patterning the second conductive film after the step (j).

A semiconductor device according to one embodiment has a first region where a first MOSFET for an output circuit is formed and a second region where a second MOSFET for a control circuit that controls a gate potential of the first MOSFET is formed. The semiconductor device includes a semiconductor substrate of a first conductivity type having an upper surface and a lower surface, a trench formed in the semiconductor substrate in the first region to a predetermined depth from the upper surface of the semiconductor substrate, a first gate insulating film formed on a side surface and a bottom surface of the trench, a first gate electrode formed in the trench to be embedded into the trench to interpose the first gate insulating film therebetween, a first insulating film formed to cover an upper surface of the first gate electrode, a second gate insulating film formed on the upper surface of the semiconductor substrate in the second region, and a second gate electrode formed on the second gate insulating film. The first MOSFET has the first gate insulating film, the first gate electrode, and the first insulating film, the second MOSFET has the second gate insulating film and the second gate electrode, the first gate electrode is formed of a first polycrystalline silicon film doped with impurities, the first insulating film is a silicon oxide film formed by thermally oxidizing an upper surface of the first polycrystalline silicon film, a thickness of the first insulation film is larger than a thickness of each of the first gate insulating film and the second gate insulating film, and the upper surface of the semiconductor substrate is positioned within a range of the thickness of the first insulating film.

According to one embodiment, reliability of a semiconductor device can be improved, and a decrease in yield can be suppressed.

BRIEF DESCRIPTIONS OF THE DRAWINGS

DETAILED DESCRIPTION

Hereinafter, embodiments of the present invention will be described in detail with reference to the accompanying drawings. Note that components having the same function are denoted by the same reference signs throughout all the drawings for describing the embodiments, and the repetitive description thereof will be omitted. In addition, the description of the same or similar portions is not repeated in principle unless otherwise particularly required in the following embodiments.

An X-direction, a Y-direction, and a Z-direction described in the present application intersect one another and perpendicular to one another. In the present application, the Z-direction is determined as an up-down direction, a height direction, or a thickness direction of a structure. An expression such as "plan view" or "planar view" used in the present application means that a "plane" that is a surface configured by the X-direction and the Y-direction is viewed in the Z-direction.

First Embodiment

<Structure of Semiconductor Device>

A semiconductor device 100 according to a first embodiment will be described below with reference to FIGS. 1 to 7. The semiconductor device 100 is a semiconductor chip, i.e., an IPD in which an output circuit that drives an external load of the semiconductor device 100 and a control circuit that controls a gate potential of the output circuit are formed on the same semiconductor substrate SUB. The load is, for example, each of various electronic components mounted on a vehicle.

Figure 1:
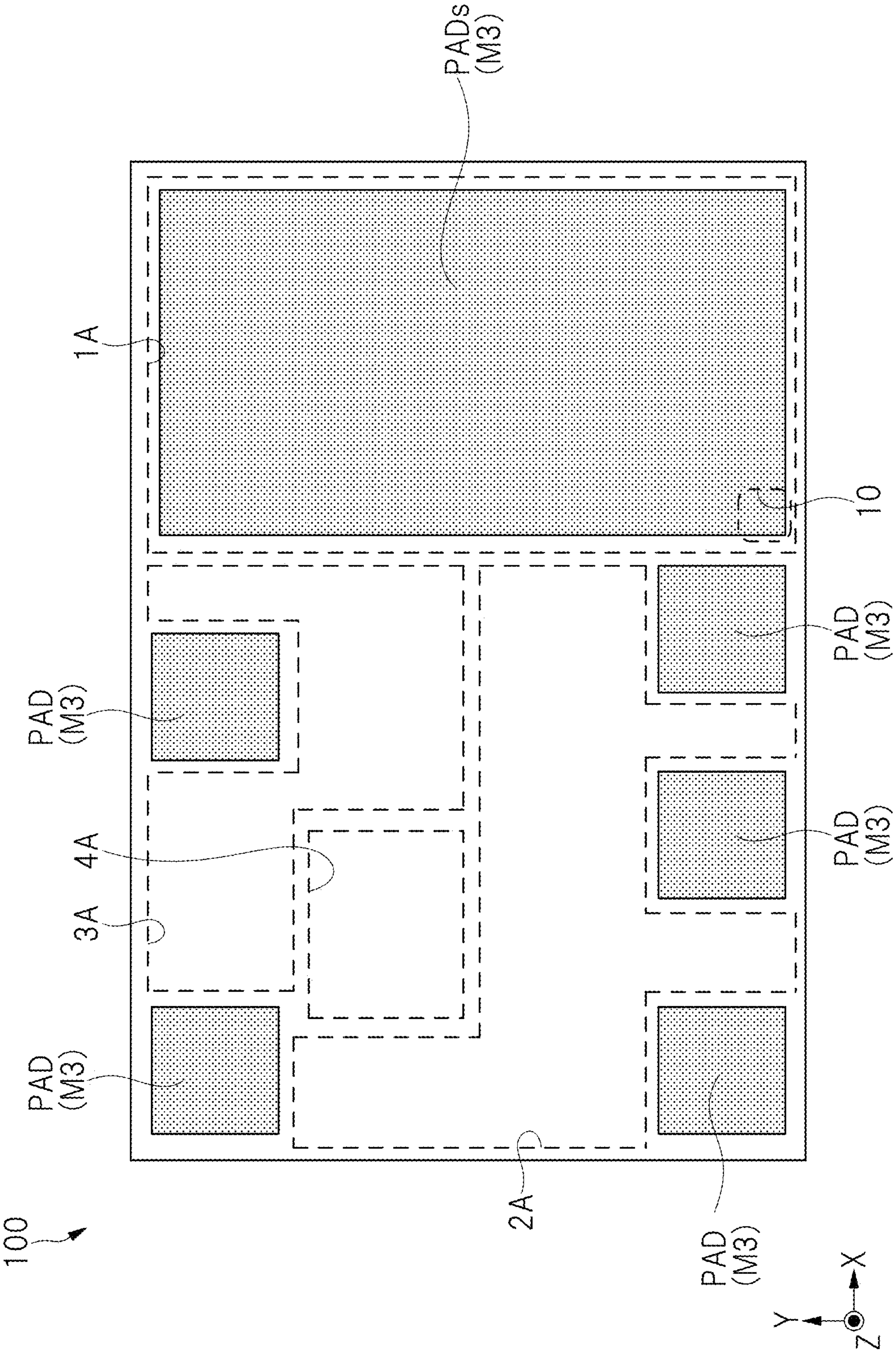
FIG. 1 is a plan view illustrating a semiconductor device according to a first embodiment.

FIG. 1 is a plan view of the semiconductor chip as the semiconductor device 100. As illustrated in FIG. 1, the semiconductor device 100 has a region 1A where a MOSFET for an output circuit is formed and regions 2A to 4A where semiconductor devices such as a MOSFET for a control circuit and a resistor element are formed. A layout of the regions 2A to 4A is not limited to an example illustrated in FIG. 1 but can be freely designed as needed.

FIG. 1 illustrates a plurality of pads PAD and a source pad PADs, respectively, as parts of a wiring M3 on an uppermost layer. The source pad PADs is provided above the region 1A, and is an output terminal of the output circuit. The plurality of pads PAD are provided around the regions 2A to 4A. Various types of signals from outside the semiconductor device 100 and a ground potential are transmitted to the control circuit via the plurality of pads PAD.

Figure 2:
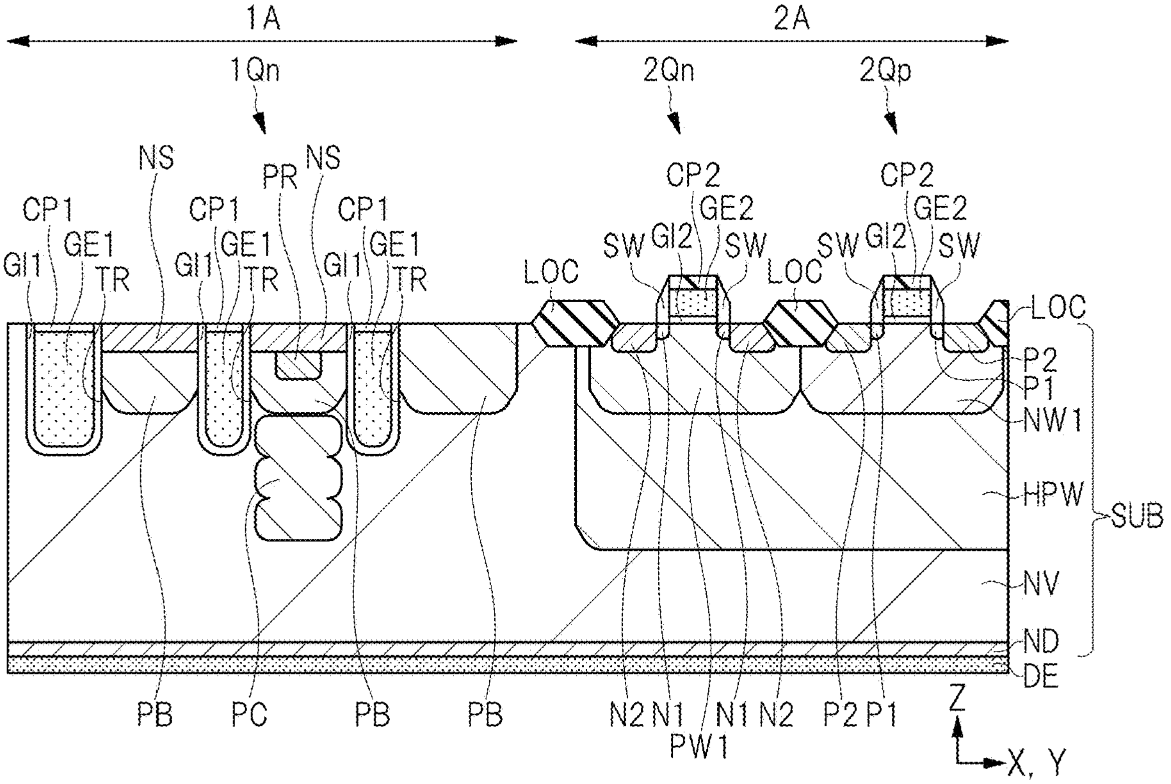
FIG. 2 is a cross-sectional view illustrating the semiconductor device according to the first embodiment.
Figure 4:
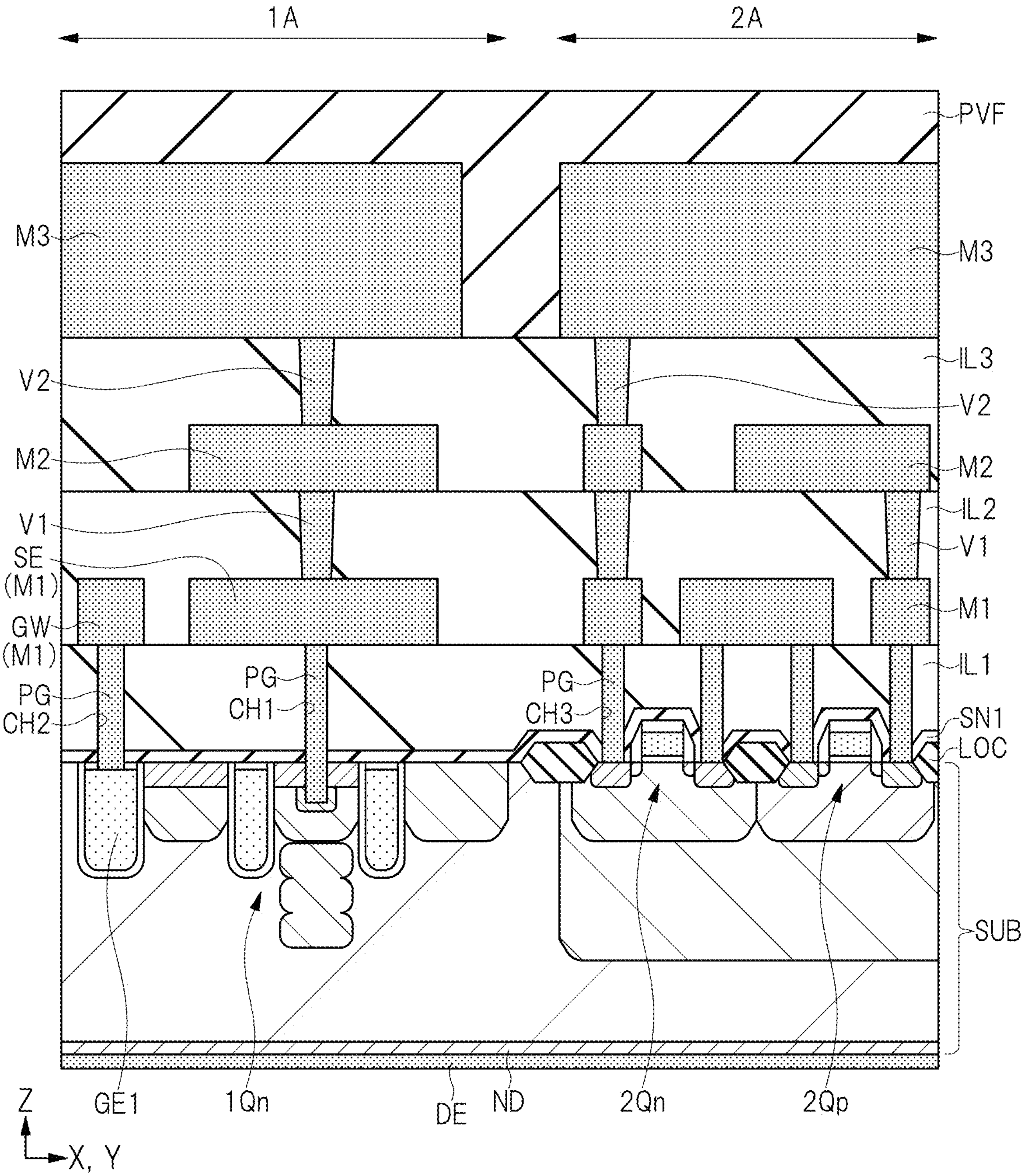
FIG. 4 is a cross-sectional view illustrating the semiconductor device according to the first embodiment.

FIG. 2 illustrates an n-type MOSFET 1Qn formed in the region 1A and an n-type MOSFET 2Qn and a p-type MOSFET 2Qp formed in the region 2A. The MOSFET 1Qn is a trench gate-type MOSFET, and the MOSFET 2Qn and 2Qp are each a planar-type MOSFET. FIG. 4 illustrates a wiring structure formed above the MOSFETs 1Qn, 2Qn, and 2Qp.

Figure 3:
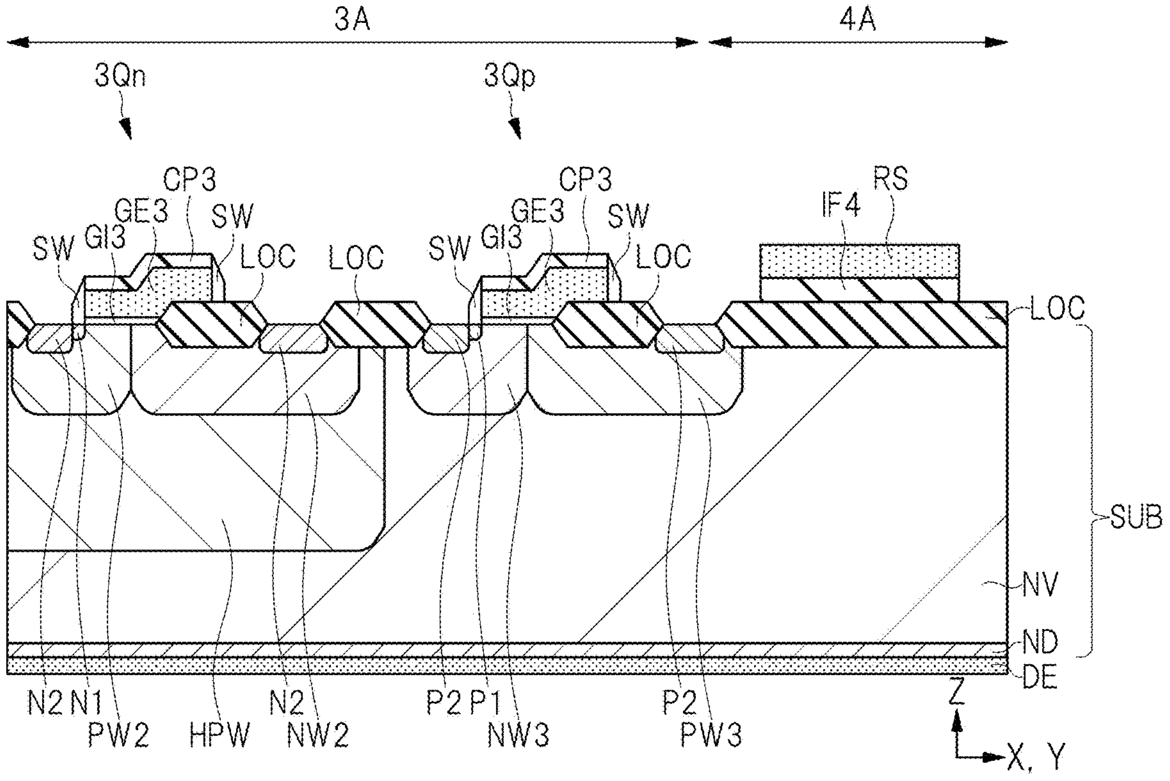
FIG. 3 is a cross-sectional view illustrating the semiconductor device according to the first embodiment.
Figure 5:
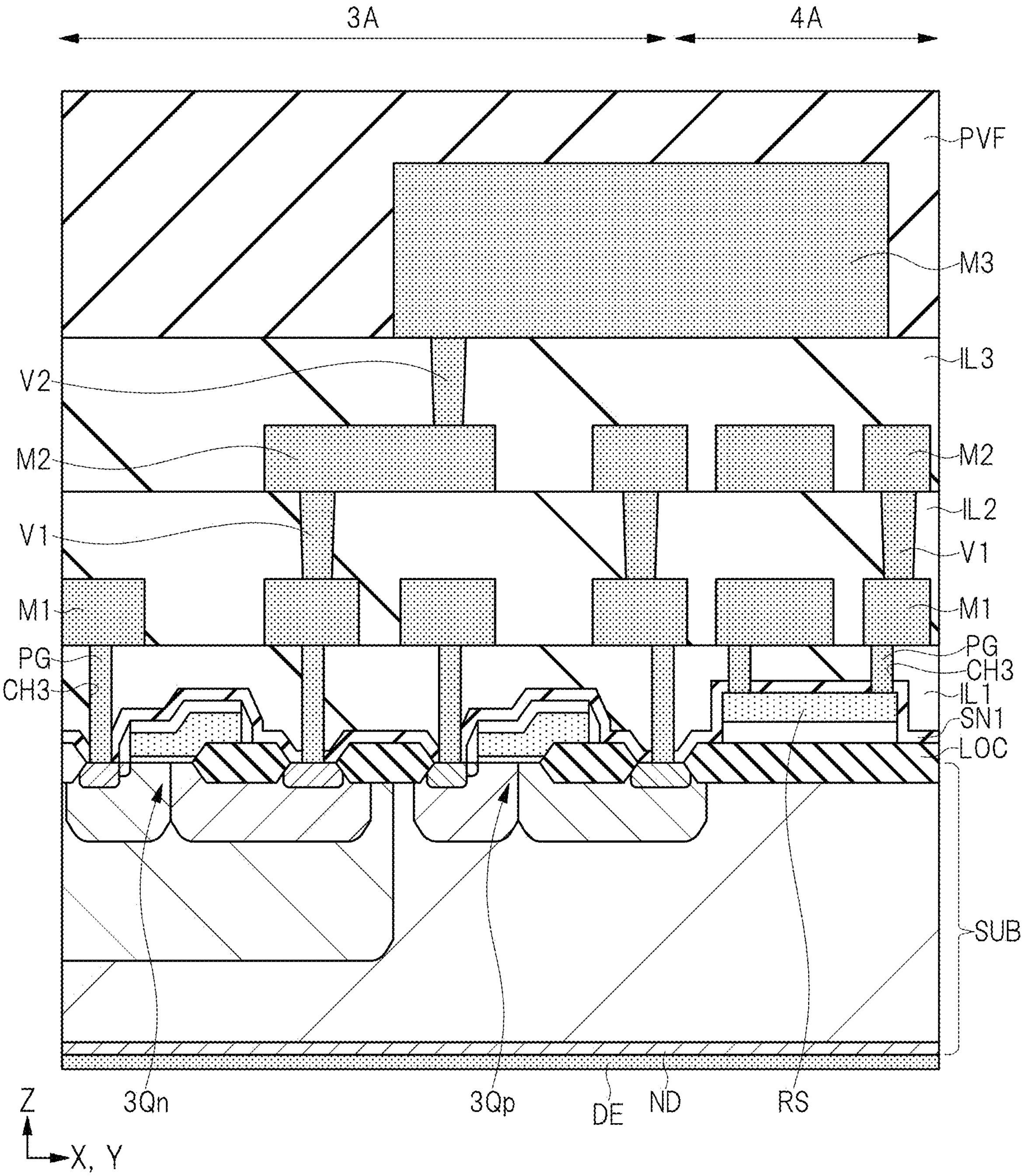
FIG. 5 is a cross-sectional view illustrating the semiconductor device according to the first embodiment.

FIG. 3 illustrates an n-type MOSFET 3Qn and a p-type MOSFET 3Qp formed in the region 3A and a resistor element RS formed in the region 4A. The MOSFETs 3Qn and 3Qp are each a planar-type MOSFET. FIG. 5 illustrates a wiring structure formed above the MOSFETs 3Qn and 3Qp and the resistor element RS.

Figure 6:
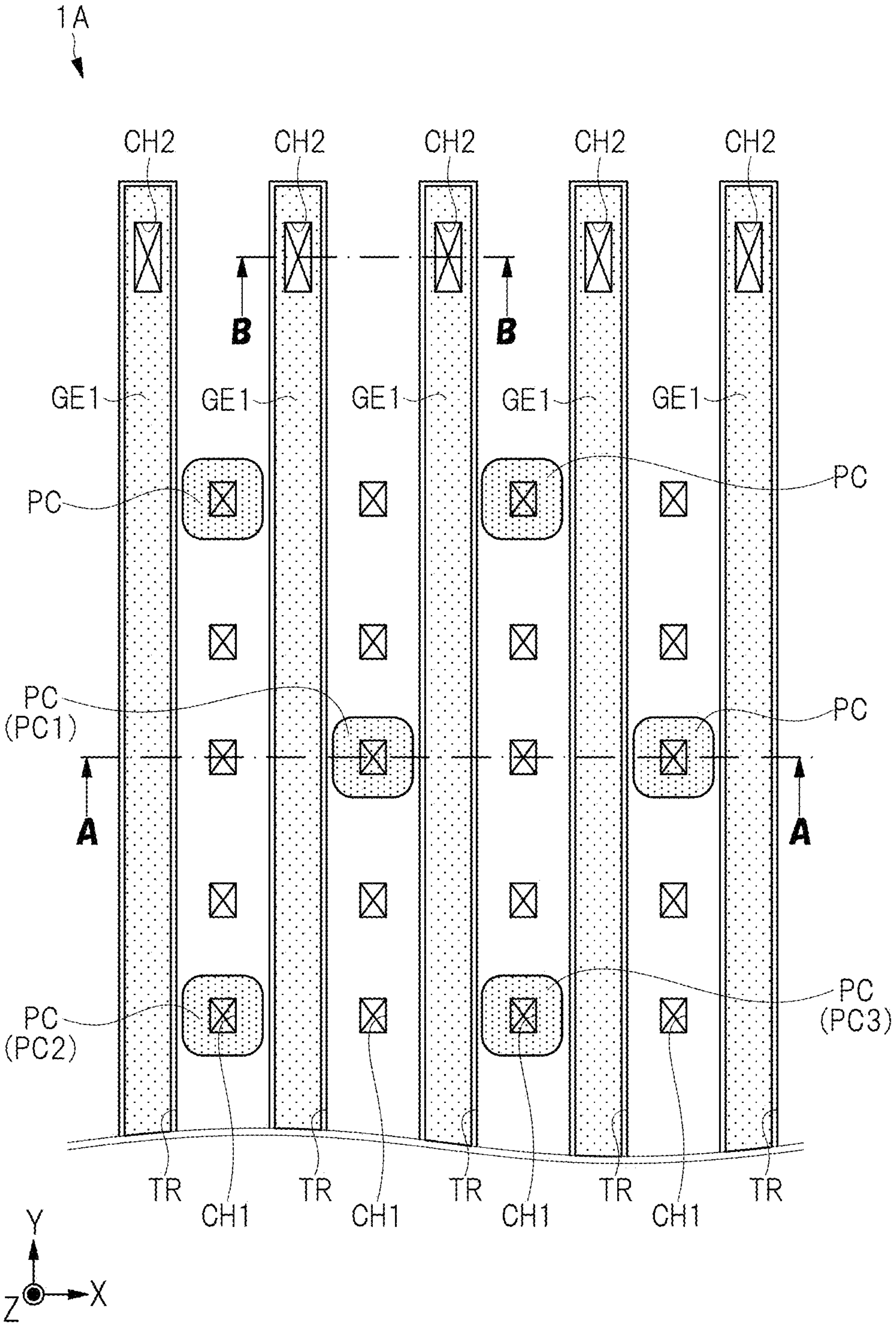
FIG. 6 is a partially enlarged plan view of the semiconductor device according to the first embodiment.
Figure 7:
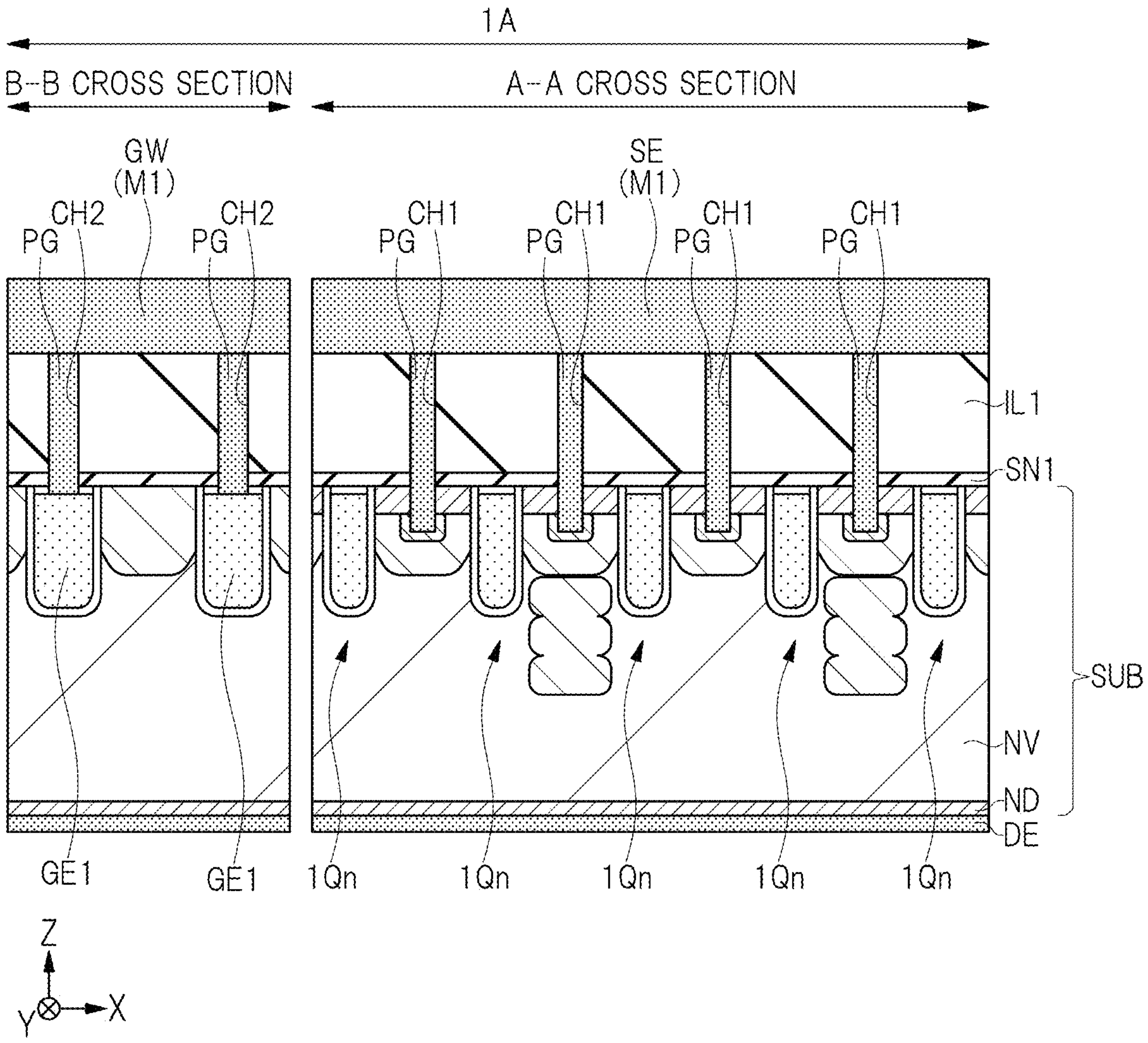
FIG. 7 is a cross-sectional view illustrating the semiconductor device according to the first embodiment.

FIG. 2 typically illustrates only a part of a structure of the region LA, and FIGS. 6 and 7 each illustrate a specific structure of the region LA. FIG. 6 is a plan view illustrating a plurality of MOSFETs 1Qn. FIG. 7 is a cross-sectional view taken along a line A-A and a line B-B illustrated in FIG. 6.

<MOSFET 1Qn in Region 1A>

First, a structure of the MOSFET 1Qn in the region LA will be described with reference to FIGS. 2, 6 and 7. As described below, the MOSFET 1Qn includes a gate insulating film GI1, a gate electrode GE1, a body region PB, a source region NS, a high-concentration diffusion region PR, a column region PC, and a cap film CP1. The MOSFET 1Qn includes a drain region ND and a drift region NV (a semiconductor substrate SUB in the region LA) as a drain.

As illustrated in FIG. 6, a plurality of trenches TR are formed in the semiconductor substrate SUB. The plurality of trenches TR are formed in a stripe shape, respectively extend in the Y-direction, and are adjacent to one another in the X-direction. The gate electrode GE1 is formed in each of the trenches TR. A plurality of holes CH1 are arranged while separating from one another in an extension direction of the trench TR. A source electrode SE is electrically connected to the source region NS and the body region PB via the holes CH1. A hole CH2 is arranged on the gate electrode GE1 in the vicinity of an end portion of the trench TR. A gate wiring GW and the gate electrode GE1 are electrically connected to each other via the hole CH2.

As illustrated in FIGS. 2 and 7, the semiconductor device 100 includes the n-type semiconductor substrate SUB having an upper surface and a lower surface. The semiconductor substrate SUB is composed of silicon. The semiconductor substrate SUB has the n-type drift region NV having a low concentration. The n-type semiconductor substrate SUB itself constitutes the drift region NV. The drift region NV may be an n-type semiconductor layer grown by an epitaxial growth method while an n-type silicon substrate is doped with phosphorus (P). In the present application, description is made assuming that a stacked body including the n-type silicon substrate and an n-type semiconductor layer is also a semiconductor substrate SUB.

On the upper surface side of the semiconductor substrate SUB, the trench TR that reaches a predetermined depth from the upper surface of the semiconductor substrate SUB is formed in the semiconductor substrate SUB. The depth of the trench TR is, for example, 0.5 μm or more and 2 μm or less. The gate insulating film GI1 is formed in the trench TR (a side surface and a bottom surface of the trench TR). The gate insulating film GI1 is, for example, a silicon oxide film, and has a thickness of, for example, 10 nm or more and 20 nm or less.

The gate electrode GE1 is formed in the trench TR to be embedded into the trench TR to interpose the gate insulating film GI1 therebetween. The gate electrode GE1 is composed of, for example, a polycrystalline silicon film doped with n-type impurities. The cap film CP1 is formed on an upper surface of the gate electrode GE1 to cover the upper surface of the gate electrode GE1. The cap film CP1 is an insulating film, and is a silicon oxide film formed by thermally oxidizing the upper surface of the gate electrode GE1 (the polycrystalline silicon film). The thickness of the cap film CP1 is larger than the thickness of each of the gate insulating film GI1 and gate insulating films GI2 and GI3 described below, and is, for example, 40 μm or more and 60 μm or less.

On the upper surface side of the semiconductor substrate SUB, the p-type body region PB is formed in the semiconductor substrate SUB to be shallower than the depth of the trench TR. The n-type source region NS is formed in the body region PB. The source region NS has a higher impurity concentration than that of the drift region NV.

The p-type column region PC is formed in the semiconductor substrate SUB positioned below the body region PB. As illustrated in FIG. 6, a plurality of column regions PC are provided away from one another with equal spacing in the extension direction (Y-direction) of the trench TR. A plurality of column regions PC are arranged in a staggered shape. When the p-type column regions PC are two-dimensionally arranged in the n-type drift region NV, the periphery of each of the column regions PC is depleted, and therefore, a withstand voltage is improved. A regular triangle is constituted by lines connecting respective centers of the plurality of column regions PC such as column regions PC1 to PC3. This makes it easy to uniform the depletion layers extending from the respective column regions PC, and makes it easy to achieve sufficient depletion among the column regions PC.

On the lower surface side of the semiconductor substrate SUB, the n-type drain region ND is formed in the semiconductor substrate SUB. The drain region ND has a higher impurity concentration than that of the drift region NV. A drain electrode DE is formed below the lower surface of the semiconductor substrate SUB. The drain electrode DE is composed of a single-layer metal film such as an aluminum film, a titanium film, a nickel film, a gold film, or a silver film or a stacked film obtained by appropriately stacking the metal films. The drain region ND and the drain electrode DE are formed over the regions 1A to 4A.

The drain region ND and the semiconductor substrate SUB (the drift region NV) constitute a drain of the MOSFET 1Qn. A power supply potential is supplied as a drain potential from outside the semiconductor device 100 to the drain region ND and the semiconductor substrate SUB via the drain electrode DE.

When the semiconductor substrate SUB is a stacked body of an n-type silicon substrate and an n-type semiconductor layer, the n-type silicon substrate may function as the drain region ND. In the case, the drain region ND may not be formed. That is, the formation of the drain region ND is not essential.

A silicon nitride film SN1 and an interlayer insulating film IL1 are formed on the upper surface of the semiconductor substrate SUB to cover the gate electrode GE1. The interlayer insulating film IL1 is formed on the silicon nitride film SN1. The thickness of the silicon nitride film SN1 is, for example, 10 nm or more and 20 nm or less. The thickness of the interlayer insulating film IL1 is, for example, 700 nm or more and 900 nm or less. The interlayer insulating film IL1 is, for example, a stacked film of a thin silicon oxide film and a thick silicon oxide film (BPSG: a boro phospho silicate glass film) containing boron and phosphorus.

The hole CH1 is formed in the interlayer insulating film IL1, the silicon nitride film SN1, the source region NS, and the body region PB. A bottom portion of the hole CH1 is positioned in the body region PB. The high-concentration diffusion region PR is formed in the body region PB in the vicinity of the bottom portion of the hole CH1. The high-concentration diffusion region PR has a higher impurity concentration than that of the body region PB. The hole CH2 is formed in the interlayer insulating film IL1 and the silicon nitride film SN1 to penetrate the cap film CP1 and reach the gate electrode GE1.

A plug PG is formed in each of the hole CH1 and the hole CH2. A plurality of wirings M1 are formed on the interlayer insulating film IL1. In the region LA, respective parts of the plurality of wirings M1 function as a source electrode SE and a gate wiring GW. The source electrode SE is electrically connected to the source region NS, the body region PB, and the high-concentration diffusion region PR via the plug PG in the hole CH1. The gate wiring GW is electrically connected to the gate electrode GE1 via the plug PG in the hole CH2.

The gate wiring GW is electrically connected to semiconductor elements such as the MOSFETs 2Qn, 2Qp, 3Qn, and 3Qp and the resistor element RS via other wirings such as the wirings M1 in the regions 2A to 4A. Therefore, a potential to be supplied to the gate electrode GE1 is controlled by respective control circuits in the regions 2A to 4A including the above-described semiconductor elements.

The plug PG is composed of a stacked film of a barrier metal film and a conductive film formed on the barrier metal film. The barrier metal film is, for example, a stacked film of a titanium film and a titanium nitride film. The conductive film is, for example, a tungsten film.

The wiring M1 is composed of a stacked film of a first barrier metal film, a conductive film formed on the first barrier metal film, and a second barrier metal film formed on the conductive film. The first barrier metal film is, for example, a stacked film of a titanium film and a titanium nitride film. The conductive film is, for example, an aluminum film or an aluminum alloy film to which copper or silicon is added. The second barrier metal film is, for example, a stacked film of a titanium film and a titanium nitride film.

<MOSFETS 2Qn and 2Qp in Region 2A>

Respective structures of the MOSFETs 2Qn and 2Qp in the region 2A will be described below with reference to FIG. 2.

As described below, the MOSFET 2Qn includes a gate insulating film GI2, a gate electrode GE2, a cap film CP2, a sidewall spacer SW, and a well region PW1. A source region and a drain region of the MOSFET 2Qn are respectively composed of an impurity region N1 and an impurity region N2.

The MOSFET 2Qp includes a gate insulating film GI2, a gate electrode GE2, a cap film CP2, a sidewall spacer SW, and a well region NW1. A source region and a drain region of the MOSFET 2Qp are respectively composed of an impurity region P1 and an impurity region P2.

A p-type well region HPW is formed in the semiconductor substrate SUB in the region 2A and the region 3A. The well region HPW is mainly provided to isolate the well region NW1 in the region 2A and a well region NW2 in the region 3A from the n-type semiconductor substrate SUB.

The p-type well region PW1 and the n-type well region NW1 are formed in the well region HPW in the region 2A. The gate insulating film GI2 is formed on each of the well region PW1 and the well region NW1. The gate insulating film GI2 is, for example, a silicon oxide film, and has a thickness of, for example, 10 nm or more and 20 nm or less. The gate electrode GE2 is formed on the gate insulating film GI2.

The MOSFETs 2Qn and 2Qp in the region 2A are intended to be driven at high speed, and are driven at a lower operation voltage than that of the MOSFET 1Qn in the region LA. Therefore, a material contained in the gate electrode GE2 differs from a material contained in the gate electrode GE1, and has a lower sheet resistance than the sheet resistance of the material contained in the gate electrode GE1. The gate electrode GE2 is formed by a manufacturing process that is different from that of the gate electrode GE1. The gate electrode GE2 is composed of, for example, a stacked film of a polycrystalline silicon film doped with n-type impurities, and a tungsten silicide film formed on the polycrystalline silicon film.

The thickness of the polycrystalline silicon film is 60 nm or more and 100 nm or less, and the thickness of the tungsten silicide film is 80 m or more and 120 nm or less. The impurity concentration of the polycrystalline silicon film included in the gate electrode GE2 is equal to or higher than the impurity concentration of the polycrystalline silicon film included in the gate electrode GE1.

The cap film CP2 is formed on an upper surface of the gate electrode GE2. The cap film CP2 is an insulating film such as a silicon oxide film. The thickness of the cap film CP2 is, for example, 100 μm or more and 150 μm or less. The sidewall spacer SW is formed on a side surface of the gate electrode GE2. The sidewall spacer SW is, for example, a silicon oxide film.

The n-type impurity region N1 and the n-type impurity region N2 are formed in the well region PW1. The well region PW1 sandwiched between a pair of impurity regions N1 and positioned below the gate electrode GE2 is a channel region of the MOSFET 2Qn. The impurity region N2 is formed to a position deeper than the impurity region N1, and has a higher impurity concentration than that of the impurity region N1.

The p-type impurity region P1 and the p-type impurity region P2 are formed in the well region NW1. The well region NW1 sandwiched between a pair of impurity regions P1 and positioned below the gate electrode GE2 is a channel region of the MOSFET 2Qp. The impurity region P2 is formed to a position deeper than the impurity region P1, and has a higher impurity concentration than that of the impurity region P1.

The regions LA to 4A are separated from one another by element isolation sections LOC formed in the semiconductor substrate SUB. Each of the element isolation sections LOC is, for example, a silicon oxide film, and has a thickness of, for example, 300 nm or more and 600 nm or less. The element isolation sections LOC are respectively formed in a boundary between the MOSFET 2Qn and the MOSFET 2Qp in the region 2A, a boundary between the MOSFET 3Qn and the MOSFET 3Qp in the region 3A and others.

<MOSFETS 3Qn and 3Qp in Region 3A>

Respective structures of the MOSFETs 3Qn and 3Qp in the region 3A will be described below with reference to FIG. 3.

As described below, the MOSFET 3Qn includes a gate insulating film GI3, a gate electrode GE3, a cap film CP3, a sidewall spacer SW, a well region PW2, and an element isolation section LOC. A source region of the MOSFET 3Qn includes an impurity region N1 and an impurity region N2. A drain region of the MOSFET 3Qn includes a well region NW2 and an impurity region N2.

The MOSFET 3Qp includes a gate insulating film GI3, a gate electrode GE3, a cap film CP3, a sidewall spacer SW, a well region NW3, and an element isolation section LOC. A source region of the MOSFET 3Qp is composed of an impurity region P1 and an impurity region P2. A drain region of the MOSFET 3Qp is composed of a well region PW3 and an impurity region P2.

The p-type well region PW2 and the n-type well region NW2 are formed in the well region HPW in the region 3A. The gate insulating film GI3 is formed on the well region PW2 and the well region NW2. The gate electrode GE3 is formed on the gate insulating film GI3. The cap film CP3 is formed on an upper surface of the gate electrode GE3. The sidewall spacer SW is formed on a side surface of the gate electrode GE3.

The element isolation section LOC is formed in a part of the well region NW2. A part of the gate electrode GE3 is formed on the element isolation section LOC, and an end portion of the gate electrode GE3 on the drain region side is positioned on the element isolation section LOC.

The MOSFETs 3Qn and 3Qp in the region 3A are driven at a higher operation voltage than those of the MOSFETs 2Qn and 2Qp in the region 2A. For example, a potential of about 5 volts is applied to the drain region of the MOSFET 2Qn in the region 2A while a potential of 10 volts or more is applied to the drain region of the MOSFET 3Qn in the region 3A. Therefore, the element isolation region LOC is provided below the gate electrode GE3 on the drain region side in the MOSFET 3Qn to moderate electric field concentration in the drain region.

The n-type impurity region N1 and the n-type impurity region N2 are formed in the well region PW2. The n-type impurity region N2 is formed in the well region NW2. A portion of the well region PW2 sandwiched between the impurity region N1 in the well region PW2 and the well region NW2 and positioned below the gate electrode GE3 is a channel region of the MOSFET 3Qn.

The n-type well region NW3 and the p-type well region PW3 are formed in the semiconductor substrate SUB in the region 3A. The gate insulating film GI3 is formed on the well region NW3 and the well region PW3. The gate electrode GE3 is formed on the gate insulating film GI3. The cap film CP3 is formed on the upper surface of the gate electrode GE3. The sidewall spacer SW is formed on the side surface of the gate electrode GE3.

Even in the MOSFET 3Qp, the element isolation section LOC is formed in a part of the well region NW3 to moderate electric field concentration in the drain region. A part of the gate electrode GE3 is formed on the element isolation section LOC, and an end portion of the gate electrode GE3 on the drain region side is positioned on the element isolation section LOC.

The p-type impurity region P1 and the p-type impurity region P2 are formed in the well region NW3. The p-type impurity region P2 is formed in the well region PW3. The well region NW3 sandwiched between the impurity region P1 in the well region NW3 and the well region PW3 and positioned below the gate electrode GE3 is a channel region of the MOSFET 3Qp.

The gate insulating film GI3, the gate electrode GE3, the cap film CP3, and the sidewall spacer SW in the region 3A are respectively formed by the same manufacturing processes as those of the gate insulating film GI2, the gate electrode GE2, the cap film CP2, the sidewall spacer SW in the region 2A. Therefore, their respective materials and thicknesses are similar to those described in the MOSFETs 2Qn and 2Qp in the region 2A.

<Resistor Element RS in Region 4A>

A structure of the resistor element RS in the region 4A will be described with reference to FIG. 3 described below.

The element isolation section LOC is formed in the semiconductor substrate SUB in the region 4A. An insulating film IF4 is formed on the element isolation section LOC. The insulating film IF4 is, for example, a silicon oxide film, and has a thickness of, for example, 50 nm or more and 70 nm or less.

The resistor element RS is formed on the insulating film IF4. The resistor element RS needs to be designed such that a high resistance value is obtained. Accordingly, a material contained in the resistor element RS has a higher sheet resistance than the sheet resistance of a material contained in the gate electrodes GE1 to GE3. The resistor element RS is formed in a manufacturing process that is different from those of the gate electrodes GE1 to GE3. The resistor element RS is, for example, a polycrystalline silicon film doped with p-type impurities, and has a thickness of, for example, 120 nm or more and 180 nm or less.

<Wiring Structure>

A wiring structure formed above the MOSFETs 1Qn, 2Qn, 2Qp, 3Qn, and 3Qp and the resistor element RS will be described below with reference to FIGS. 4 and 5.

In the regions 2A to 4A, the silicon nitride film SN1 and the interlayer insulating film IL1 are formed on the upper surface of the semiconductor substrate SUB to cover the gate electrodes GE2 and GE3 and the resistor element RS. A material contained in the interlayer insulating film IL1 is similar to that described in the region LA.

In the MOSFETs 2Qp and 3Qp, positive charges are trapped into the gate insulating films GI2 and GI3 so that NBTI may deteriorate. When the MOSFETs 2Qp and 3Qp are covered with the silicon nitride film SN1, and therefore, the positive charges can be prevented from entering the gate insulating films GI2 and GI3, and the reliability of the semiconductor device 100 can be improved.

In the regions 2A to 4A, a plurality of holes CH3 are formed in the interlayer insulating film IL1 and the silicon nitride film SN1. A plug PG is formed in each of the plurality of holes CH3. The plurality of wirings M1 are formed on the interlayer insulating film IL1. Materials respectively contained in the plug PG and the wiring M1 are similar to those described in the region LA.

The impurity regions N2 and P2 and the resistor element RS are electrically connected to the plurality of wirings M1 via the plugs PG in the holes CH3. The gate electrodes GE2 and GE3 are also electrically connected to the wirings M1 via the plugs PG in the holes CH3, which is not illustrated.

In the regions LA to 4A, an interlayer insulating film IL2 is formed on the interlayer insulating film IL1 to cover the plurality of wirings M1. The interlayer insulating film IL2 is, for example, a silicon oxide film. The thickness of the interlayer insulating film IL2 is, for example, 650 nm or more and 850 nm or less.

A plurality of vias V1 connected to the plurality of wirings M1 are formed in the interlayer insulating film IL2. The via V1 is configured by embedding a stacked film of a barrier metal film and a conductive film into a contact hole formed in the interlayer insulating film IL2. The barrier metal film is, for example, a titanium nitride film. The conductive film is, for example, a tungsten film.

A plurality of wirings M2 connected to the plurality of vias V1 are formed on the interlayer insulating film IL2. A material contained in the wiring M2 is the same as that contained in the wiring M1. An interlayer insulating film IL3 is formed on the interlayer insulating film IL2 to cover the plurality of wirings M2. A material contained in the interlayer insulating film IL3 is the same as that contained in the interlayer insulating film IL2. The thickness of the interlayer insulating film IL3 is, for example, 650 nm or more and 850 nm or less. A plurality of vias V2 connected to the plurality of wirings M2 are formed in the interlayer insulating film IL3. A configuration of the via V2 is the same as that of the via V1.

A plurality of wirings M3 connected to the plurality of vias V2 are formed on the interlayer insulating film IL3. The wiring M3 is composed of a stacked film of a barrier metal film and a conductive film formed on the barrier metal film. The barrier metal film is, for example, a titanium tungsten film. The conductive film is, for example, an aluminum film or an aluminum alloy film to which copper or silicon is added. The thickness of each of the wirings M1 and M2 is, for example, 300 nm or more and 600 nm or less while the thickness of the wiring M3 is sufficiently larger than the thickness of each of the wirings M1 and M2, and is, for example, 3 μm or more and 5 μm or less.

A protective film PVF is formed on the interlayer insulating film IL3 to cover the plurality of wirings M3. The protective film PVF is, for example, a polyimide film. The thickness of the protective film PVF is, for example, 4 μm or more and 7 μm or less.

Figure 67:
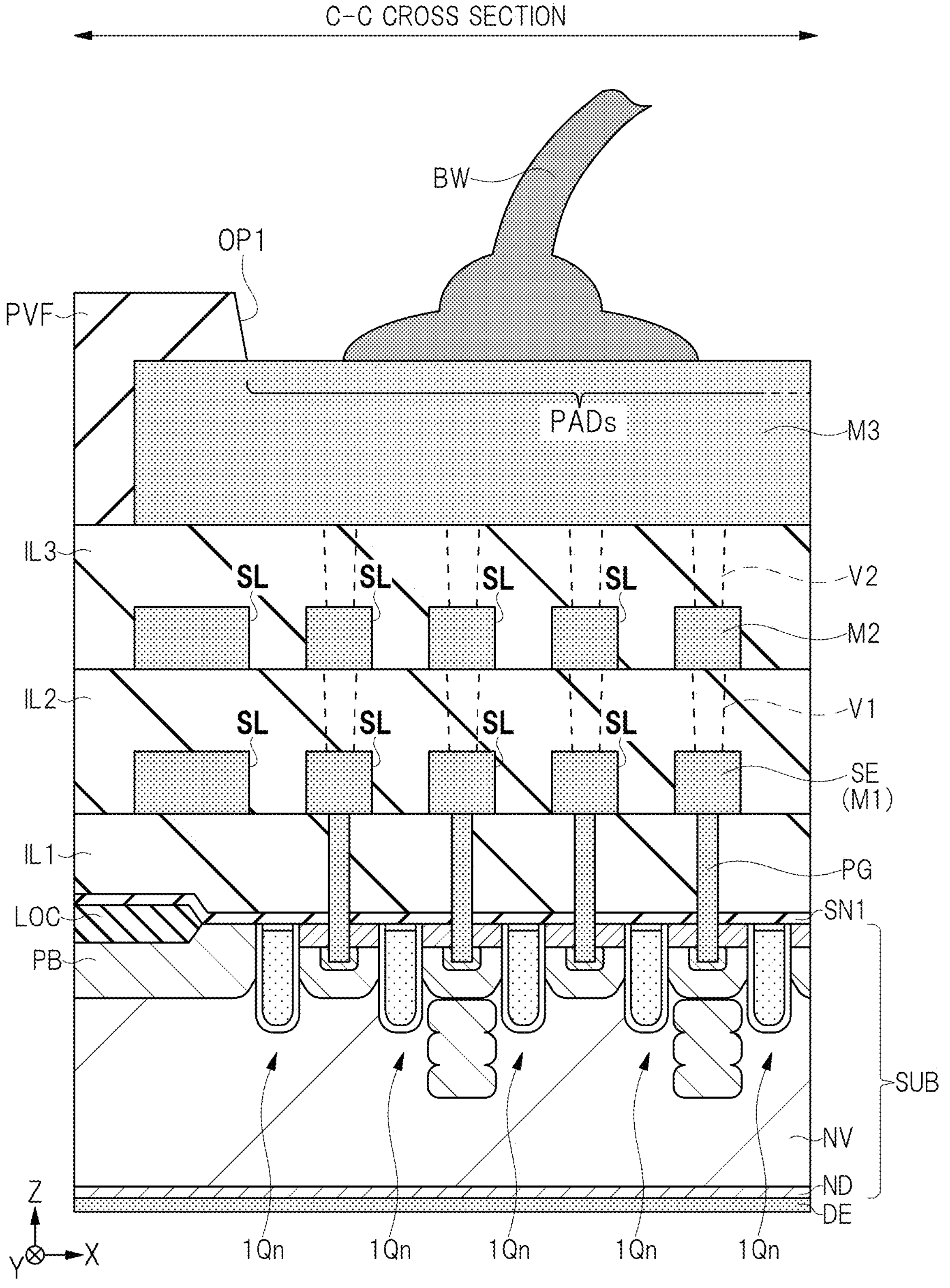
FIG. 67 is a cross-sectional view illustrating the semiconductor device according to the first embodiment.
Figure 70:
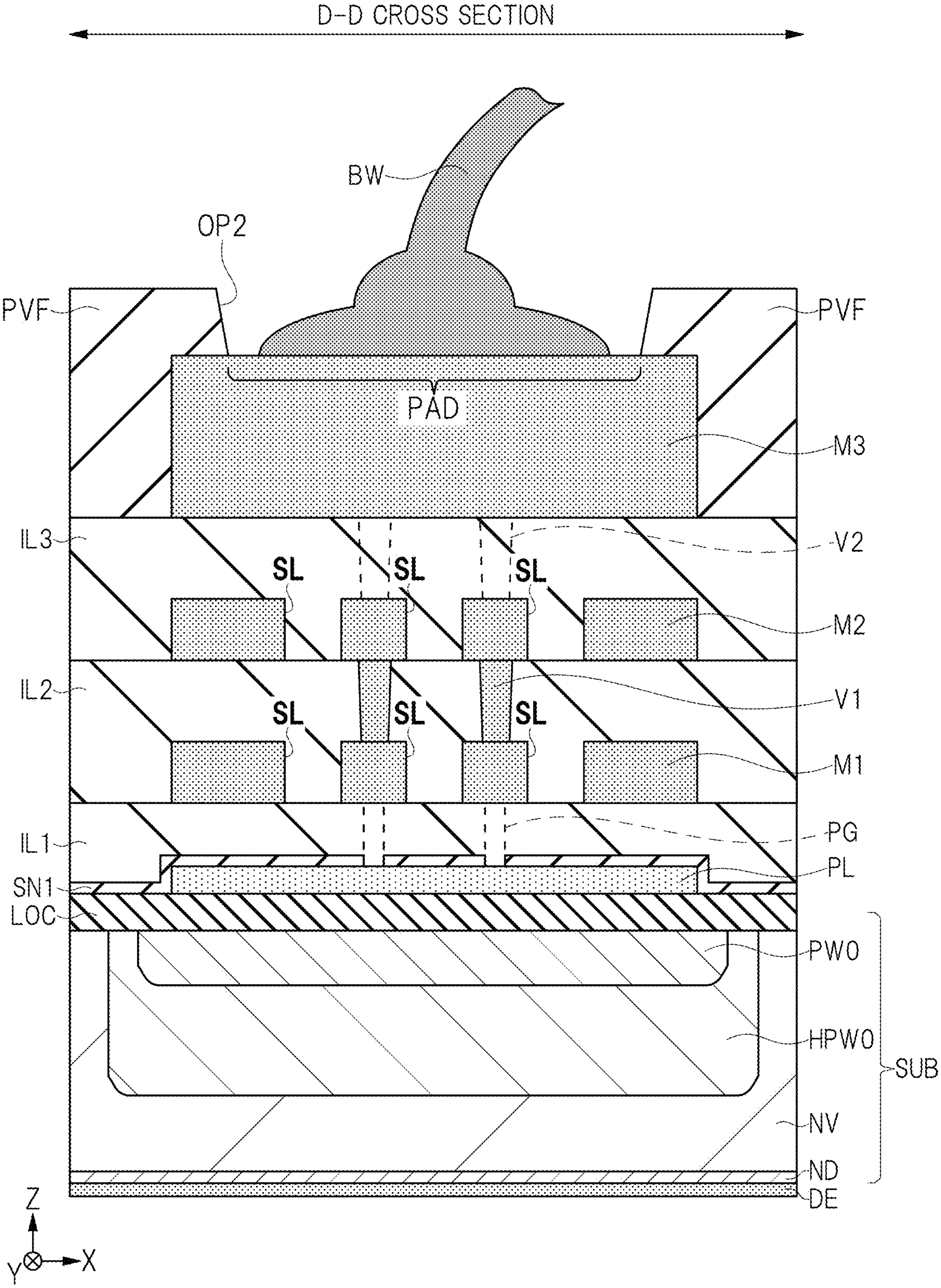
FIG. 70 is a cross-sectional view illustrating the semiconductor device according to the first embodiment.

In the protective film PVF on the wirings M3, an opening OP1 and a plurality of openings OP2 are formed such that respective parts of the plurality of wirings M3 are exposed out (see FIGS. 67 and 70). A part of the wiring M3 exposed in the opening OP1 constitutes a source pad PADs to be connected to an external connection member BW. Parts of the wirings M3 exposed in the plurality of openings OP2 respectively constitute a plurality of pads PAD to be connected to the external connection member BW.

The external connection member BW is, for example, a bonding wire composed of gold or copper, a clip composed of a copper plate or others. When the external connection member BW is connected onto each of the source pad PADs and the plurality of pads PAD, the semiconductor device 100 is electrically connected to another semiconductor chip or wiring board.

<Method of Manufacturing Semiconductor Device>

Manufacturing steps included in the method of manufacturing the semiconductor device 100 will be described below mainly with reference to FIGS. 8 to 53.

Figure 8:
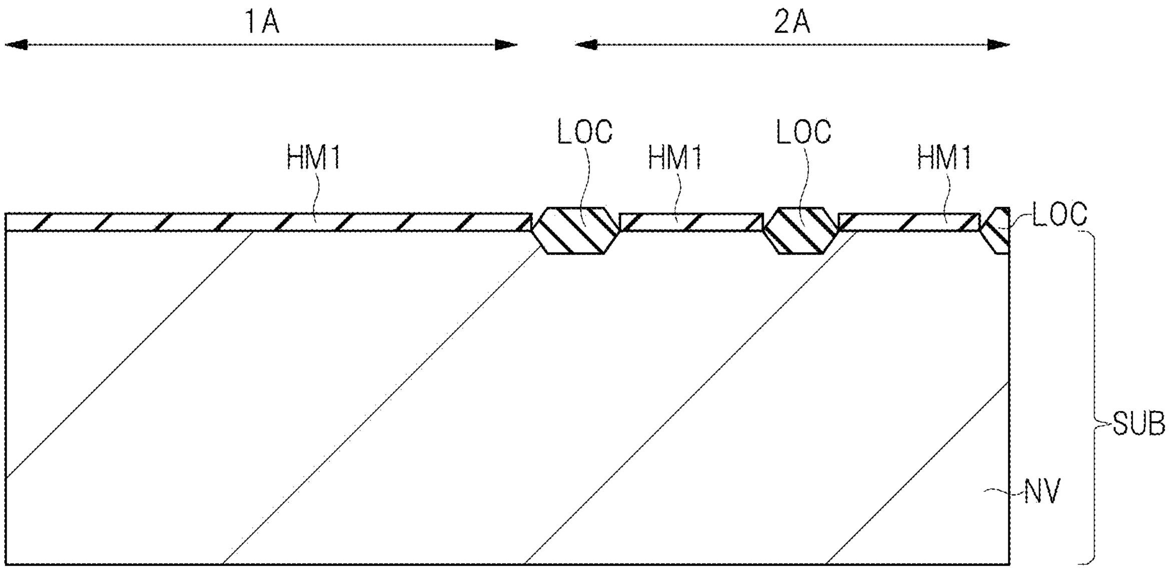
FIG. 8 is a cross-sectional view illustrating a step of manufacturing the semiconductor device according to the first embodiment.
Figure 9:
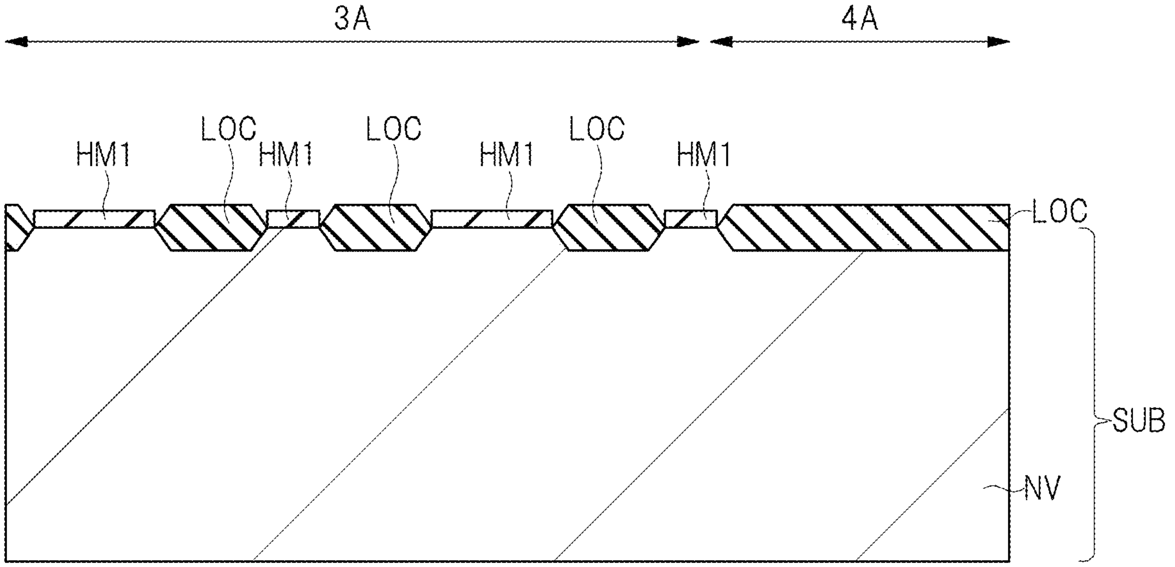
FIG. 9 is a cross-sectional view illustrating a step of manufacturing the semiconductor device according to the first embodiment.

As illustrated in FIGS. 8 and 9, an n-type semiconductor substrate SUB having an upper surface and a lower surface is first prepared. Although the n-type semiconductor substrate SUB itself constitutes a drift region NV as described above, the drift region NV may be an n-type semiconductor layer grown by an epitaxial growth method while an n-type silicon substrate is doped with phosphorus (P).

Then, a silicon oxide film is formed on the upper surface of the semiconductor substrate SUB by, for example, thermal oxidation process. Then, a silicon nitride film is formed on the silicon oxide film by, for example, a CVD (chemical vapor deposition) method. Then, the silicon oxide film and the silicon nitride film are patterned, to form a hard mask HM1 that selectively covers the upper surface of the semiconductor substrate SUB. Then, thermal oxidation process is performed to the semiconductor substrate SUB, to form an element isolation section LOC composed of a silicon oxide film on the semiconductor substrate SUB exposed out from the hard mask HM1. Then, the hard mask HM1 is removed by isotropic etching process.

Figure 10:
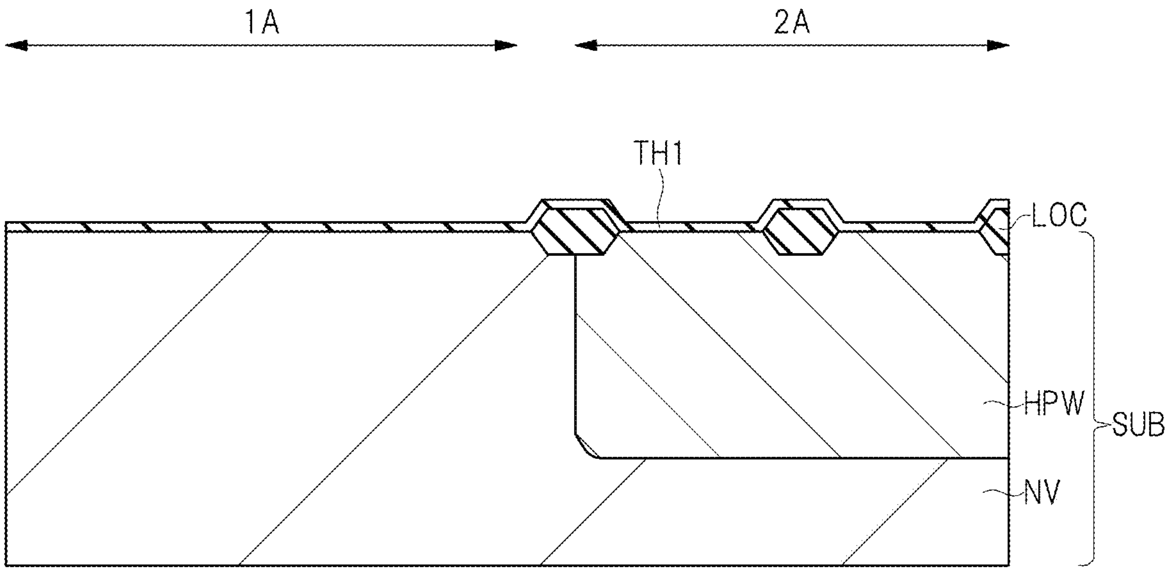
FIG. 10 is a cross-sectional view illustrating a step of manufacturing the semiconductor device continued from FIG. 8.
Figure 11:
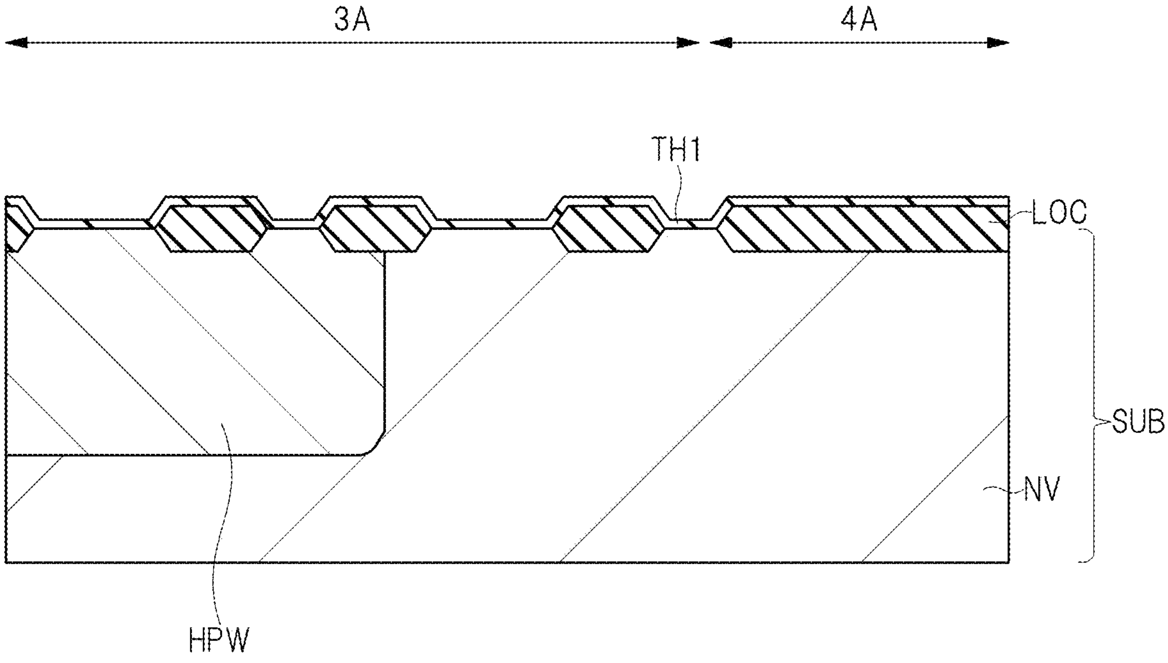
FIG. 11 is a cross-sectional view illustrating a step of manufacturing the semiconductor device continued from FIG. 9.

As illustrated in FIGS. 10 and 11, a through film TH1 composed of a silicon oxide film is first formed on the upper surface of the semiconductor substrate SUB by thermal oxidation process. Then, ions are selectively implanted from the upper surface side of the semiconductor substrate SUB to pass through the through film TH1, to form a p-type well region HPW in the semiconductor substrate SUB in a region 2A and a region 3A. In the ion implantation, for example, boron (B) is used as impurities.

Then, thermal process is performed to the well region HPW. The thermal process is performed in a nitrogen atmosphere under conditions of, for example, 1150° C. for 90 minutes. Impurities contained in the well region HPW are diffused into the semiconductor substrate SUB and are activated by the thermal process.

The above-described thermal process is performed in a relatively long time period as process time. Accordingly, when the thermal process is performed after a gate insulating film GI1 is formed, a stress may be generated from the gate insulating film GI1 into the semiconductor substrate SUB, and there is a risk of occurrence of a crystal defect in the semiconductor substrate SUB due to the stress. A silicon nitride film is included in the hard mask HM1 and a hard mask HM2 described below. However, even when the thermal process is performed in a state in which the silicon nitride film is formed on the upper surface of the semiconductor substrate SUB, there is the risk of occurrence of the crystal defect in the semiconductor substrate SUB due to the stress of the silicon nitride film.

That is, the thermal process is preferably performed before the formation of the trench TR and before the formation of the gate insulating film GI1, and is preferably performed in a state without the formation of the silicon nitride film on the upper surface of the semiconductor substrate SUB.

Figure 12:
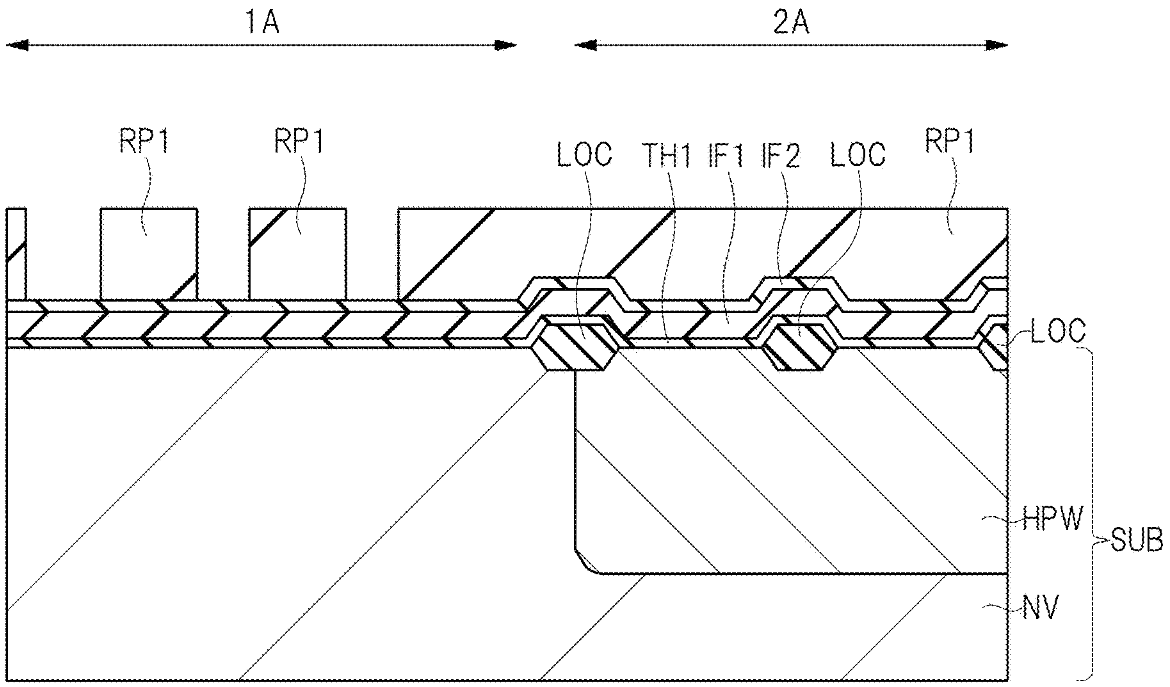
FIG. 12 is a cross-sectional view illustrating a step of manufacturing the semiconductor device continued from FIG. 10.
Figure 13:
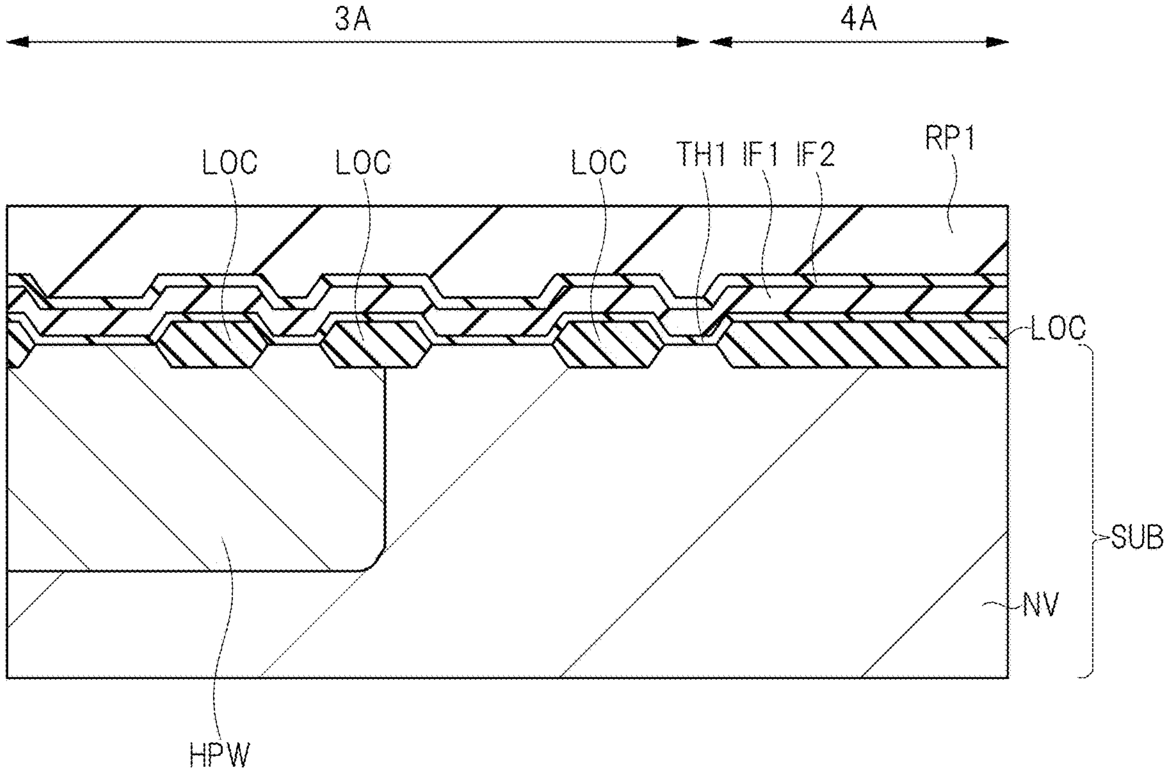
FIG. 13 is a cross-sectional view illustrating a step of manufacturing the semiconductor device continued from FIG. 11.

As illustrated in FIGS. 12 and 13, an insulating film IF1 composed of a silicon nitride film is first formed on a through film TH1 by, for example, a CVD method. Then, an insulating film IF2 composed of a silicon oxide film is formed on the insulating film IF1 by, for example, a CVD method. Then, a resist pattern RP1 is formed on the insulating film IF2 to selectively open a part of a region LA and cover regions 2A to 4A.

Figure 14:
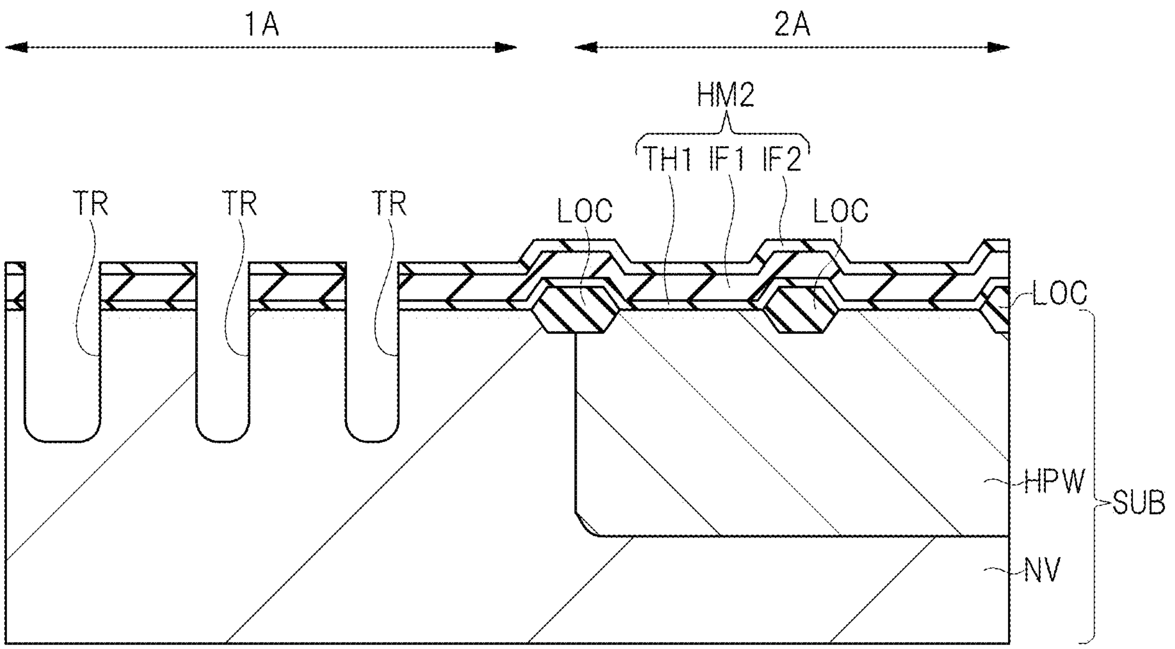
FIG. 14 is a cross-sectional view illustrating a step of manufacturing the semiconductor device continued from FIG. 12.
Figure 15:
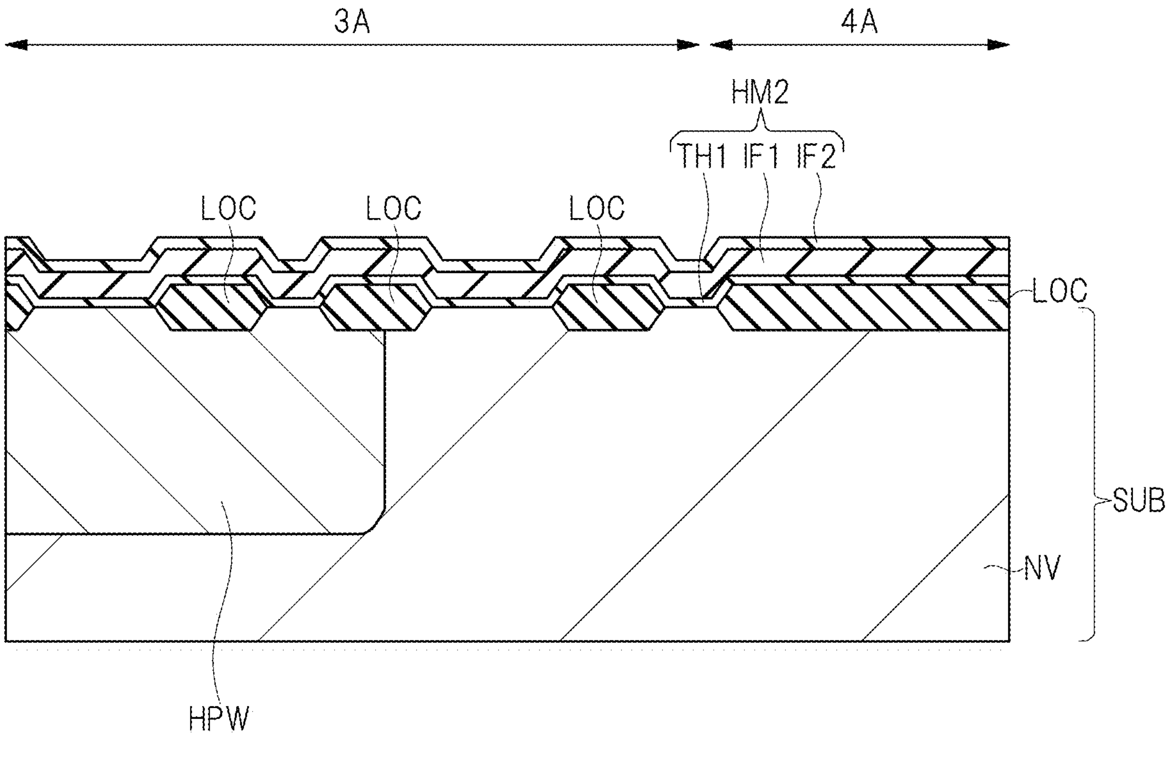
FIG. 15 is a cross-sectional view illustrating a step of manufacturing the semiconductor device continued from FIG. 13.

As illustrated in FIGS. 14 and 15, anisotropic etching process is first performed using the resist pattern RP1 as a mask, to pattern the through film TH1, the insulating film IF1, and the insulating film IF2. As a result, the hard mask HM2 is formed. Then, the resist pattern RP1 is removed by asking process. Then, anisotropic etching process is performed using the hard mask HM2 as a mask, to form the trench TR in the semiconductor substrate SUB exposed out from the hard mask HM2. Then, the semiconductor substrate SUB is washed. In this case, although the insulating film IF2 is removed, the through film TH1 and the insulating film IF1 are left as the hard mask HM2.

Figure 16:
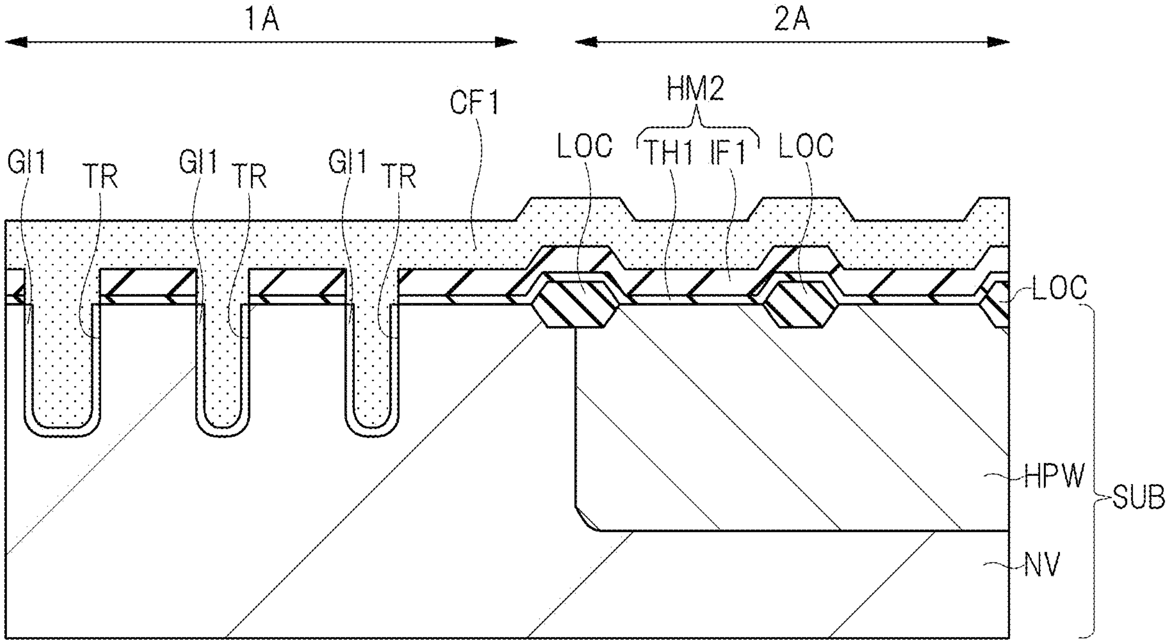
FIG. 16 is a cross-sectional view illustrating a step of manufacturing the semiconductor device continued from FIG. 14.
Figure 17:
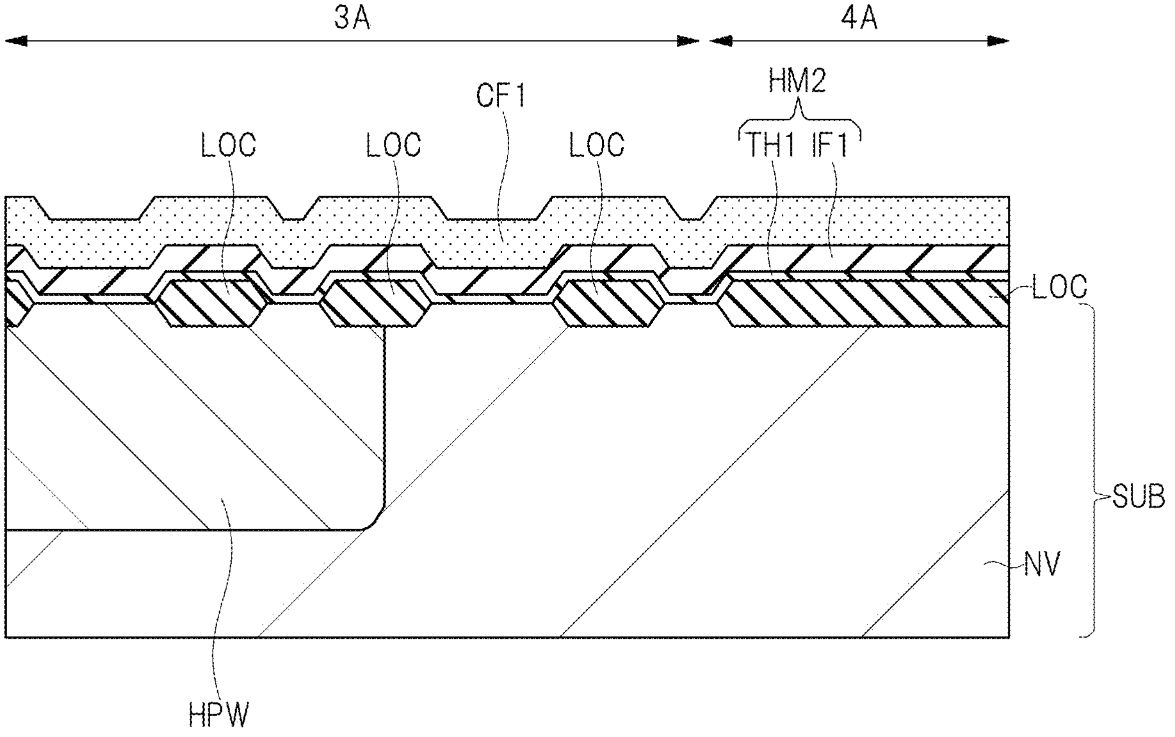
FIG. 17 is a cross-sectional view illustrating a step of manufacturing the semiconductor device continued from FIG. 15.

As illustrated in FIGS. 16 and 17, the gate insulating film GI1 is first formed in the trench TR by thermal oxidation process. Then, a conductive film CF1 is formed on the gate insulating film GI1 and the hard mask HM2 by, for example, a CVD method. The conductive film CF1 is a polycrystalline silicon film. Then, impurities such as phosphorous (P) are ion-implanted into the conductive film CF1, to change the conductive film CF1 into an n-type polycrystalline silicon film.

Figure 18:
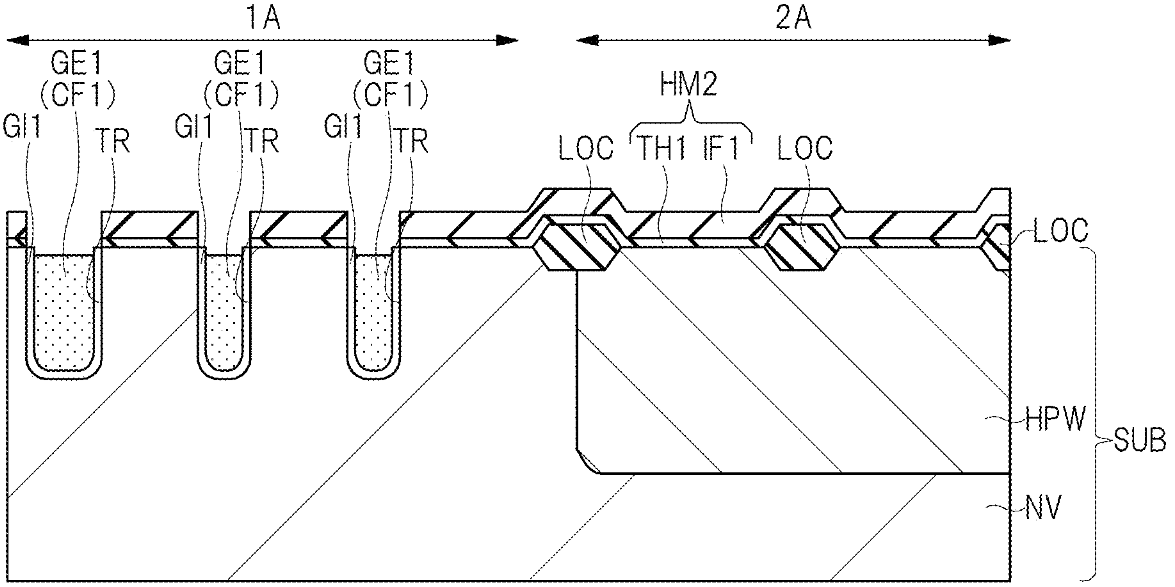
FIG. 18 is a cross-sectional view illustrating a step of manufacturing the semiconductor device continued from FIG. 16.
Figure 19:
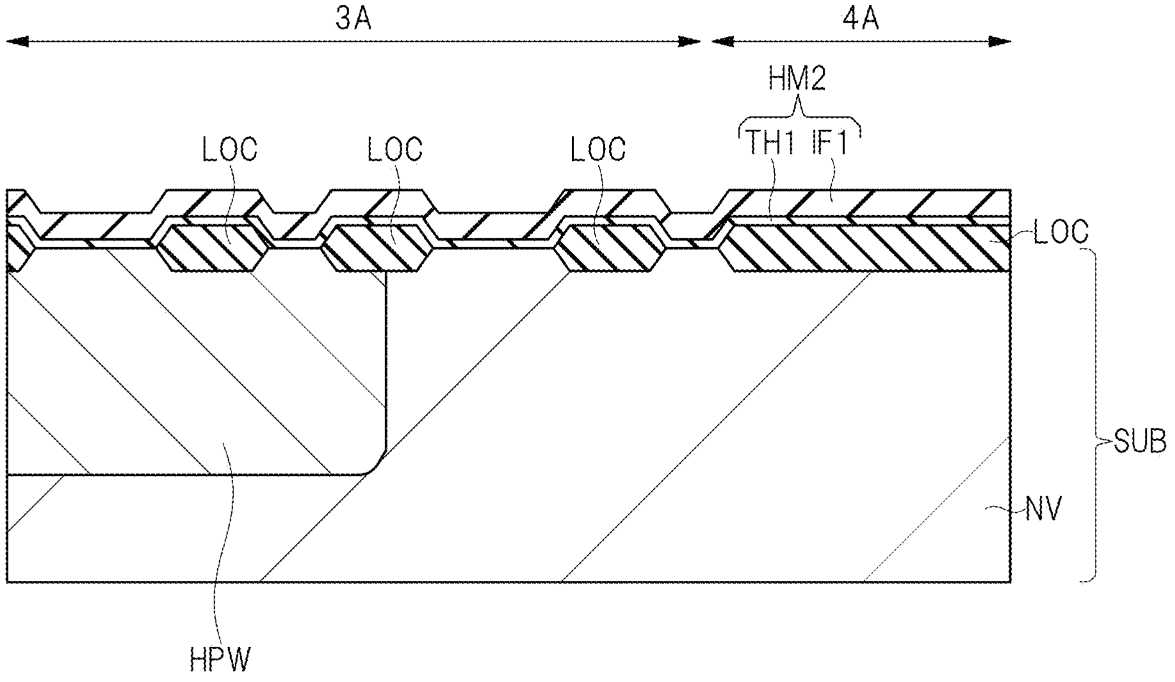
FIG. 19 is a cross-sectional view illustrating a step of manufacturing the semiconductor device continued from FIG. 17.

As illustrated in FIGS. 18 and 19, anisotropic etching process is performed to the conductive film CF1. As a result, the conductive film CF1 on the hard mask HM2 is removed, and a gate electrode GE1 is formed in the trench TR to be embedded into the trench TR to interpose the gate insulating film GI1 therebetween.

Figure 20:
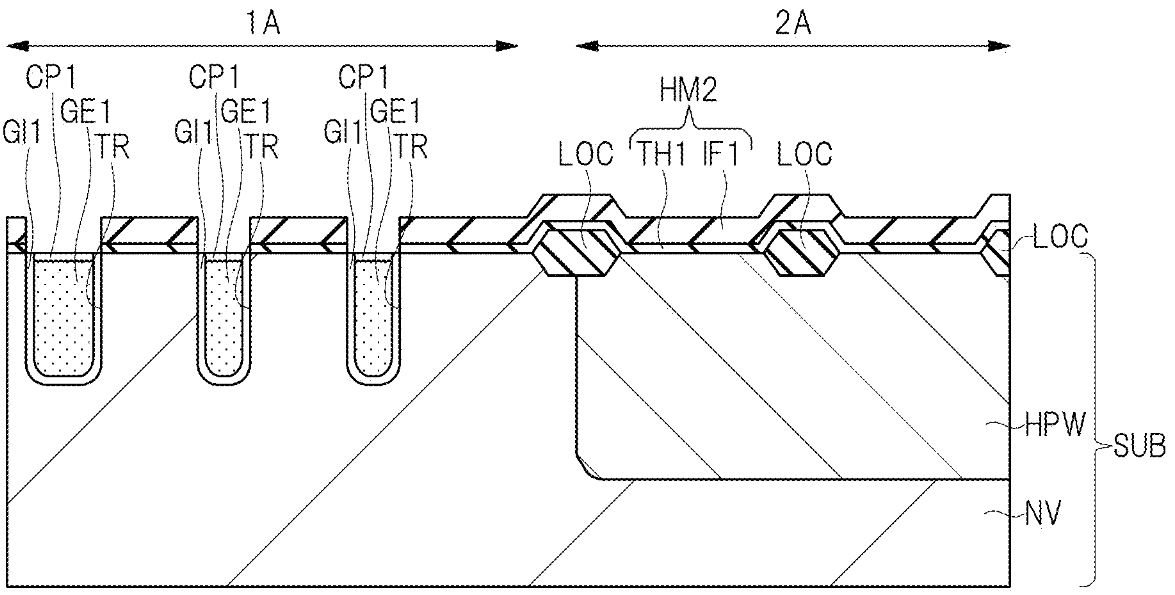
FIG. 20 is a cross-sectional view illustrating a step of manufacturing the semiconductor device continued from FIG. 18.
Figure 21:
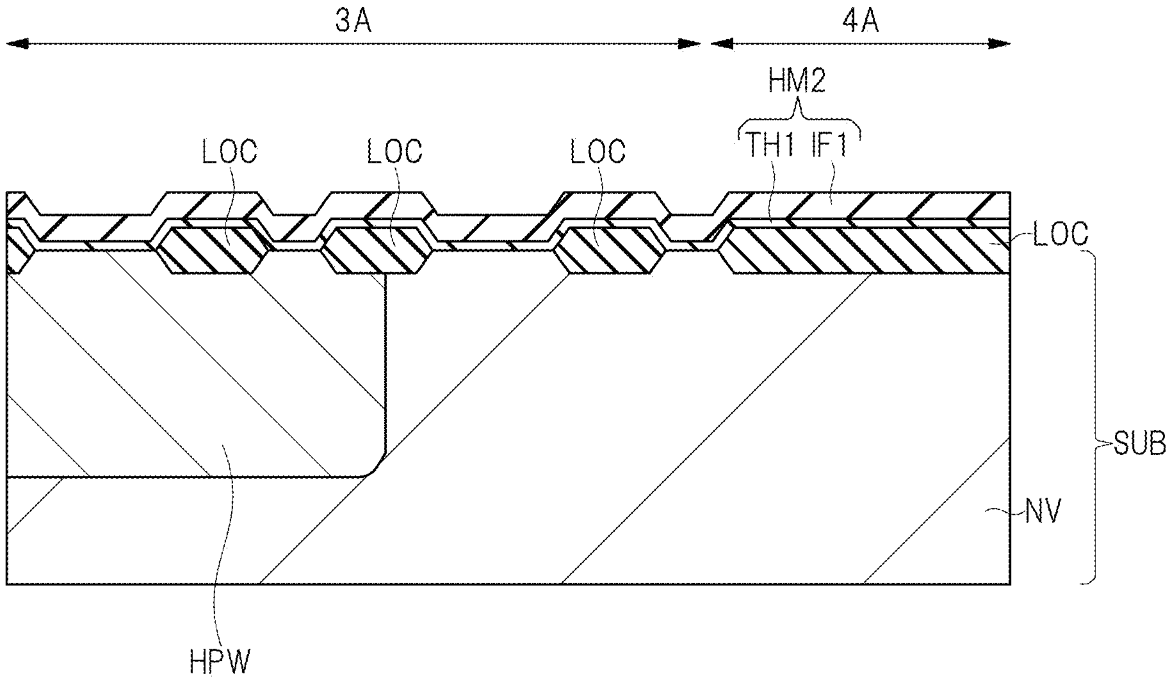
FIG. 21 is a cross-sectional view illustrating a step of manufacturing the semiconductor device continued from FIG. 19.

As illustrated in FIGS. 20 and 21, a part of the gate electrode GE1 is oxidized by thermal oxidation process. As a result, a cap film CP1 composed of an insulating film is formed on an upper surface of the gate electrode GE1. That is, the cap film CP1 is a silicon oxide film formed by thermally oxidizing an upper surface of a polycrystalline silicon film.

Figure 22:
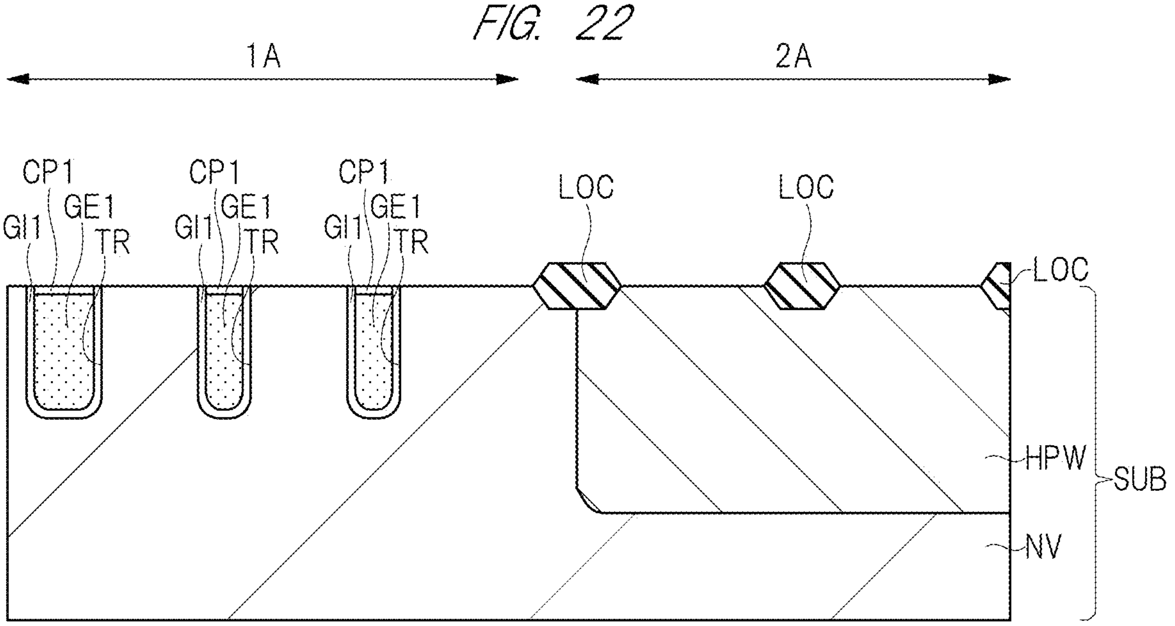
FIG. 22 is a cross-sectional view illustrating a step of manufacturing the semiconductor device continued from FIG. 20.
Figure 23:
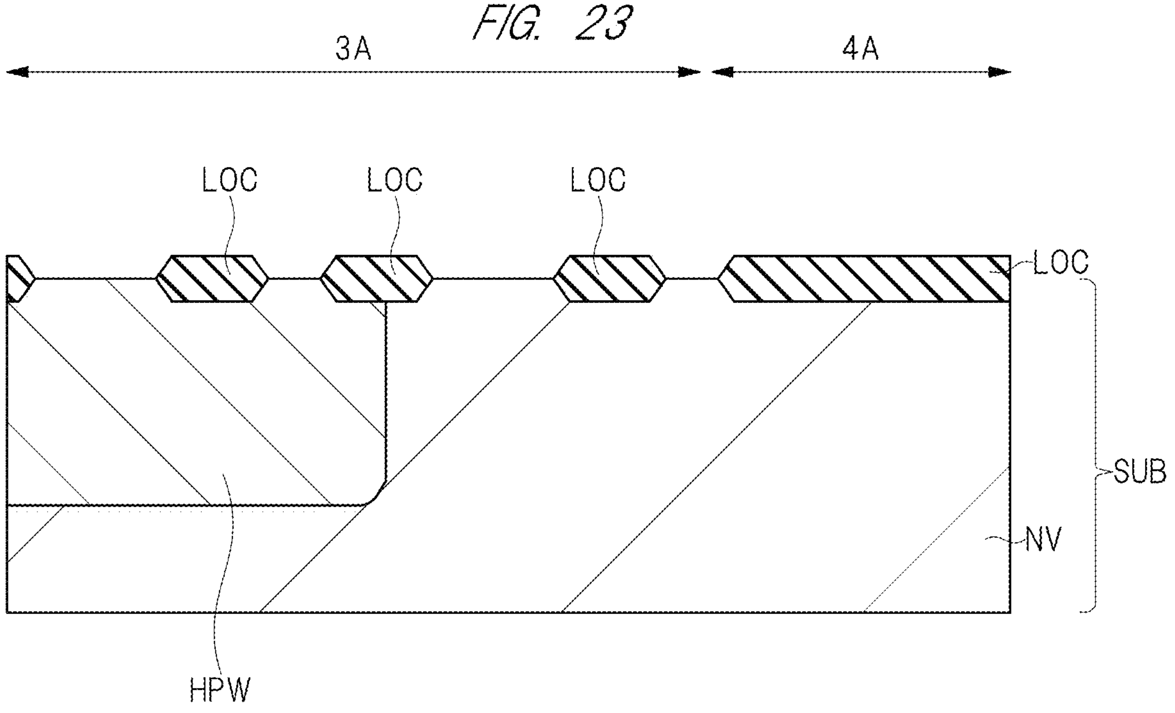
FIG. 23 is a cross-sectional view illustrating a step of manufacturing the semiconductor device continued from FIG. 21.

As illustrated in FIGS. 22 and 23, the hard mask HM2 is removed. First, the insulating film IF1 is removed by isotropic etching process using aqueous solution containing phosphoric acid. Then, a washing process using aqueous solution containing hydrofluoric acid is performed, to remove the through film TH1.

Figure 24:
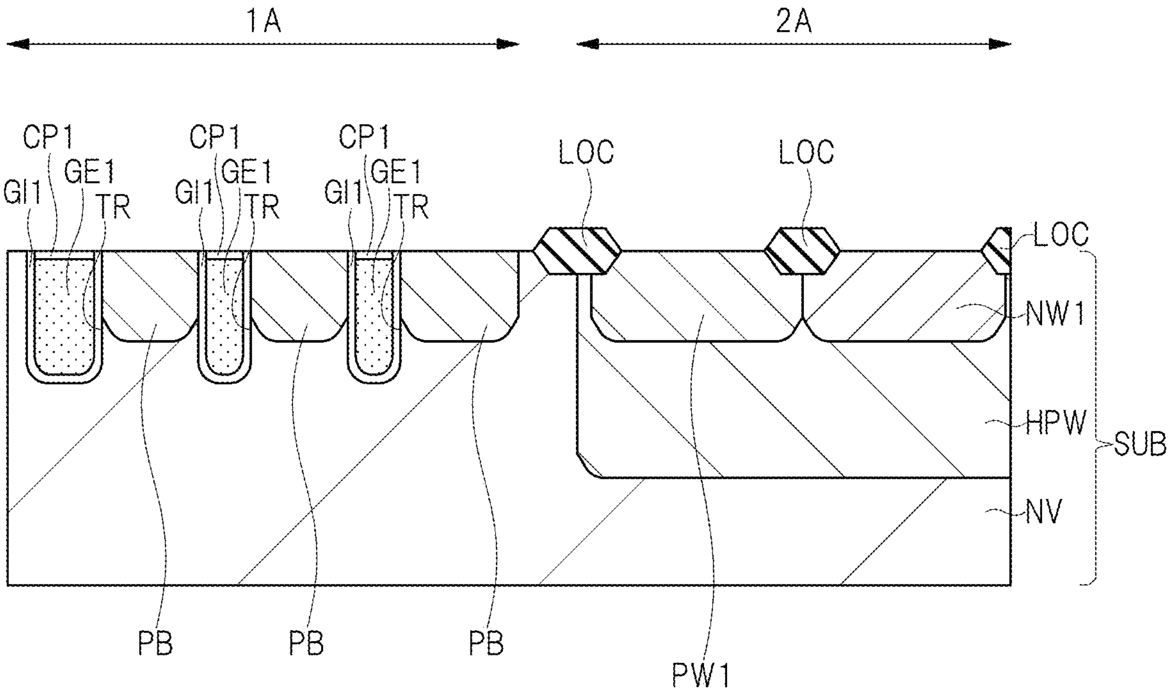
FIG. 24 is a cross-sectional view illustrating a step of manufacturing the semiconductor device continued from FIG. 22.
Figure 25:
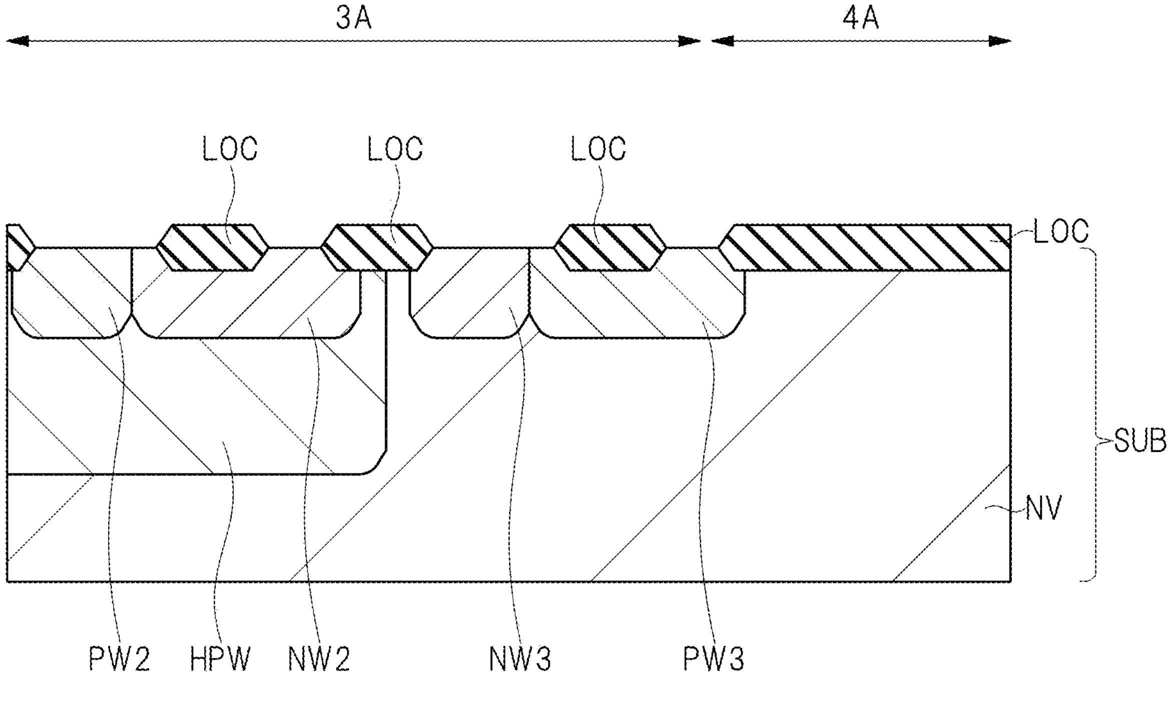
FIG. 25 is a cross-sectional view illustrating a step of manufacturing the semiconductor device continued from FIG. 23.

As illustrated in FIGS. 24 and 25, an impurity region is selectively formed in the semiconductor substrate SUB in the regions 1A to 3A on the upper surface side of the semiconductor substrate SUB using a photolithography technique and an ion implantation method.

In the region 1A, a p-type body region PB is formed in the semiconductor substrate SUB to be shallower than the depth of the trench TR. In the region 2A, a p-type well region PW1 and an n-type well region NW1 are formed in the semiconductor substrate SUB. The well region PW1 and the well region NW1 are formed in the well region HPW. In the region 3A, a p-type well region PW2, an n-type well region NW2, a p-type well region PW3, and an n-type well region NW3 are formed in the semiconductor substrate SUB. The well region PW2 and the well region NW2 are formed in the well region HPW.

A through film composed of a silicon oxide film is formed on the upper surface of the semiconductor substrate SUB before the ion implantation, although not illustrated here. The through film is removed by a washing process using aqueous solution containing hydrofluoric acid after the ion implantation.

Figure 26:
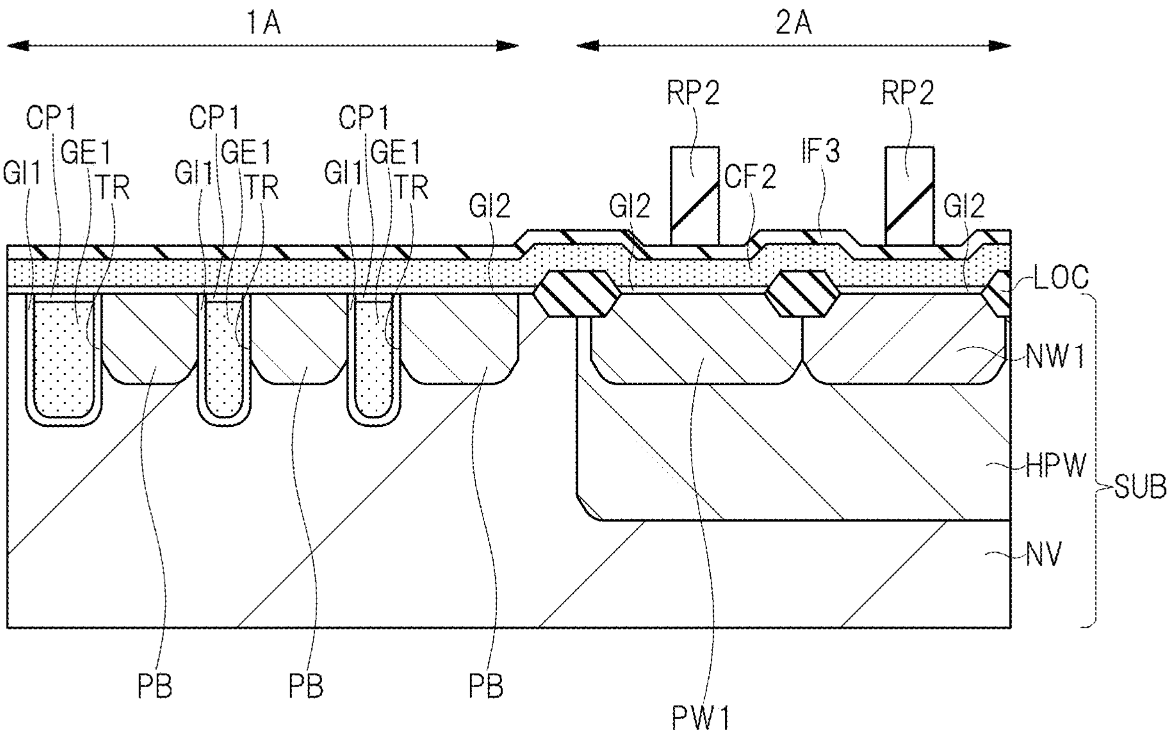
FIG. 26 is a cross-sectional view illustrating a step of manufacturing the semiconductor device continued from FIG. 24.
Figure 27:
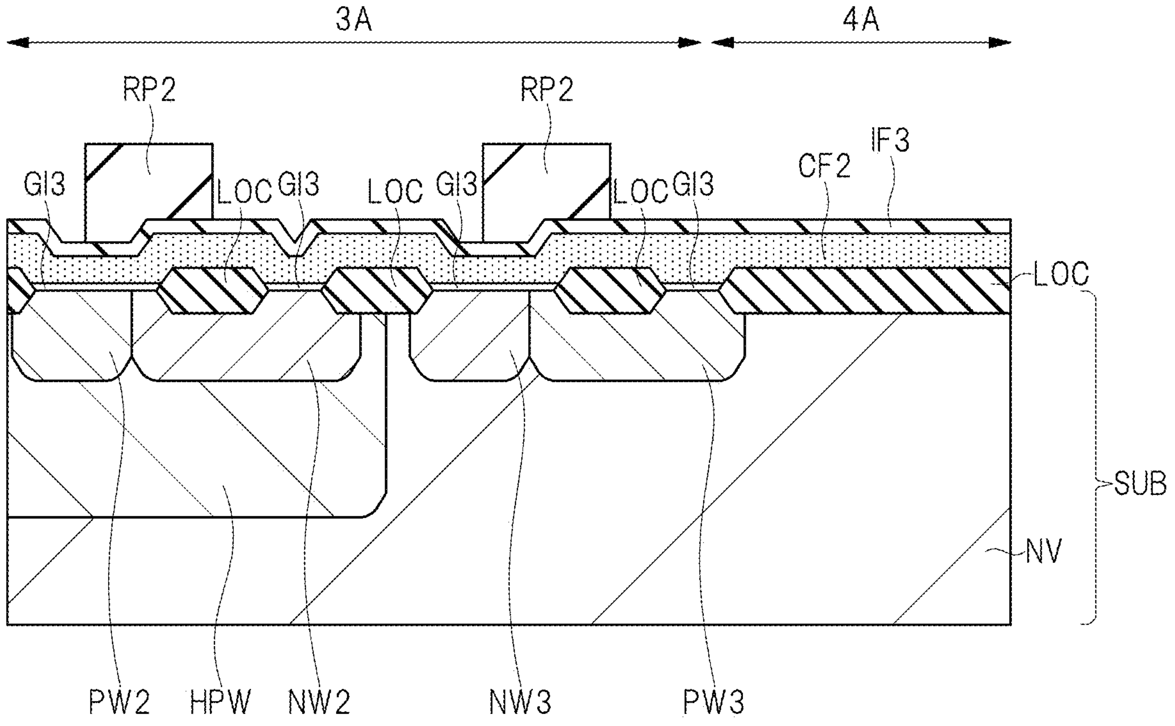
FIG. 27 is a cross-sectional view illustrating a step of manufacturing the semiconductor device continued from FIG. 25.

As illustrated in FIGS. 26 and 27, a gate insulating film composed of a silicon oxide film is first formed on the upper surface of the semiconductor substrate SUB by thermal oxidation process. Here, a gate insulating film formed on the well region PW1 and the well region NW1 in the region 2A is indicated as a gate insulating film GI2. A gate insulating film formed on the well region PW2, the well region NW2, the well region PW3, and the well region NW3 in the region 3A is indicated as a gate insulating film GI3.

Then, a conductive film CF2 is formed on the gate insulating film GI2, the gate insulating film GI3, and the cap film CP1. A material contained in the conductive film CF2 has a higher sheet resistance than the sheet resistance of a material contained in the conductive film CF1 (the gate electrode GE1). The conductive film CF2 is, for example, a stacked film of an n-type polycrystalline silicon film formed by a CVD method and a tungsten silicide film formed by a CVD method.

Then, an insulating film IF3 composed of a silicon oxide film is formed on the conductive film CF2 by, for example, a CVD method. Then, a resist pattern RP2 is formed on the insulating film IF3 to selectively cover a part of the region 2A and a part of the region 3A.

Figure 28:
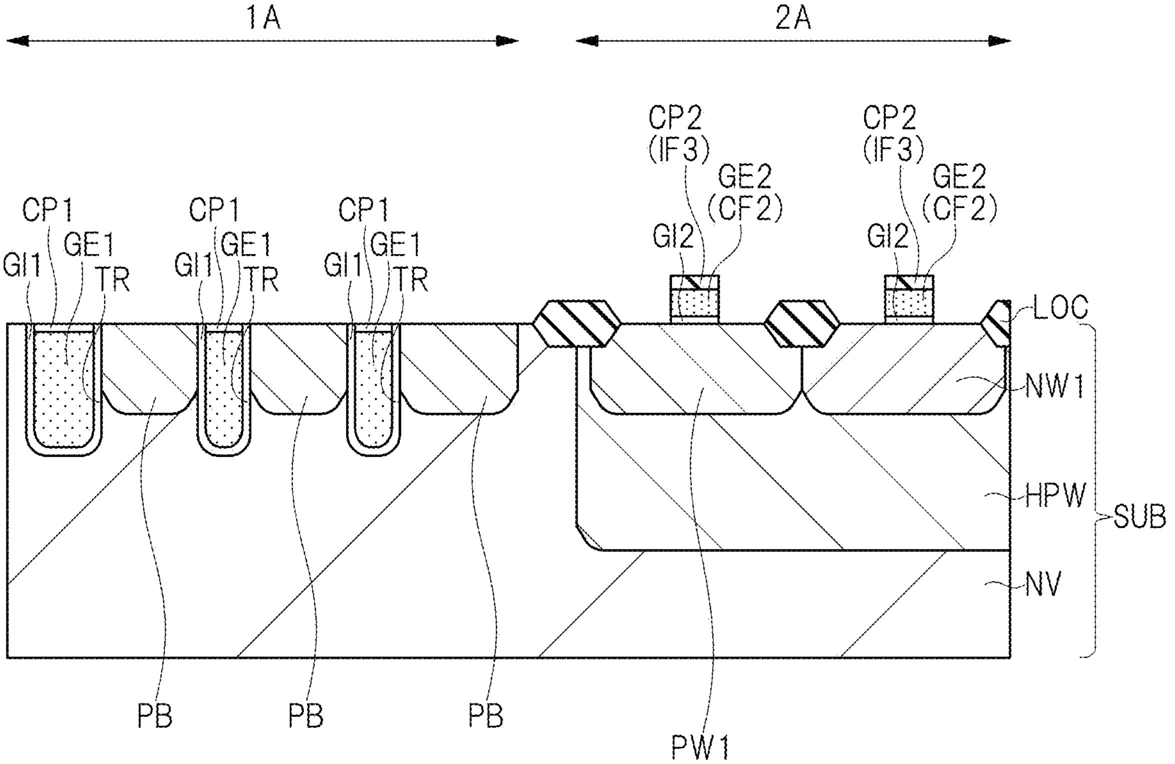
FIG. 28 is a cross-sectional view illustrating a step of manufacturing the semiconductor device continued from FIG. 26.
Figure 29:
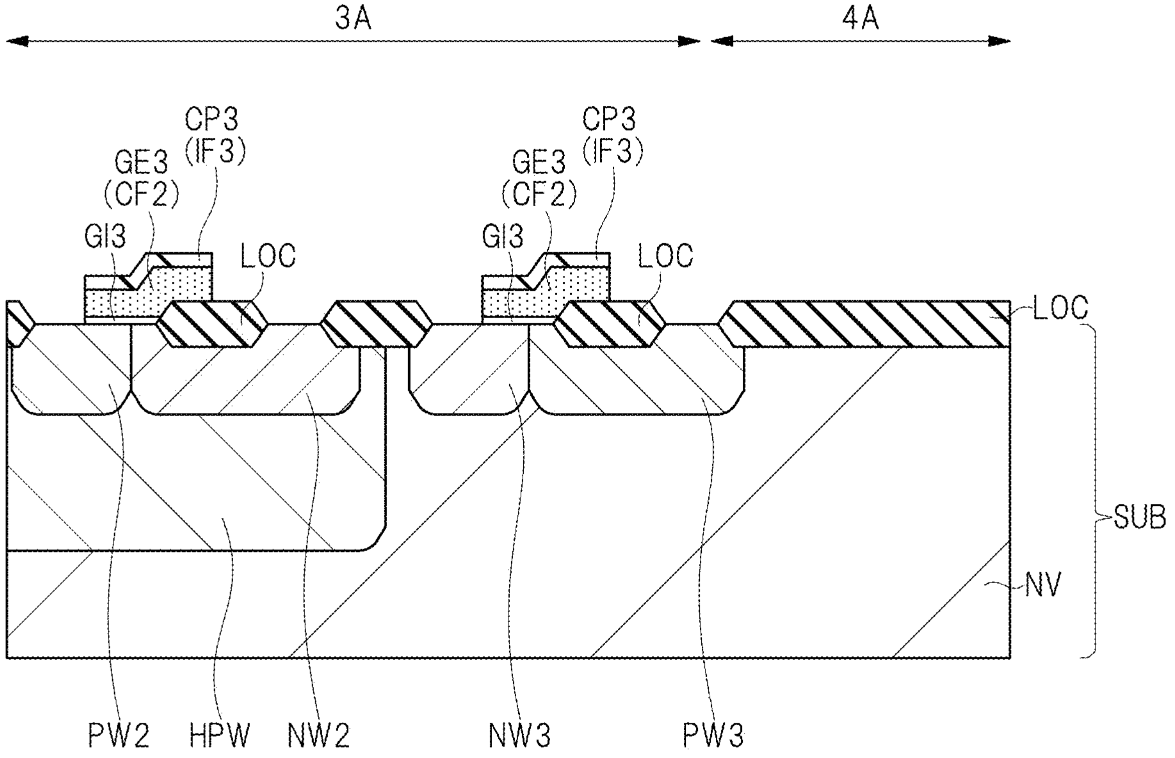
FIG. 29 is a cross-sectional view illustrating a step of manufacturing the semiconductor device continued from FIG. 27.

As illustrated in FIGS. 28 and 29, anisotropic etching process is performed using the resist pattern RP2 as a mask, to pattern the insulating film IF3 and the conductive film CF2. As a result, the insulating film IF3 and the conductive film CF2 that are not covered with the resist pattern RP2 are removed. A gate electrode GE2 and a cap film CP2 are formed on the upper surface of the semiconductor substrate SUB in the region 2A via the gate insulating film GI2. A gate electrode GE3 and a cap film CP3 are formed on the upper surface of the semiconductor substrate SUB in the region 3A via the gate insulating film GI3.

Then, the resist pattern RP2 is removed by asking process. Then, the gate insulating films GI2 and GI3 respectively exposed out from the gate electrodes GE2 and GE3 are removed by a washing process using aqueous solution containing hydrofluoric acid.

In the manufacturing steps from FIGS. 16 and 17 to FIGS. 28 and 29, features of the first embodiment will be described. The features will be described in comparison with study examples 1 to 3 with reference to FIGS. 54 to 65. The study examples 1 to 3 are not related arts but new findings from studies performed by the inventors of the present application.

Figure 54:
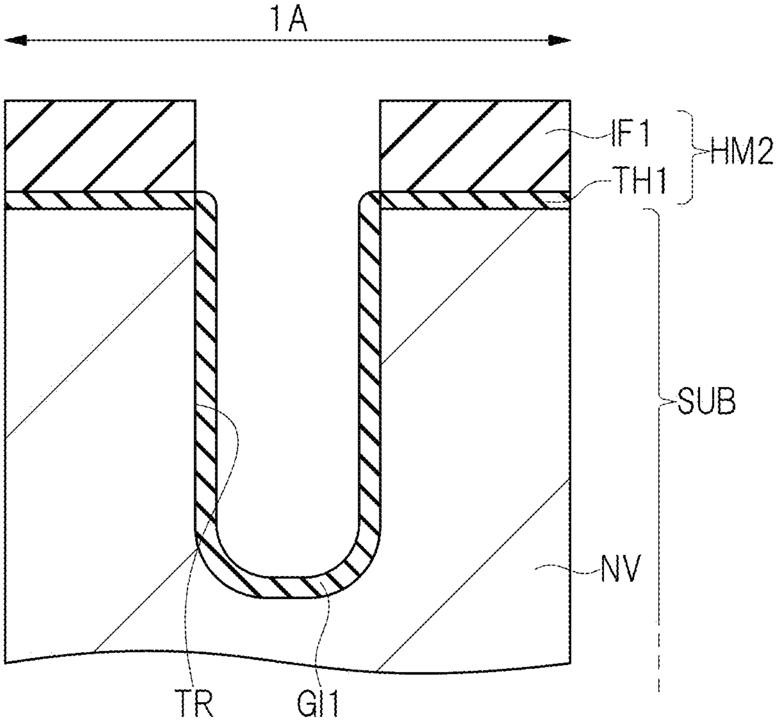
FIG. 54 is a main cross-sectional view illustrating a step of manufacturing the semiconductor device according to the first embodiment.
Figure 55:
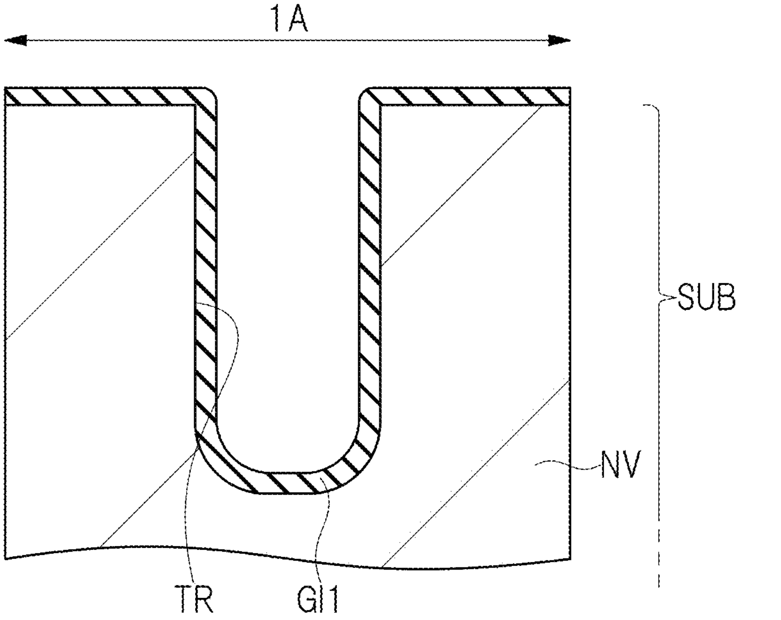
FIG. 55 is a main cross-sectional view illustrating a step of manufacturing a semiconductor device in a study example 1.

FIGS. 54 and 55 illustrate a state immediately after the formation of the gate insulating film GI1. In the study example 1, the gate insulating film GI1 is formed in a state in which the hard mask HM2 is removed. On the other hand, in the first embodiment, the gate insulating film GI1 is formed in the state in which the hard mask HM2 is left.

Figure 56:
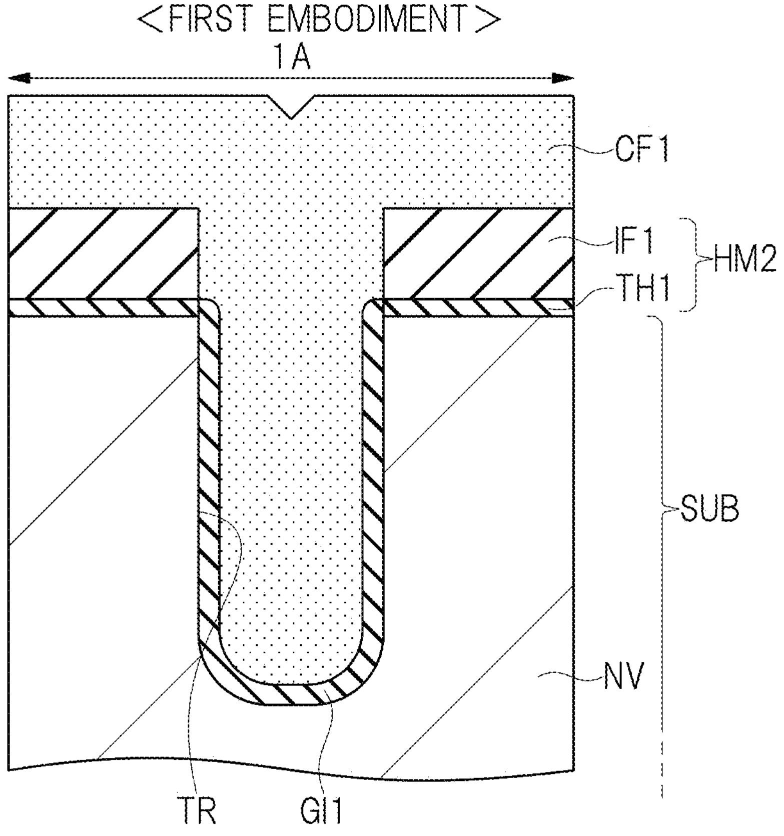
FIG. 56 is a main cross-sectional view illustrating a step of manufacturing the semiconductor device continued from FIG. 54.
Figure 57:
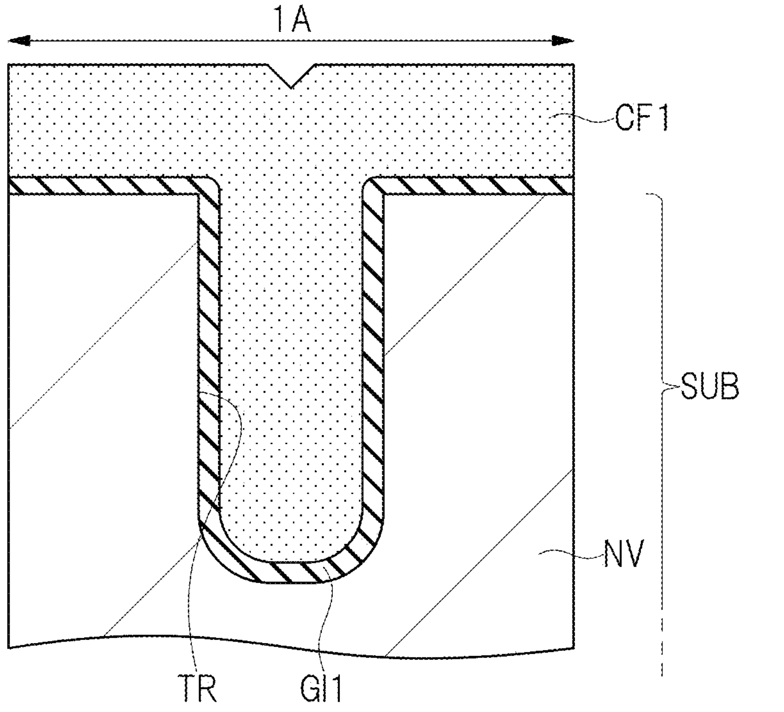
FIG. 57 is a main cross-sectional view illustrating a step of manufacturing the semiconductor device continued from FIG. 55.
Figure 58:
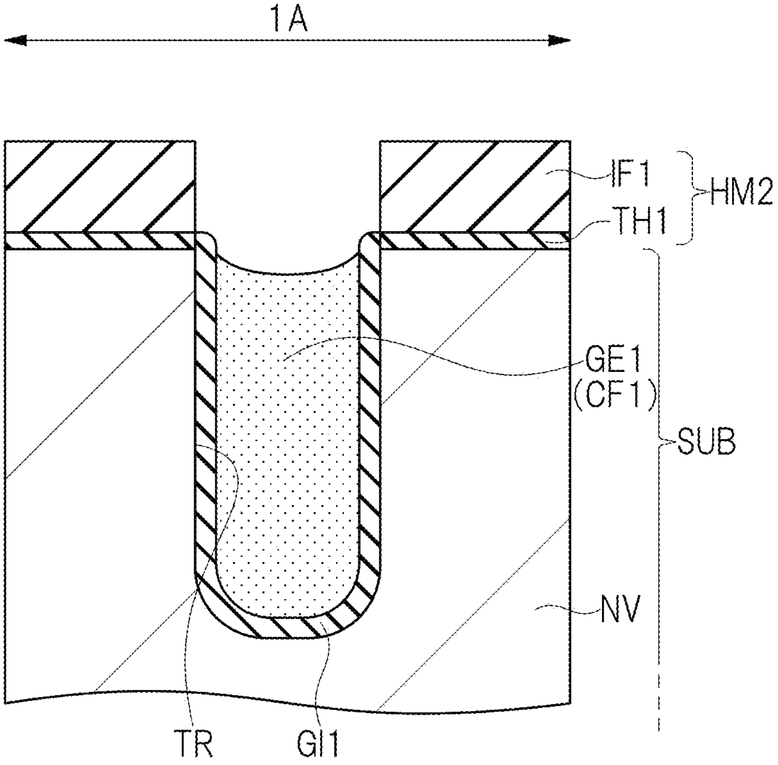
FIG. 58 is a main cross-sectional view illustrating a step of manufacturing the semiconductor device continued from FIG. 56.
Figure 59:
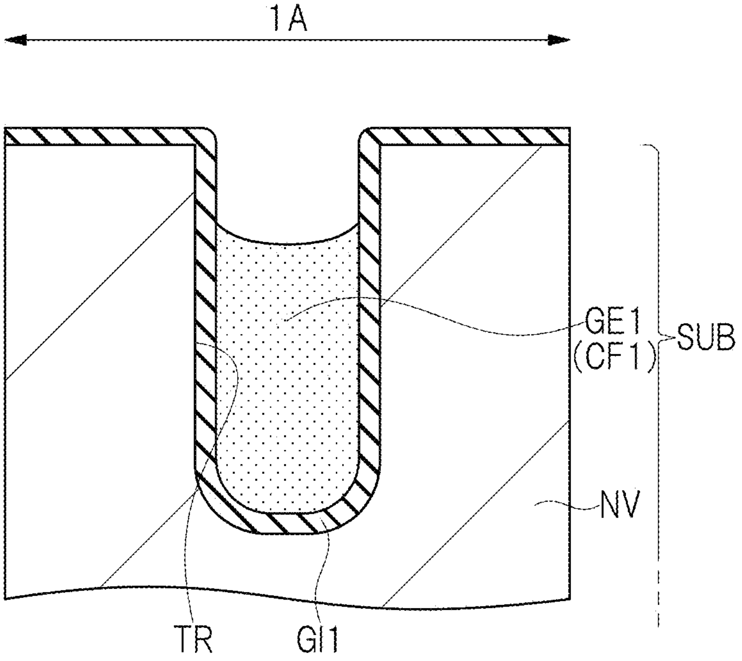
FIG. 59 is a main cross-sectional view illustrating a step of manufacturing the semiconductor device continued from FIG. 57.

Then, as illustrated in FIGS. 56 and 57, the conductive film CF1 is formed to be embedded into the trench TR. Then, as illustrated in FIGS. 58 and 59, anisotropic etching process is performed to the conductive film CF1 to remove the conductive film CF1 outside the trench TR and recess the conductive film CF1 in the trench TR. The conductive film CF1 left in the trench TR is the gate electrode GE1.

At this time point, a position of an upper surface of the conductive film CF1 in the study example 1 is significantly lower than a position of the upper surface of the semiconductor substrate SUB. On the other hand, a position of an upper surface of the conductive film CF1 in the first embodiment is slightly lower than a position of the upper surface of the semiconductor substrate SUB but is made closer to the upper surface of the semiconductor substrate SUB by the thickness of the hard mask HM2.

Figure 60:
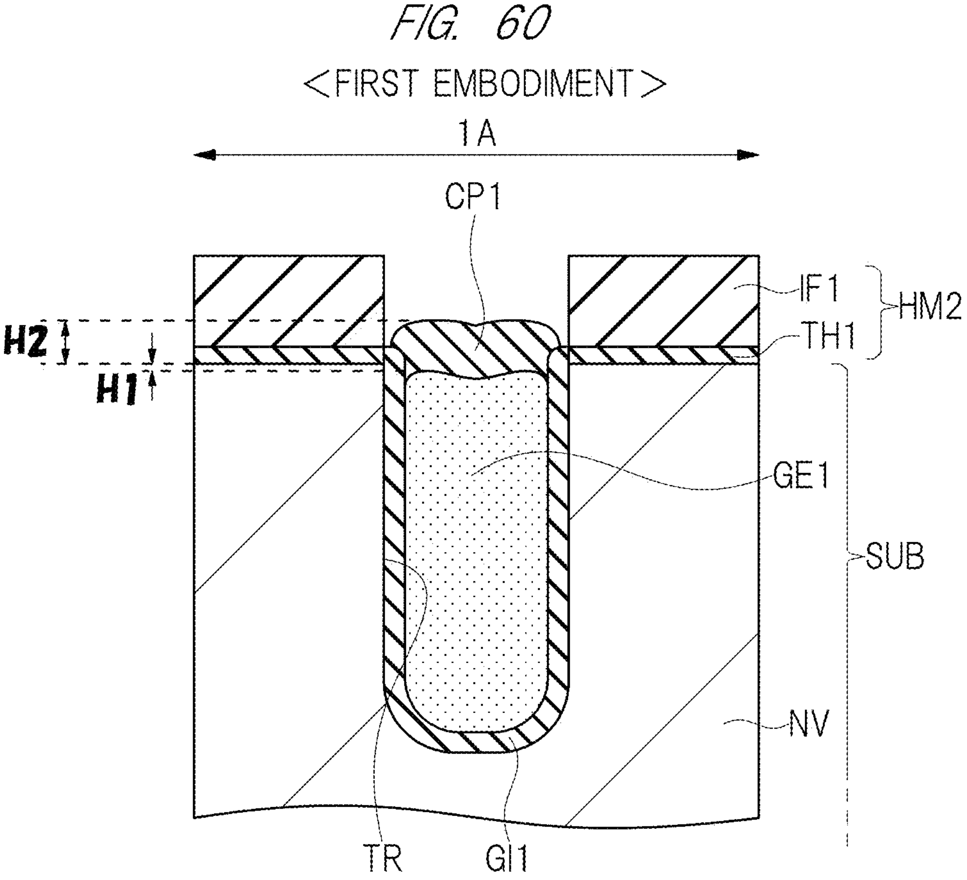
FIG. 60 is a main cross-sectional view illustrating a step of manufacturing the semiconductor device continued from FIG. 58.
Figure 61:
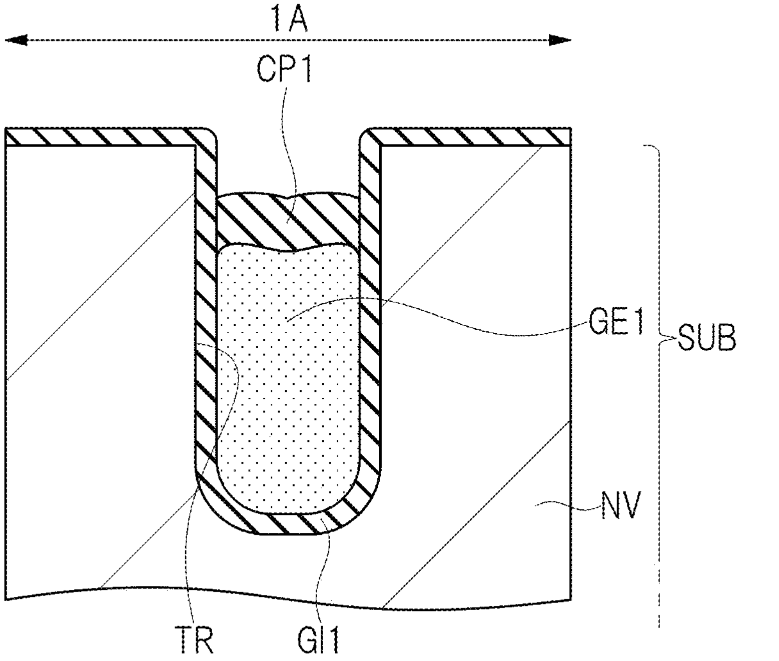
FIG. 61 is a main cross-sectional view illustrating a step of manufacturing the semiconductor device continued from FIG. 59.

Then, as illustrated in FIGS. 60 and 61, the cap film CP1 is formed on the upper surface of the conductive film CF1 by thermal oxidation process. At this time point, a position of an upper surface of the cap film CP1 in the study example 1 is lower than the position of the upper surface of the semiconductor substrate SUB.

On the other hand, the position of the upper surface of the conductive film CF1 in the first embodiment is lower than the position of the upper surface of the semiconductor substrate SUB. A difference between the positions is indicated by a height H1. A position of an upper surface of the cap film CP1 in the first embodiment is higher than the position of the upper surface of the semiconductor substrate SUB. A difference between the positions is indicated by a height H2. In other words, the upper surface of the semiconductor substrate SUB is positioned within a range of the thickness of the cap film CP1. The thickness of the cap film CP1 is larger than the thickness of the gate insulating film GI1.

Figure 62:
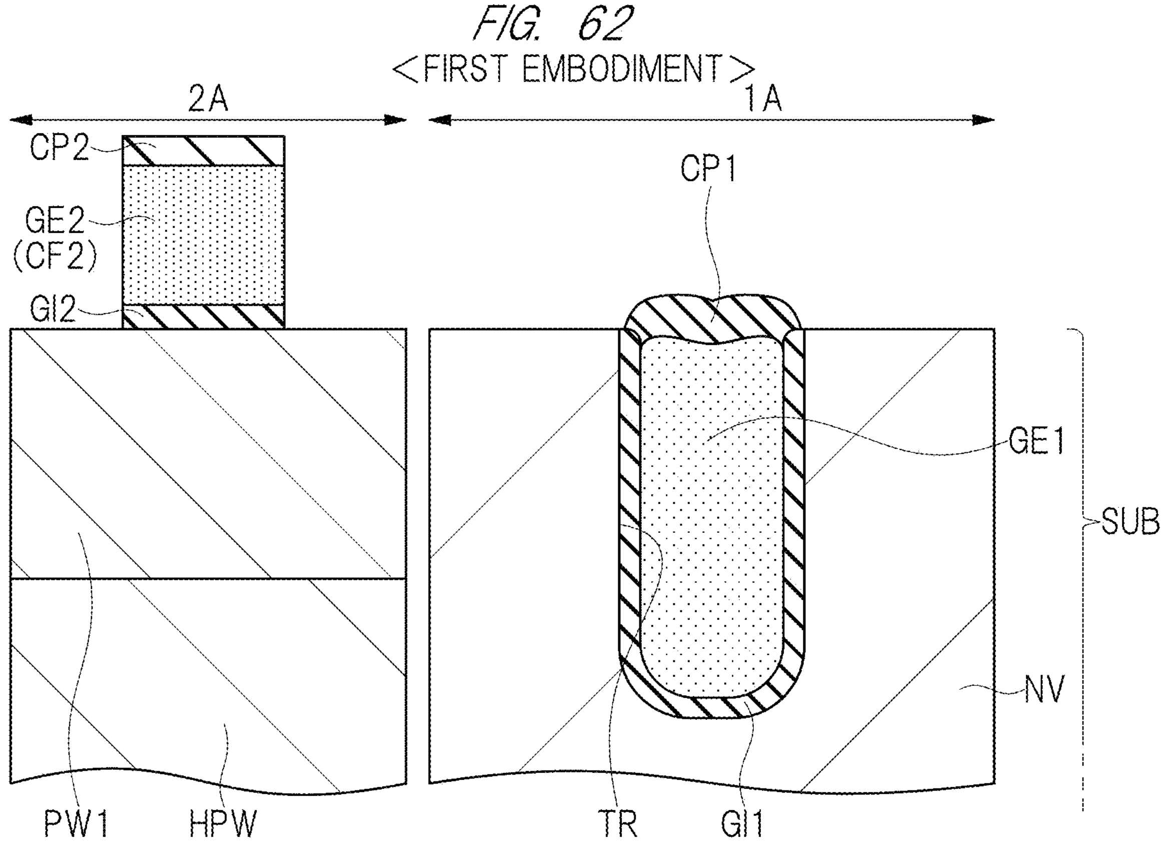
FIG. 62 is a main cross-sectional view illustrating a step of manufacturing the semiconductor device continued from FIG. 60.
Figure 63:
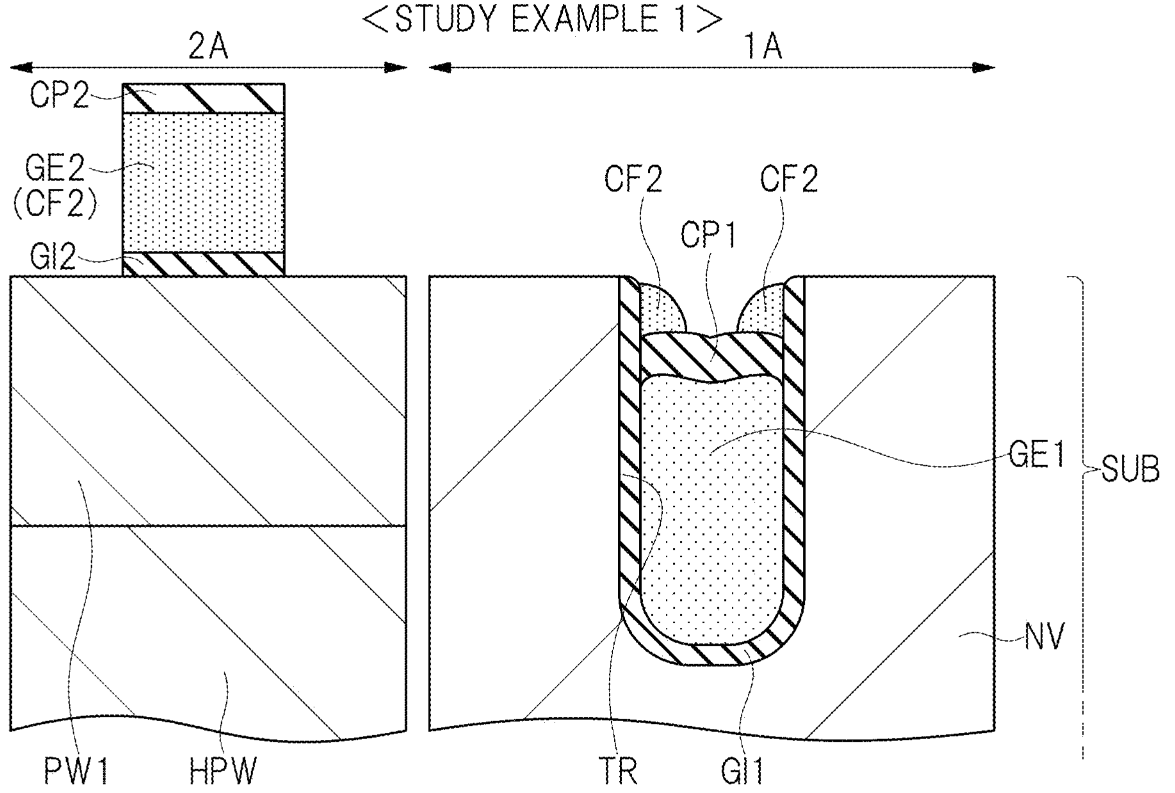
FIG. 63 is a main cross-sectional view illustrating a step of manufacturing the semiconductor device continued from FIG. 61.

FIGS. 62 and 63 illustrate a state of the patterning of the conductive film CF2 by anisotropic etching process after the hard mask HM2 is removed and the conductive film CF2 or the like is formed. In the study example 1, the position of the upper surface of the cap film CP1 is low, and therefore, there is a problem that the conductive film CF2 is left as a sidewall-shaped residue in the trench TR.

Such residue causes a damage in forming the hole CH2 in the gate electrode GE1 and causes a factor by which the hole CH2 is not normally formed. During the manufacturing steps, there is a risk of peeling off and scattering of the residue, and there is also the leaving of the residue as a foreign substance on the semiconductor substrate SUB. Accordingly, there occurs a problem of a decrease in the reliability of the semiconductor device 100 or a decrease in yield. On the other hand, in the first embodiment, the residue can be prevented from occurring.

Figure 64:
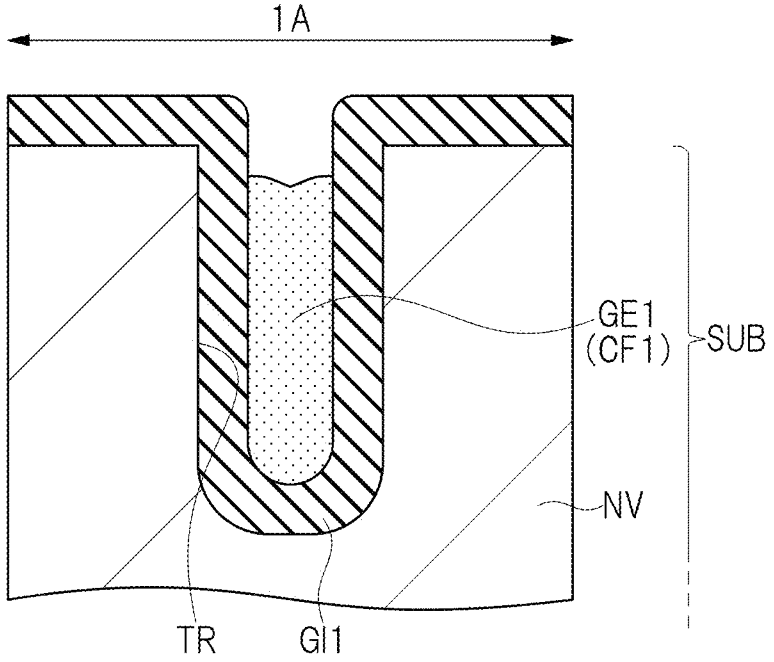
FIG. 64 is a main cross-sectional view illustrating a step of manufacturing a semiconductor device in a study example 2.
Figure 65:
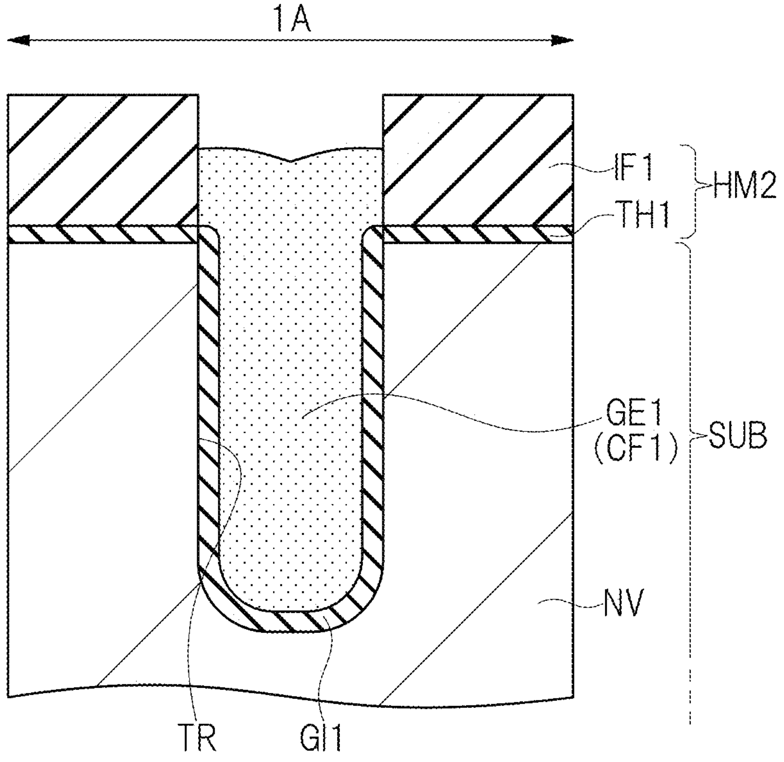
FIG. 65 is a main cross-sectional view illustrating a step of manufacturing a semiconductor device in a study example 3.

To prevent the residue from occurring, respective measures as described in the study example 2 illustrated in FIG. 64 and the study example 3 illustrated in FIG. 65 may be considerable.

In the study example 2, when the thickness of the gate insulating film GI1 is increased, a position of an upper surface of the gate electrode GE1 can be brought closer to the upper surface of the semiconductor substrate SUB even if an amount of recessing of the conductive film CF1 is the same. However, an on-current is difficult to flow because of the increased thickness of the gate insulating film GI1. That is, since an on-resistance increases, the performance of the semiconductor device 100 decreases.

In the study example 3, when the thickness of the hard mask HM2 (the thickness of the insulating film IF1) is increased, a position of an upper surface of the gate electrode GE1 is higher than a position of the upper surface of the semiconductor substrate SUB even if the amount of recessing of the conductive film CF1 is the same. In this case, the residue can be prevented from occurring in the trench TR.

However, when anisotropic etching process is performed to the conductive film CF2 after the hard mask HM2 is removed, the sidewall-shaped conductive film CF2 is left as a residue on a side surface of the protruded gate electrode GE1. The residue may also be the foreign substance on the semiconductor substrate SUB. When the residue remains left on the side surface of the protruded gate electrode GE1, the residue may be a leak path between the gate electrode GE1 and the source region NS.

The first embodiment has been thought up in consideration of these problems that occur in the study examples 1 to 3, and can prevent the occurrence of the residue caused by the conductive film CF2. It is unnecessary to adjust even the thickness of the gate insulating film GI1, and therefore, an increase in on-resistance is suppressed. That is, the first embodiment makes it possible to improve the reliability of the semiconductor device 100 and suppress a decrease in yield while ensuring the performance of the semiconductor device 100.

Incidentally, as described above, when the insulating film IF1 as a silicon nitride film in the hard mask HM2 is removed, isotropic etching process using aqueous solution containing phosphoric acid is used. In this case, when the upper surface of the gate electrode GE1 is exposed out, the gate electrode GE1 is etched by phosphoric acid. Since the cap film CP1 is formed on the gate electrode GE1, such etching is prevented.

When the cap film CP1 is formed by thermal oxidation process performed to the upper surface of the gate electrode GE1 composed of a polycrystalline silicon film, an upper portion of the gate electrode GE1 has a pointed shape before the thermal oxidation process as illustrated in FIG. 58. Such a pointed portion is a portion where electric field concentration easily occurs, and may tend to be a factor of a deterioration in local dielectric withstanding voltage performance.

As illustrated in FIG. 60, the upper portion of the gate electrode GE1 is rounded by appropriate adjustment of a time period for the thermal oxidation process. Therefore, the electric field concentration in the upper portion of the gate electrode GE1 can be prevented. For example, by adjustment of the time period for the thermal oxidation process such that the thickness of the cap film CP1 is 40 nm or more and 60 nm or less, the upper portion of the gate electrode GE1 is rounded as much as the electric field concentration can be suppressed. In other words, the above-described oxidation process is preferably performed as much as the thickness of the cap film CP1 is larger than the thickness (10 nm to 20 nm) of the gate insulating film GI1.

When the cap film CP1 is not formed but the gate insulating film GI2 is formed, the oxidation of the upper surface of the gate electrode GE1 is also considerable. However, the thickness of the gate insulating film GI2 is, for example, 10 nm or more and 20 nm or less. Accordingly, the upper portion of the gate electrode GE1 may not be sufficiently rounded. Also in consideration of such a point, the above-described oxidation process is preferably performed as much as the thickness of the cap film CP1 is larger than the thickness of the gate insulating film GI2.

Manufacturing steps after the manufacturing steps of FIGS. 28 and 29 will be described below.

Figure 30:
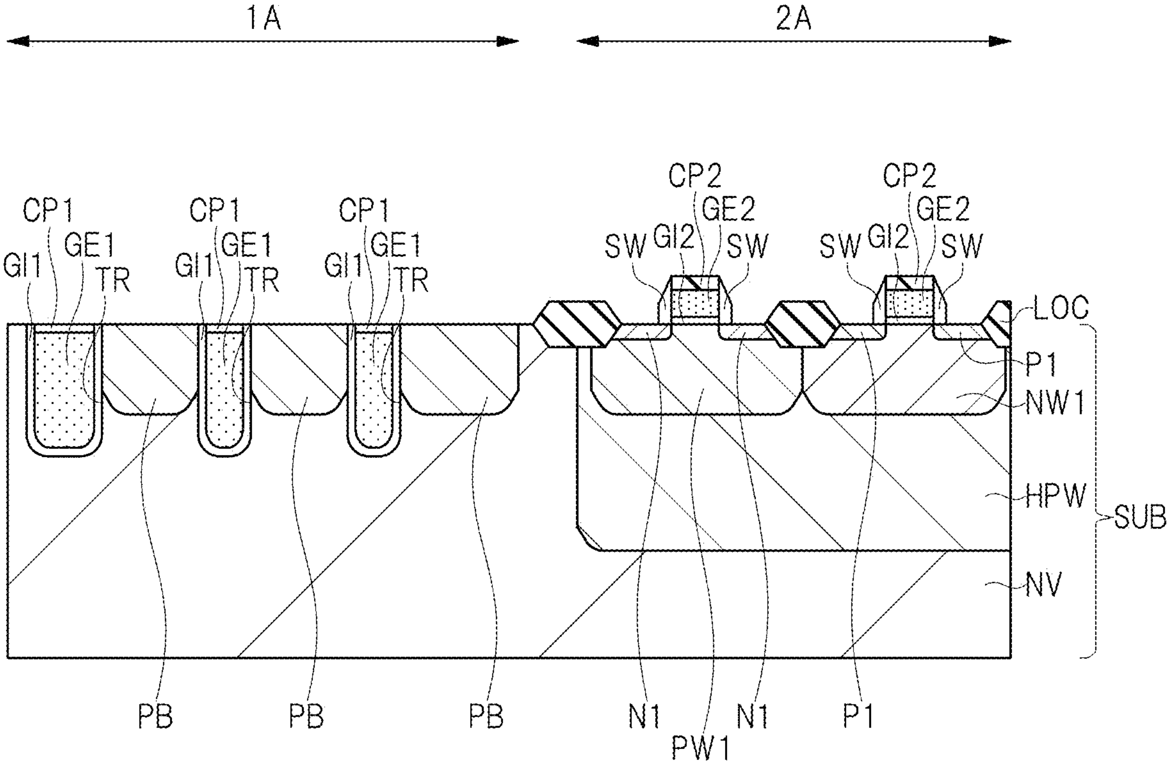
FIG. 30 is a cross-sectional view illustrating a step of manufacturing the semiconductor device continued from FIG. 28.
Figure 31:
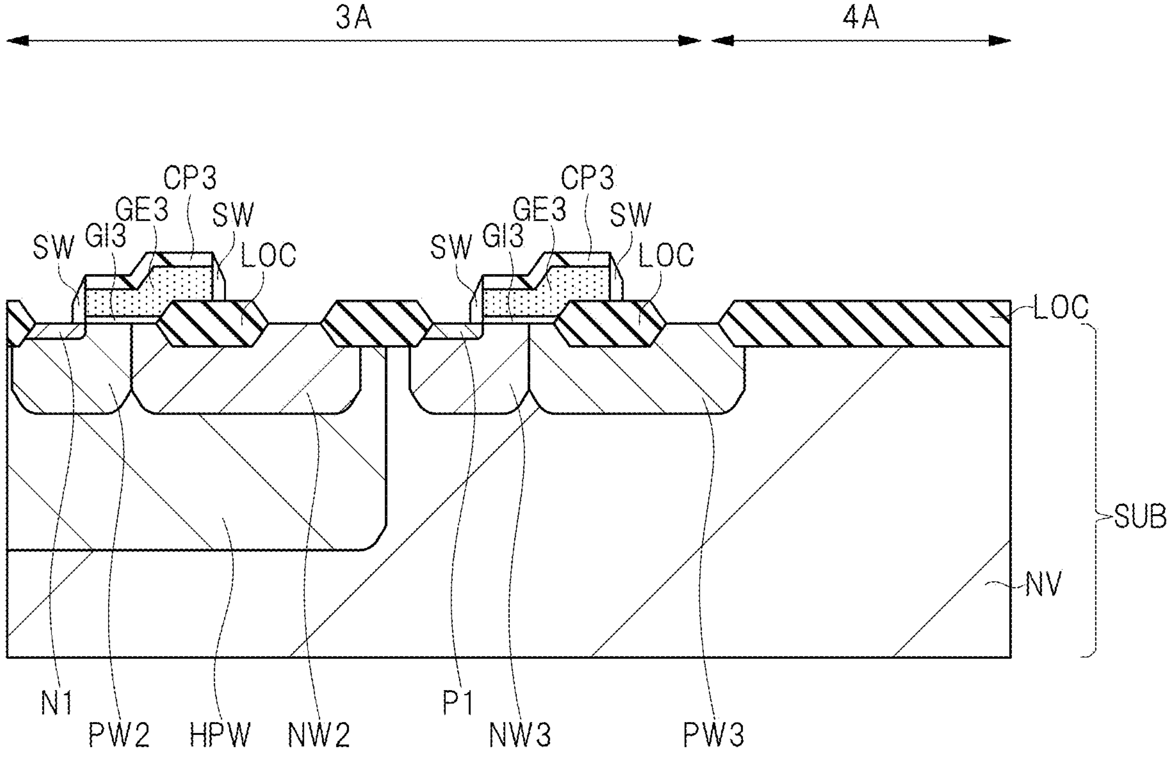
FIG. 31 is a cross-sectional view illustrating a step of manufacturing the semiconductor device continued from FIG. 29.

As illustrated in FIGS. 30 and 31, each impurity region is selectively formed in the semiconductor substrate SUB in each of the regions 2A and 3A on the upper surface side of the semiconductor substrate SUB by using a photolithography technique and an ion implantation method.

In the region 2A, an n-type impurity region N1 is formed in the well region PW1, and a p-type impurity region P1 is formed in the well region NW1. In the region 3A, an n-type impurity region N1 is formed in the well region PW2, and a p-type impurity region P1 is formed in the well region NW3.

A through film composed of a silicon oxide film is formed on the upper surface of the semiconductor substrate SUB before the ion implantation, although not illustrated here. After the ion implantation, the through film is removed by a washing process using aqueous solution containing hydrofluoric acid.

Then, an insulating film such as a silicon oxide film is formed on the upper surface of the semiconductor substrate SUB in each of the regions LA to 4A by, for example, a CVD method. Then, anisotropic etching process is performed to the insulating film, to remove the insulating film on the upper surface of the semiconductor substrate SUB, and to form a sidewall spacer SW on a side surface of each of the gate electrodes GE2 and GE3.

Figure 32:
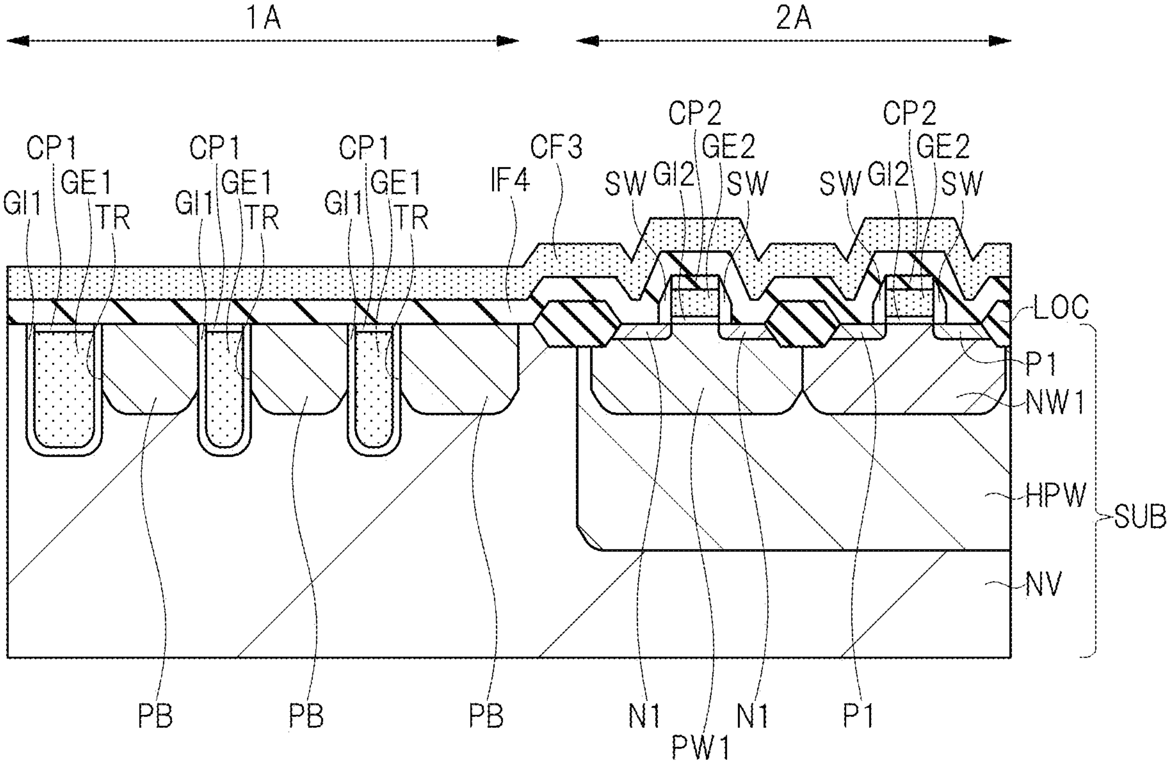
FIG. 32 is a cross-sectional view illustrating a step of manufacturing the semiconductor device continued from FIG. 30.
Figure 33:
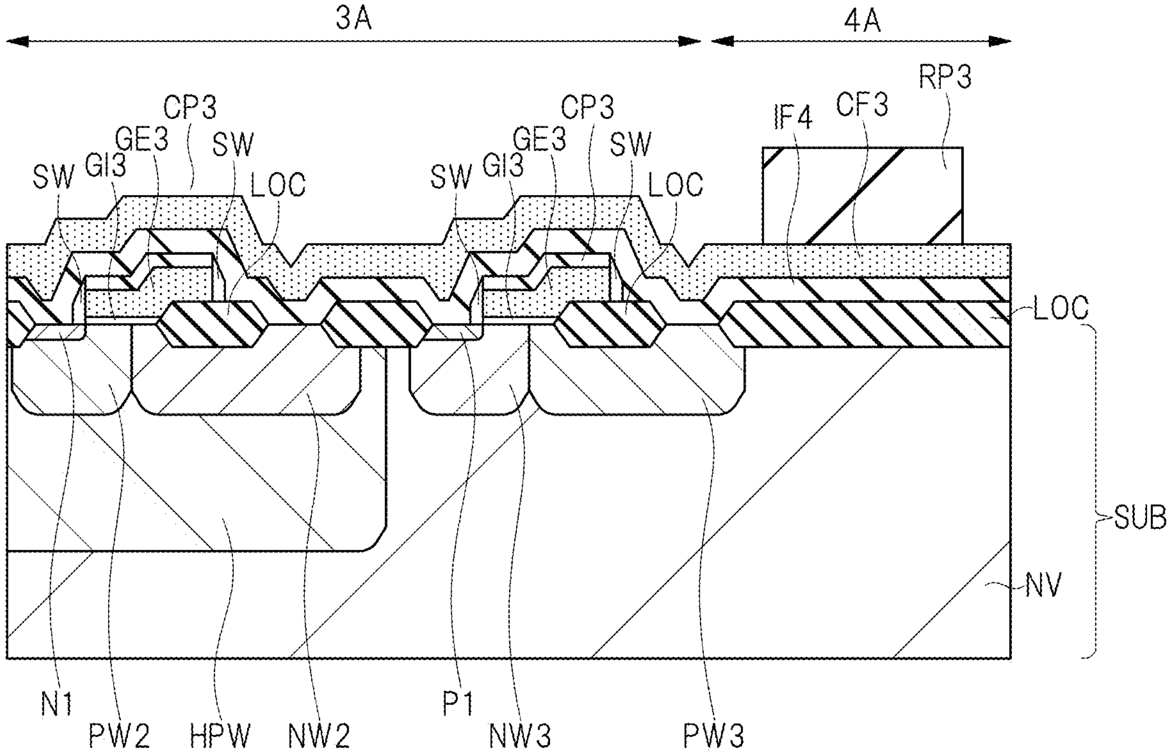
FIG. 33 is a cross-sectional view illustrating a step of manufacturing the semiconductor device continued from FIG. 31.

As illustrated in FIGS. 32 and 33, an insulating film IF4 composed of, for example, a silicon oxide film is first formed on the upper surface of the semiconductor substrate SUB by, for example, a CVD method to cover the gate electrodes GE1 to GE3 and the element isolation section LOC.

Then, a conductive film CF3 is formed on the insulating film IF4 by, for example, a CVD method. A material contained in the conductive film CF3 has a higher sheet resistance than the sheet resistance of a material contained in the conductive films CF1 and CF2 (the gate electrodes GE1 to GE3). The conductive film CF3 is a polycrystalline silicon film. Then, impurities such as boron (B) are ion-implanted into the conductive film CF3, to change the conductive film CF3 into a p-type polycrystalline silicon film. Then, a resist pattern RP3 is formed on the conductive film CF3 to selectively cover a part of the region 4A.

Figure 34:
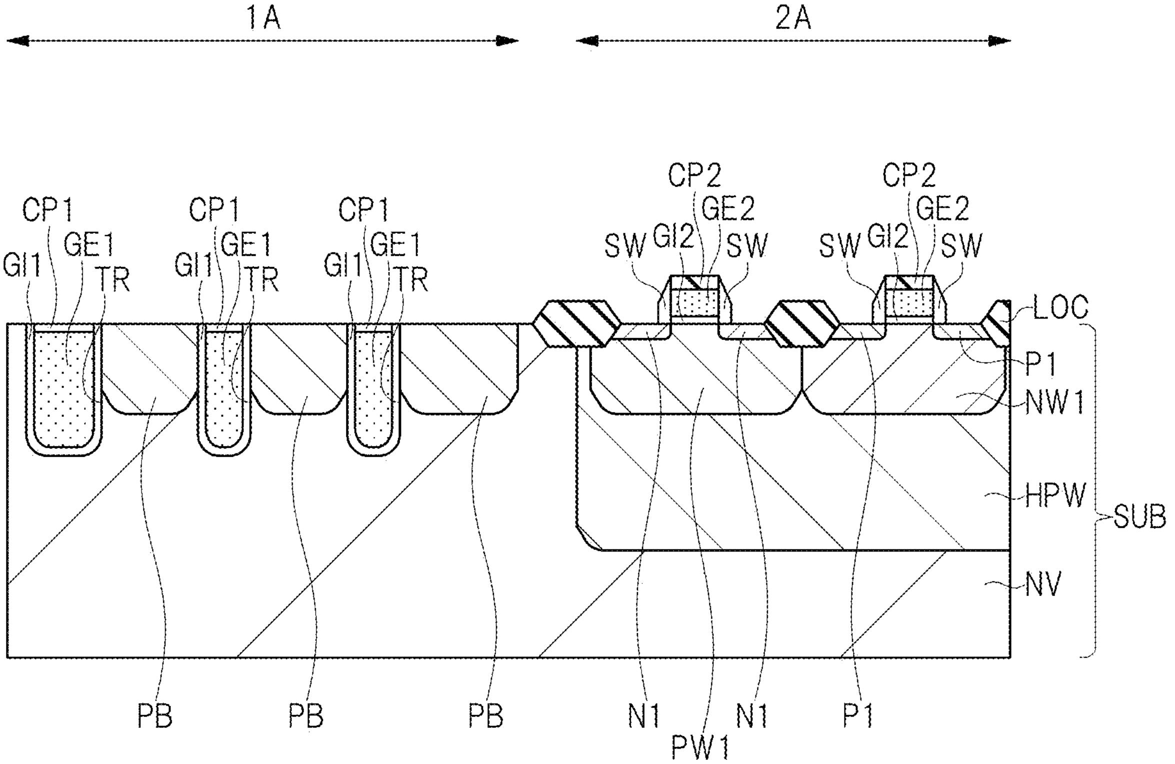
FIG. 34 is a cross-sectional view illustrating a step of manufacturing the semiconductor device continued from FIG. 32.
Figure 35:
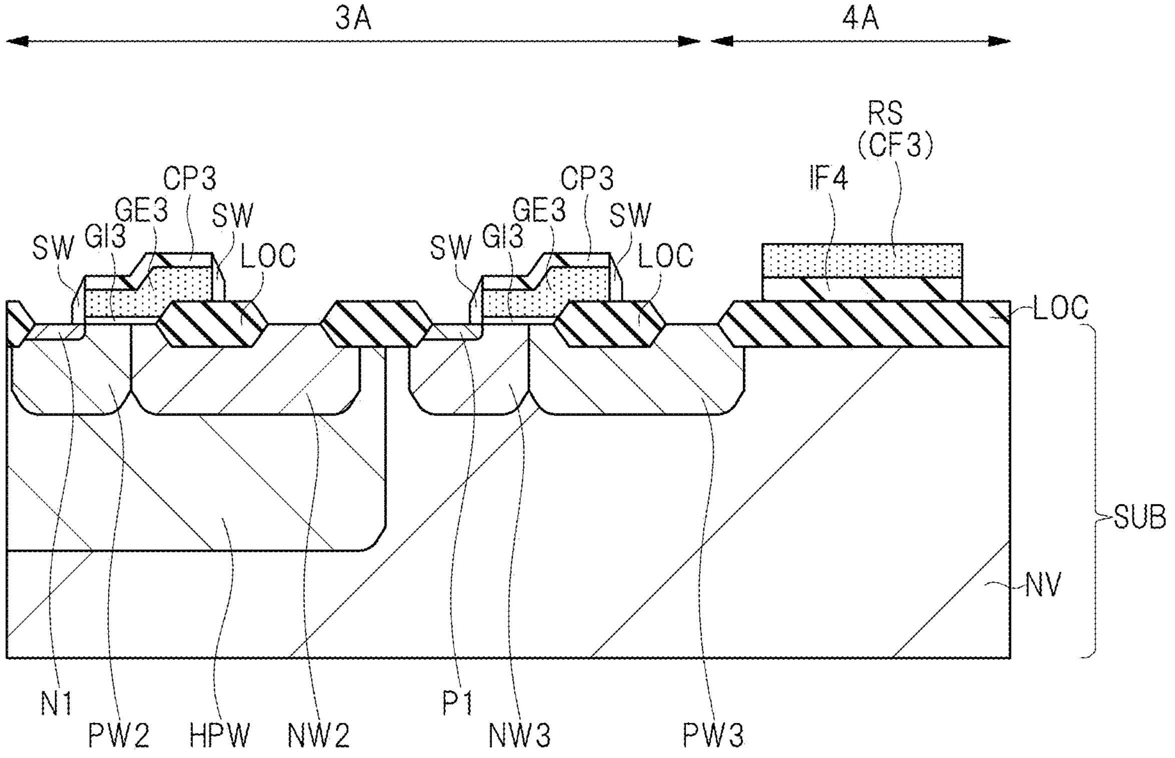
FIG. 35 is a cross-sectional view illustrating a step of manufacturing the semiconductor device continued from FIG. 33.

As illustrated in FIGS. 34 and 35, anisotropic etching process is first performed using the resist pattern RP3 as a mask, to pattern the conductive film CF3. As a result, a resistor element RS is formed. Then, the resist pattern RP3 is removed by asking process. Then, a washing process using aqueous solution containing hydrofluoric acid is performed, to remove the insulating film IF4 exposed out from the resistor element RS.

Figure 36:
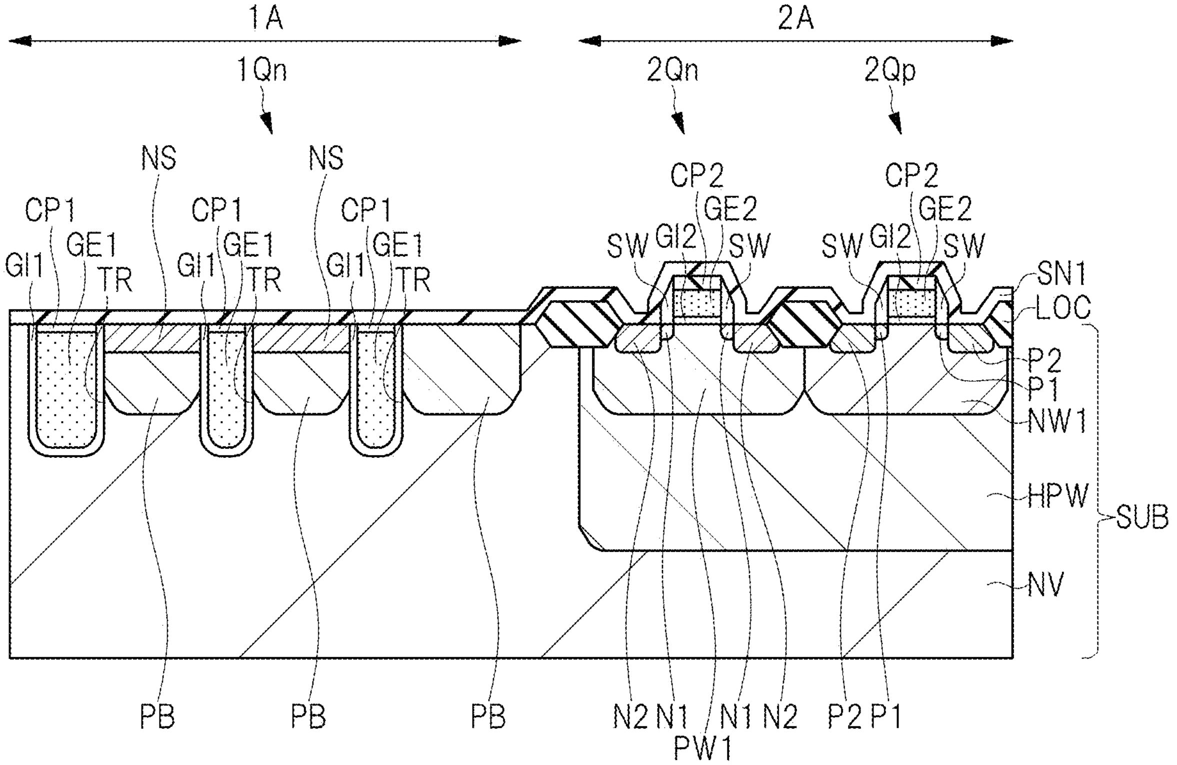
FIG. 36 is a cross-sectional view illustrating a step of manufacturing the semiconductor device continued from FIG. 34.
Figure 37:
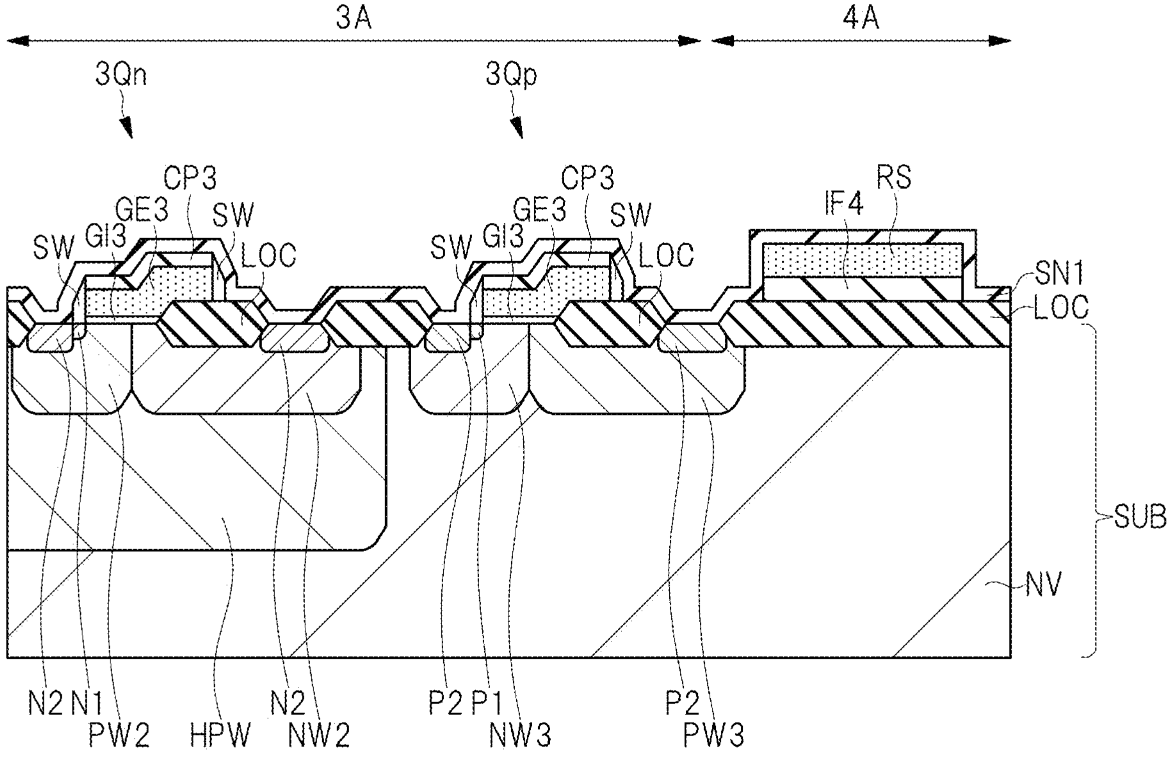
FIG. 37 is a cross-sectional view illustrating a step of manufacturing the semiconductor device continued from FIG. 35.

As illustrated in FIGS. 36 and 37, each impurity region is first selectively formed in the semiconductor substrate SUB in each of the regions LA to 3A on the upper surface side of the semiconductor substrate SUB by using a photolithography technique and an ion implantation method.

In the region LA, an n-type source region NS is formed in the body region PB. In the region 2A, an n-type impurity region N2 is formed in the well region PW1, and a p-type impurity region P2 is formed in the well region NW1. Thus, in the region 2A, a source region and a drain region in a MOSFET 2Qn including the impurity regions N1 and N2 are formed, and a source region and a drain region in a MOSFET 2Qp including the impurity regions P1 and P2 are formed.

In the region 3A, an n-type impurity region N2 is formed in the well region PW2, an n-type impurity region N2 is formed in the well region NW2, a p-type impurity region P2 is formed in the well region NW3, and a p-type impurity region P2 is formed in the well region PW3. Thus, in the region 3A, a source region in a MOSFET 3Qn including the impurity regions N1 and N2 is formed, and a drain region in a MOSFET 3Qn including the well region NW2 and the impurity region N2 is formed. In the region 3A, a source region in a MOSFET 3Qp including the impurity regions P1 and P2 is formed, and a drain region in the MOSFET 3Qp including the well region PW3 and the impurity region P2 is formed.

A through film composed of a silicon oxide film is formed on the upper surface of the semiconductor substrate SUB before the ion implantation, although not illustrated here. The through film may be removed by a washing process using aqueous solution containing hydrofluoric acid after the ion implantation, or the through film may be left.

Then, thermal process is performed to the source region and the drain region in each of the MOSFETs 1Qn, 2Qn, 2Qp, 3Qn, and 3Qp. The thermal process is performed in a nitrogen atmosphere under conditions of, for example, 850° C. and 20 minutes. By the thermal process, impurities contained in the source region and the drain region in each of the MOSFETs 1Qn, 2Qn, 2Qp, 3Qn, and 3Qp are activated.

By the foregoing manufacturing steps, a basic structure of each of the MOSFETs 1Qn, 2Qn, 2Qp, 3Qn, and 3Qp is obtained.

Then, a silicon nitride film SN1 is formed on the upper surface of the semiconductor substrate SUB in the regions LA to 4A by, for example, a CVD method to cover the gate electrodes GE1 to GE3 and the resistor element RS. The thickness of the silicon nitride film SN1 is, for example, 10 nm or more and 20 nm or less.

Figure 38:
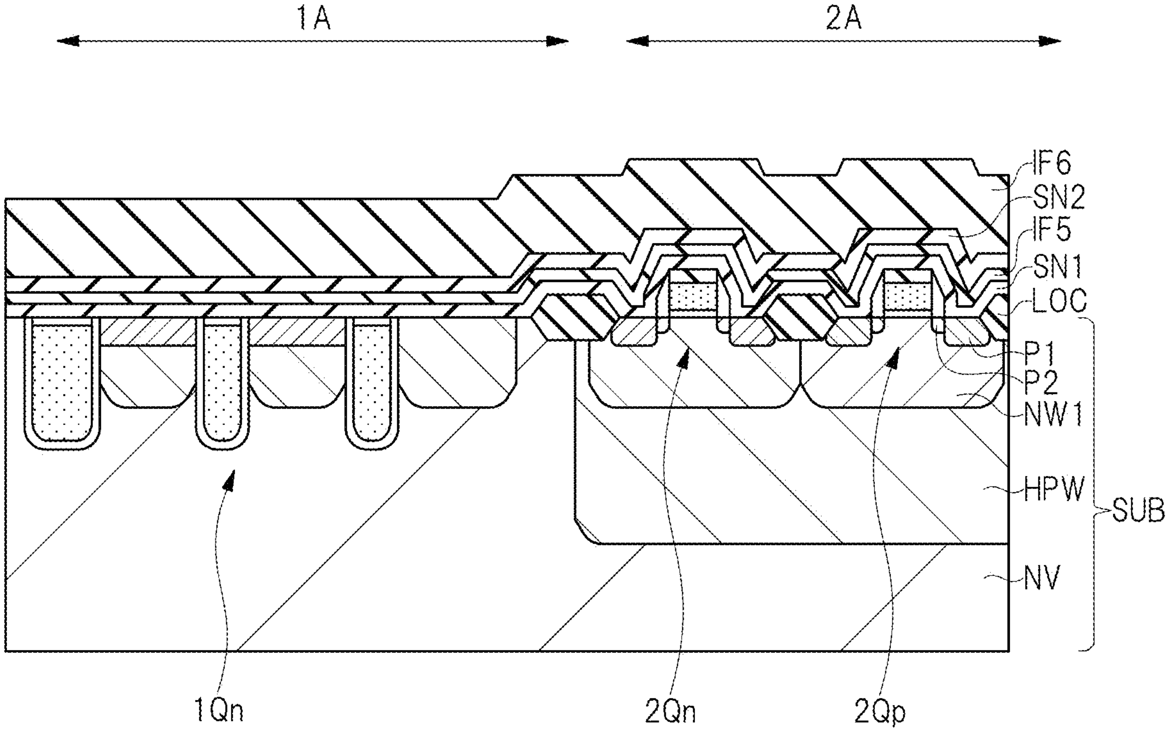
FIG. 38 is a cross-sectional view illustrating a step of manufacturing the semiconductor device continued from FIG. 36.
Figure 39:
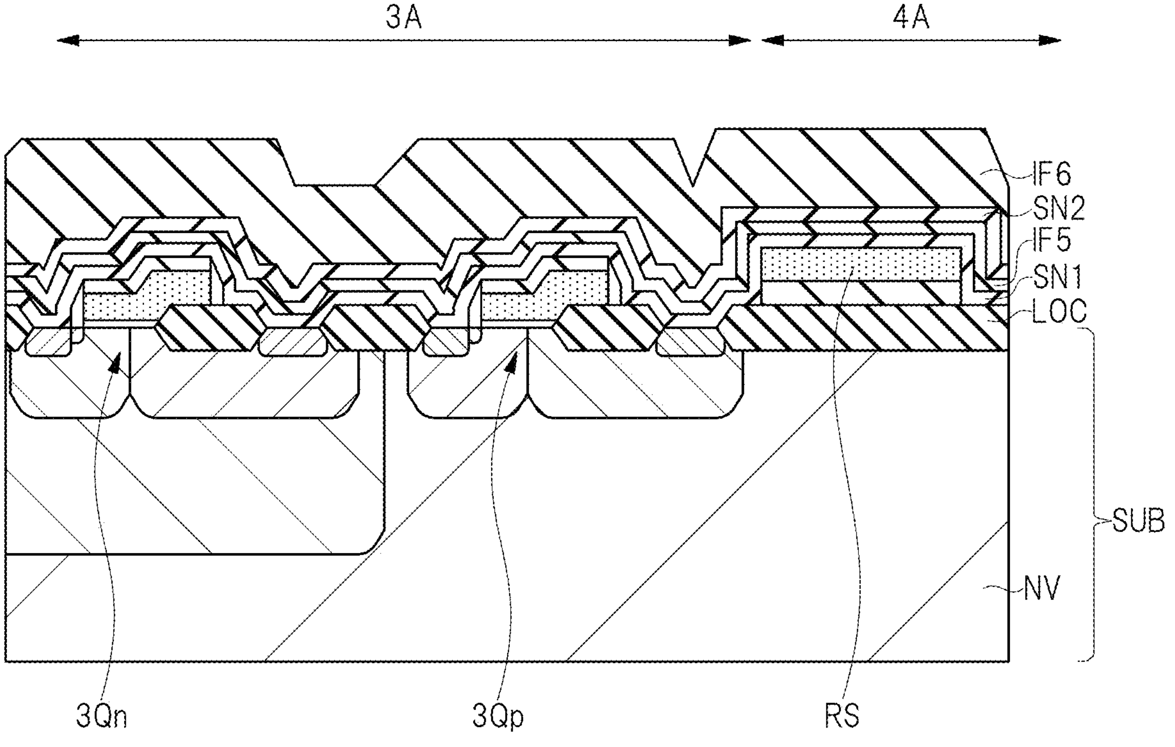
FIG. 39 is a cross-sectional view illustrating a step of manufacturing the semiconductor device continued from FIG. 37.

As illustrated in FIGS. 38 and 39, an insulating film IF5 composed of a silicon oxide film, a silicon nitride film SN2 and an insulating film IF6 composed of a silicon oxide film are sequentially formed on the silicon nitride film SN1 by, for example, a CVD method. The thickness of the insulating film IF5 is, for example, 80 nm or more and 120 nm or less. The thickness of the silicon nitride film SN2 is, for example, 120 nm or more and 160 nm or less. The thickness of the insulating film IF6 is, for example, 1000 nm or more and 1400 nm or less.

Figure 40:
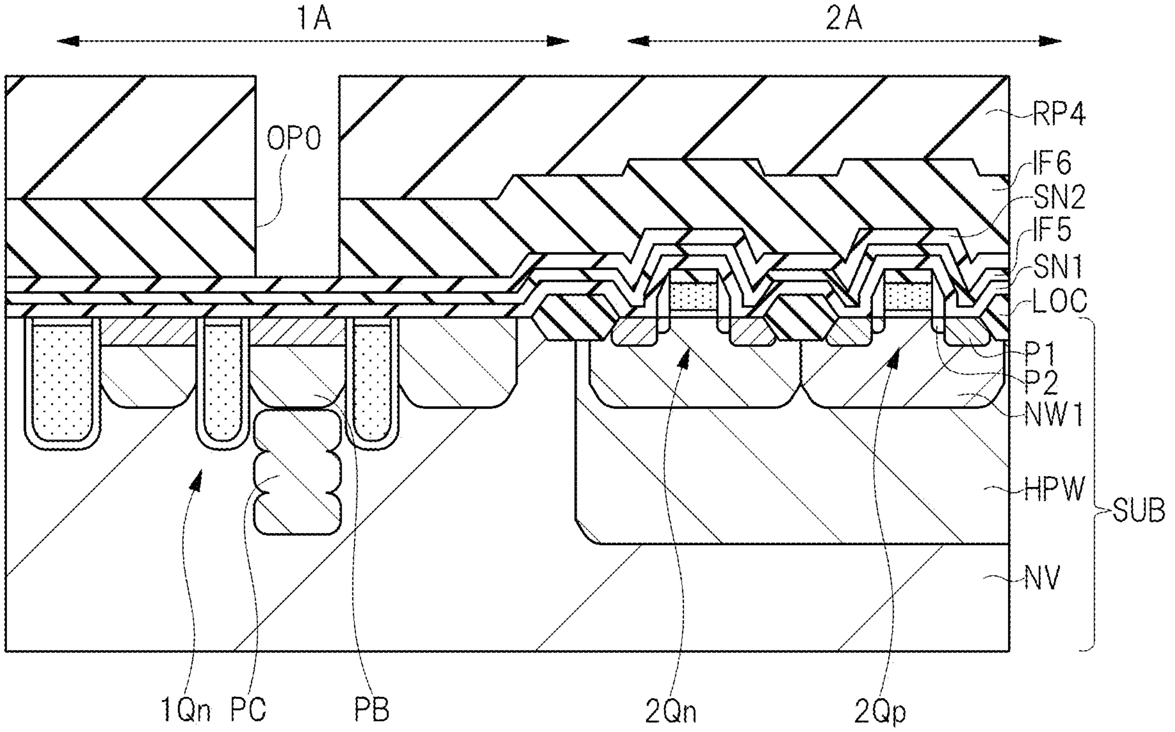
FIG. 40 is a cross-sectional view illustrating a step of manufacturing the semiconductor device continued from FIG. 38.
Figure 41:
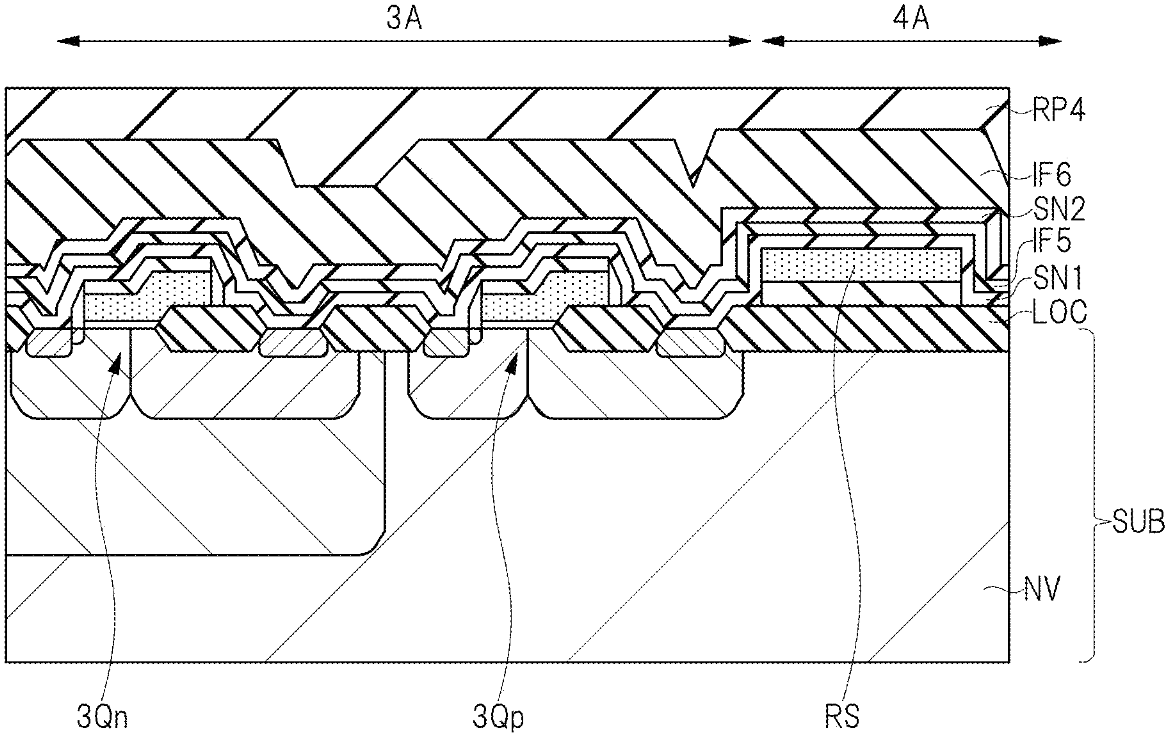
FIG. 41 is a cross-sectional view illustrating a step of manufacturing the semiconductor device continued from FIG. 39.

As illustrated in FIGS. 40 and 41, a resist pattern RP4 is formed on the insulating film IF6 to selectively open a part of the region LA. Then, anisotropic etching process is performed using the resist pattern RP4 as a mask, to form an opening OP0 in the insulating film IF6 positioned on the body region PB. In this case, a silicon nitride film SN2 functions as an etching stopper.

Then, ions are implanted to pass through the silicon nitride film SN1, the insulating film IF5, and the silicon nitride film SN2 in the opening OP0. As a result, a p-type column region PC is formed in the semiconductor substrate SUB positioned below the body region PB. The ion implantation is performed a plurality of separate times while changing implantation energy using, for example, boron (B) as impurities. Then, the resist pattern RP4 is removed by asking process.

The column region PC is preferably formed after the thermal process of activating impurities contained in the source region and the drain region in each of the MOSFETs 1Qn, 2Qn, 2Qp, 3Qn, and 3Qp. When the thermal process for the activation is performed after the column region PC is formed, impurities contained in the column region PC may be diffused so that the column region PC expands. When the expansion of the column region PC is too much in position as different from a design value, there is a risk of an increase in an on-resistance of the MOSFET 1Qn. The position of the diffusion of the column region PC by the thermal process is difficult to be controlled. Accordingly, expansion of a depletion layer may vary, and an expected withstand voltage may not be obtained. Therefore, in the first embodiment, the column region PC is performed after the thermal process for the activation.

Figure 42:
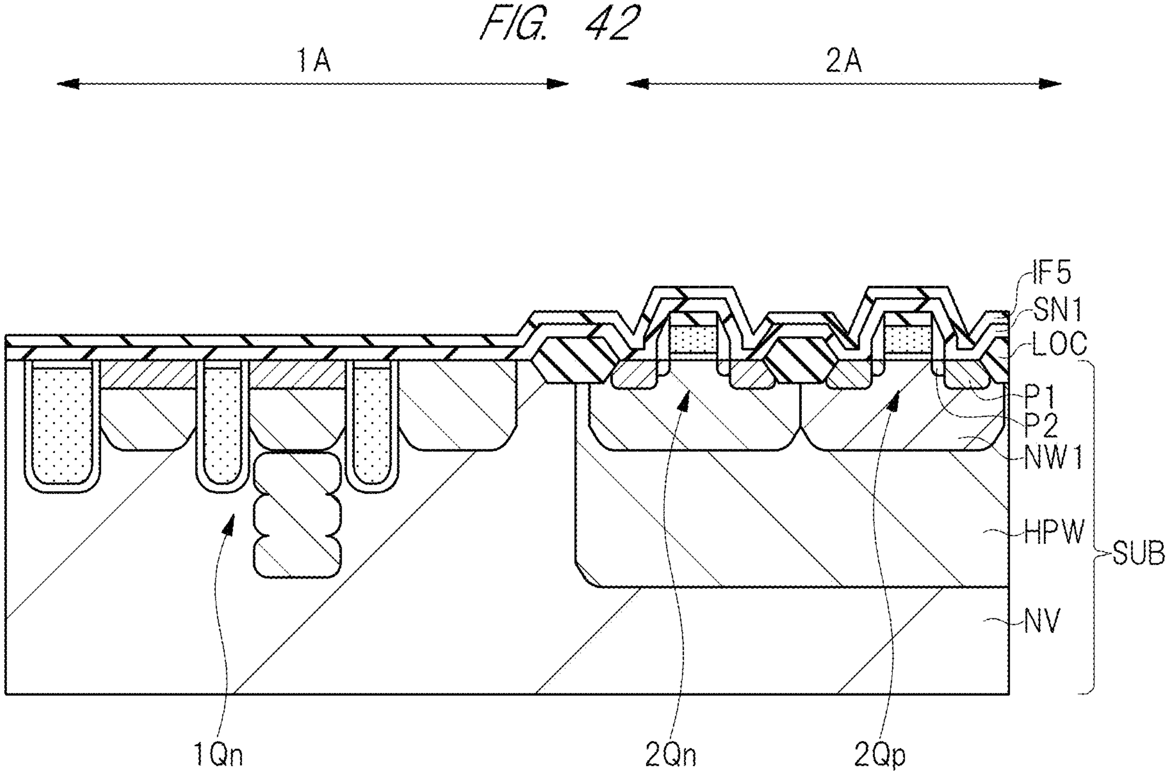
FIG. 42 is a cross-sectional view illustrating a step of manufacturing the semiconductor device continued from FIG. 40.
Figure 43:
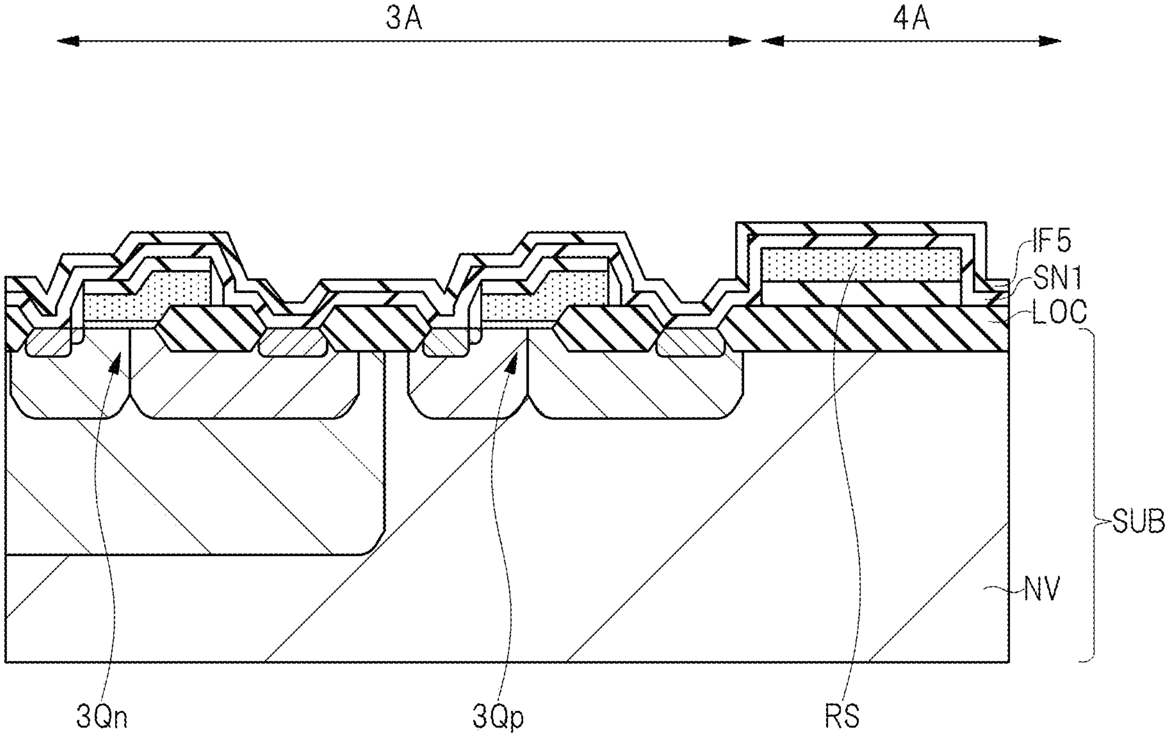
FIG. 43 is a cross-sectional view illustrating a step of manufacturing the semiconductor device continued from FIG. 41.

As illustrated in FIGS. 42 and 43, isotropic etching process using aqueous solution containing hydrofluoric acid is first performed, to remove the insulating film IF6 by using the silicon nitride film SN2 as an etching stopper. Then, isotropic etching process using aqueous solution containing phosphoric acid is performed, to remove the silicon nitride film SN2 by using the insulating film IF5 as an etching stopper. Since the insulating film IF5 has been formed between the silicon nitride film SN1 and the silicon nitride film SN2, the silicon nitride film SN1 is prevented from being also removed when the silicon nitride film SN2 is removed.

Then, the insulating film IF5 may be removed by isotropic etching process using aqueous solution containing hydrofluoric acid, or the insulating film IF5 may be left as a part of the interlayer insulating film IL1. Here, a case where the insulating film IF5 is left is exemplified.

Figure 44:
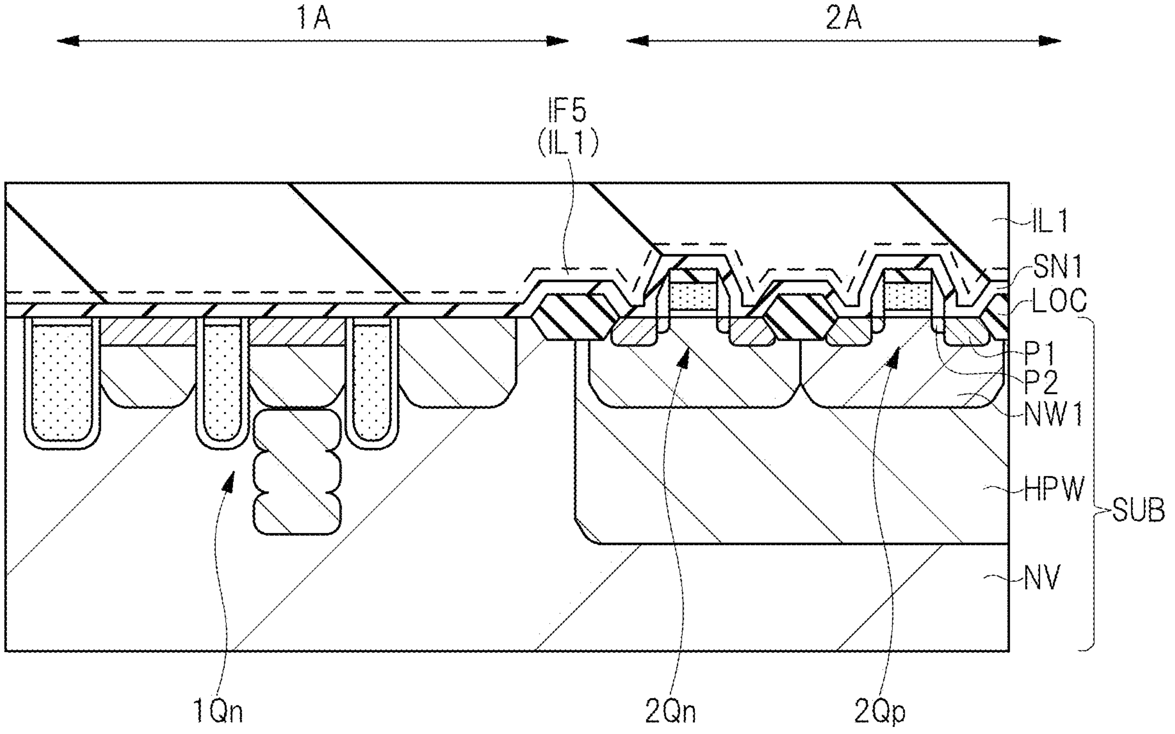
FIG. 44 is a cross-sectional view illustrating a step of manufacturing the semiconductor device continued from FIG. 42.
Figure 45:
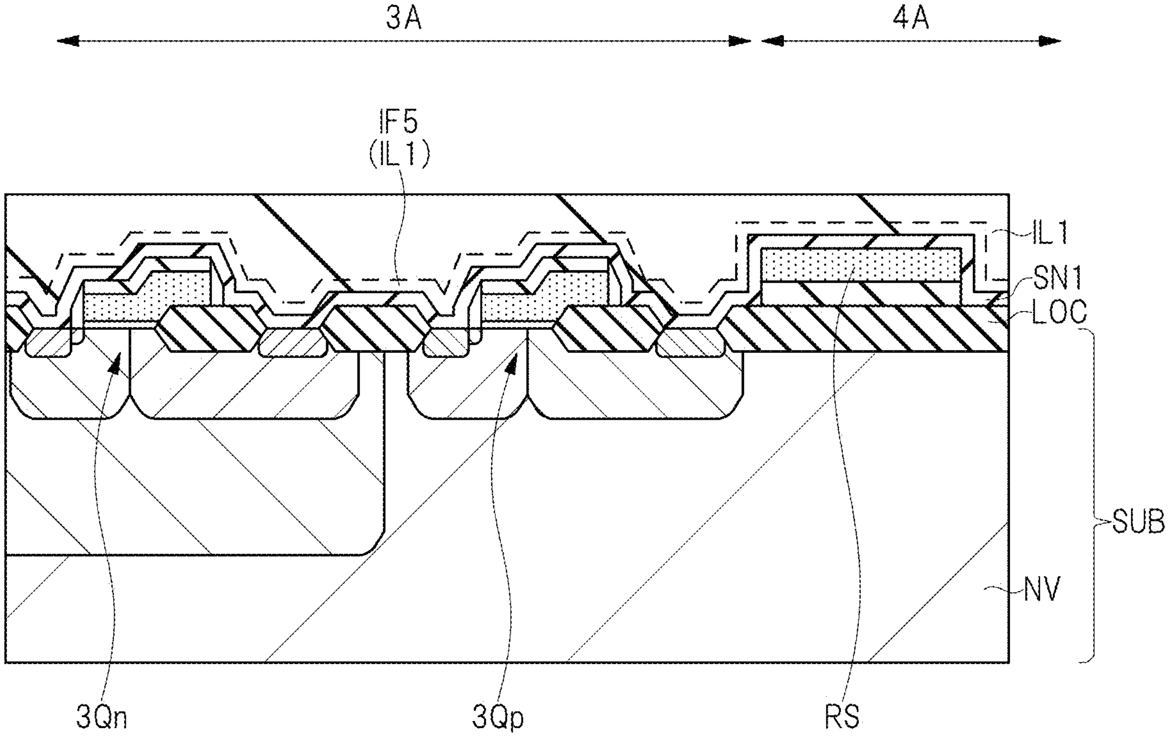
FIG. 45 is a cross-sectional view illustrating a step of manufacturing the semiconductor device continued from FIG. 43.

As illustrated in FIGS. 44 and 45, the interlayer insulating film IL1 is formed on the upper surface of the semiconductor substrate SUB in the regions 1A to 4A to cover the gate electrodes GE1 to GE3 and the resistor element RS.

First, a silicon oxide film is formed on the silicon nitride film SN1 by, for example, a CVD method. Then, a BPSG film is formed on the silicon oxide film by, for example, a coating method. Then, thermal process is performed to the BPSG film. The thermal process is performed in a nitrogen atmosphere performed under conditions of, for example, 850° C. and 20 minutes. Although boron or phosphorus may be diffused from the BPSG film toward the semiconductor substrate SUB by the thermal process, the diffusion can be prevented by the silicon oxide film. If the insulating film IF5 is left, the formation of the silicon oxide film is not essential.

Then, the interlayer insulating film IL1 is polished by polishing process using a CMP (chemical mechanical polishing) method. As a result, an upper surface of the interlayer insulating film IL1 is flattened.

Figure 46:
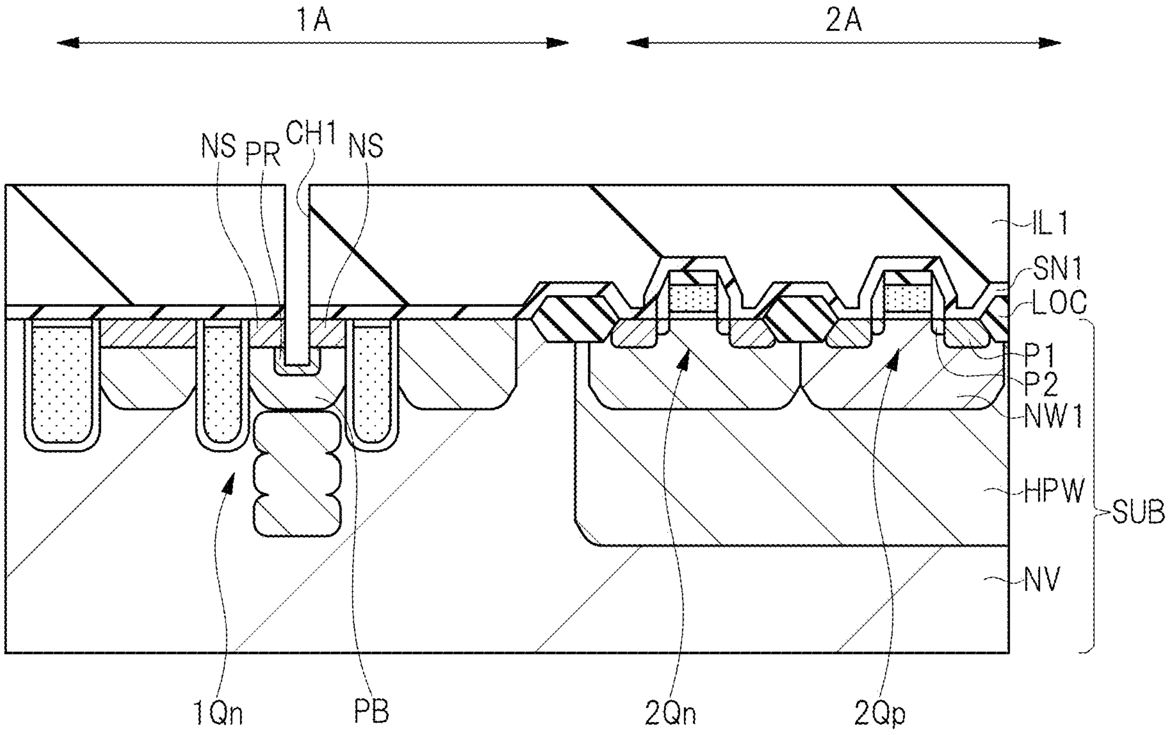
FIG. 46 is a cross-sectional view illustrating a step of manufacturing the semiconductor device continued from FIG. 44.
Figure 47:
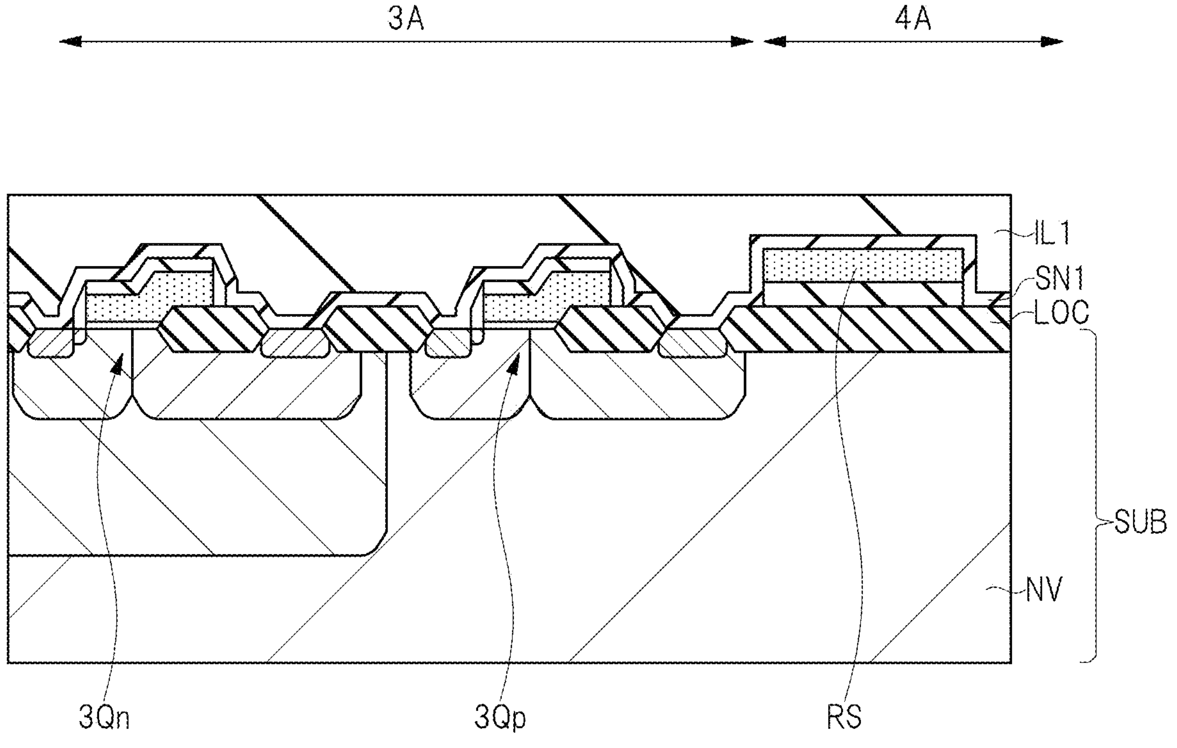
FIG. 47 is a cross-sectional view illustrating a step of manufacturing the semiconductor device continued from FIG. 45.

As illustrated in FIGS. 46 and 47, a hole CH1 is formed in the interlayer insulating film IL1, the silicon nitride film SN1, the source region NS, and the body region PB in the region 1A by a photolithography technique and anisotropic etching process. A bottom portion of the hole CH1 is positioned in the body region PB.

In etching of the interlayer insulating film IL1, the silicon nitride film SN1 functions as an etching stopper. Then, conditions of gas and others are changed, and the silicon nitride film SN1 and the semiconductor substrate SUB are sequentially etched. The etching process is temporarily stopped in the silicon nitride film SN1, and therefore, the respective depths of the plurality of holes CH1 in a wafer plane are easily equalized.

Then, for example, the body region PB in the bottom portion of the hole CH1 is doped with, for example, boron (B) by an ion implantation method, to form a p-type high-concentration diffusion region PR.

Figure 48:
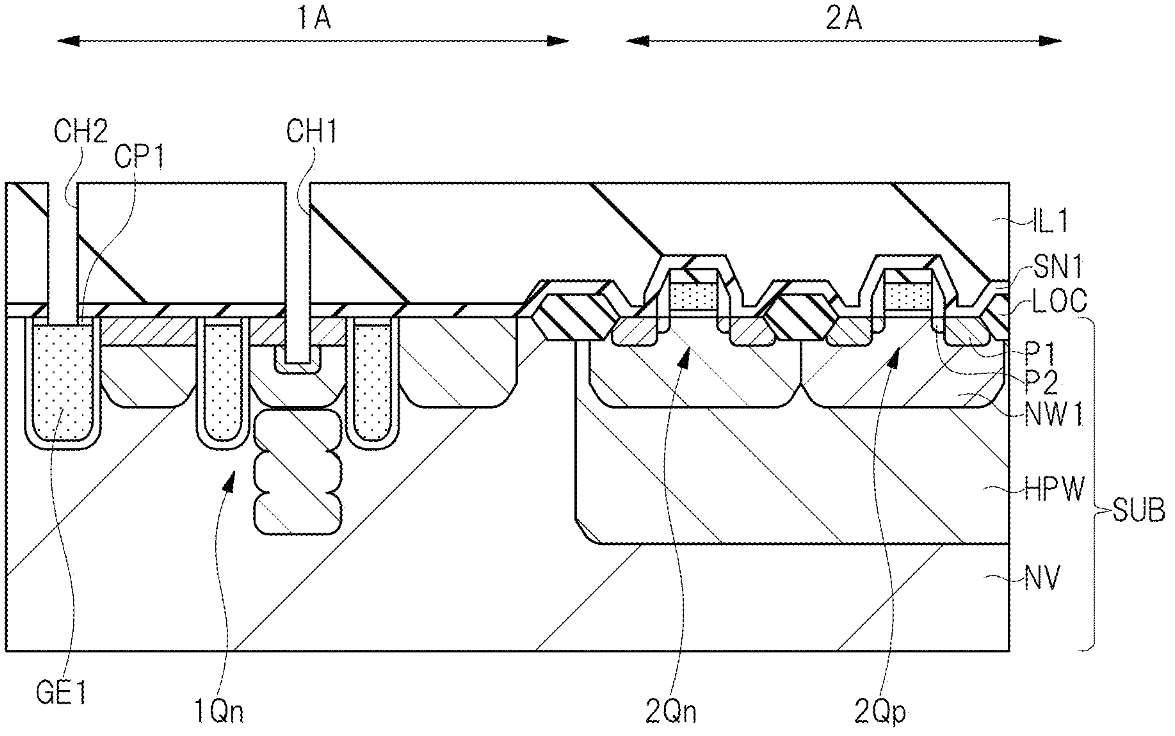
FIG. 48 is a cross-sectional view illustrating a step of manufacturing the semiconductor device continued from FIG. 46.
Figure 49:
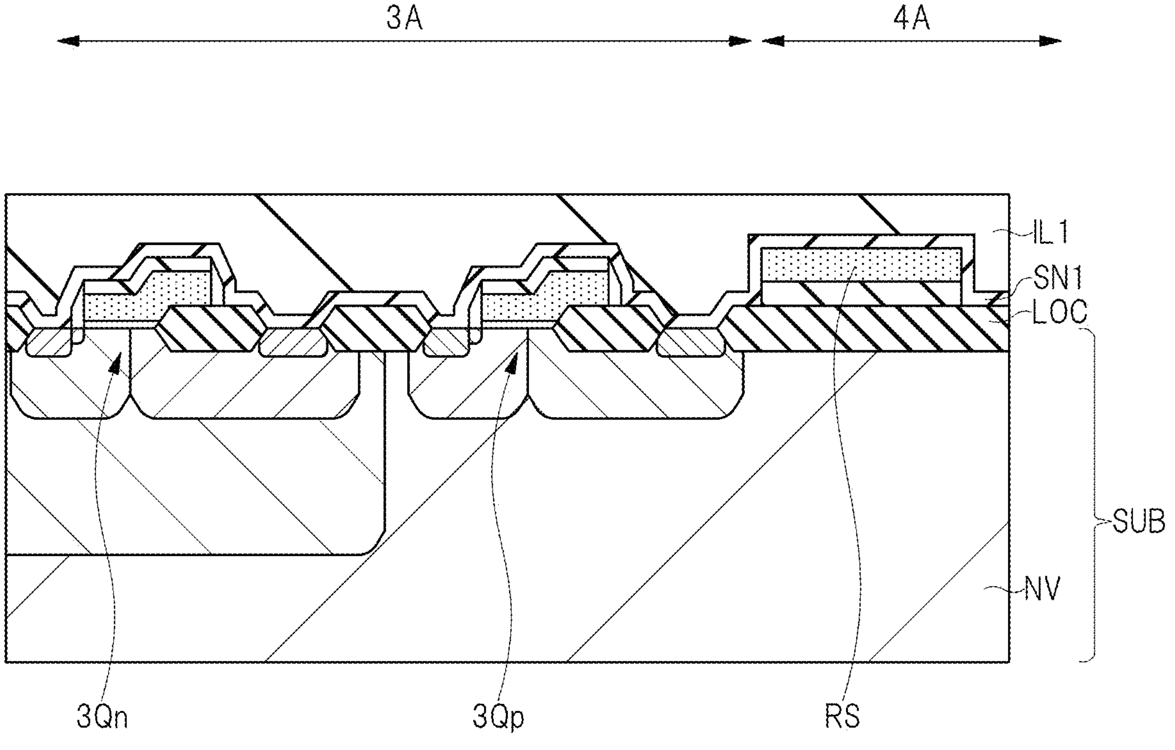
FIG. 49 is a cross-sectional view illustrating a step of manufacturing the semiconductor device continued from FIG. 47.

As illustrated in FIGS. 48 and 49, a hole CH2 is formed in the interlayer insulating film IL1, the silicon nitride film SN1 and the cap film CP1 in the region LA by a photolithography technique and anisotropic etching process. The hole CH2 reaches the gate electrode GE1. In etching of the interlayer insulating film IL1, the silicon nitride film SN1 functions as an etching stopper, as similar to the time of the step of manufacturing the hole CH1.

Figure 50:
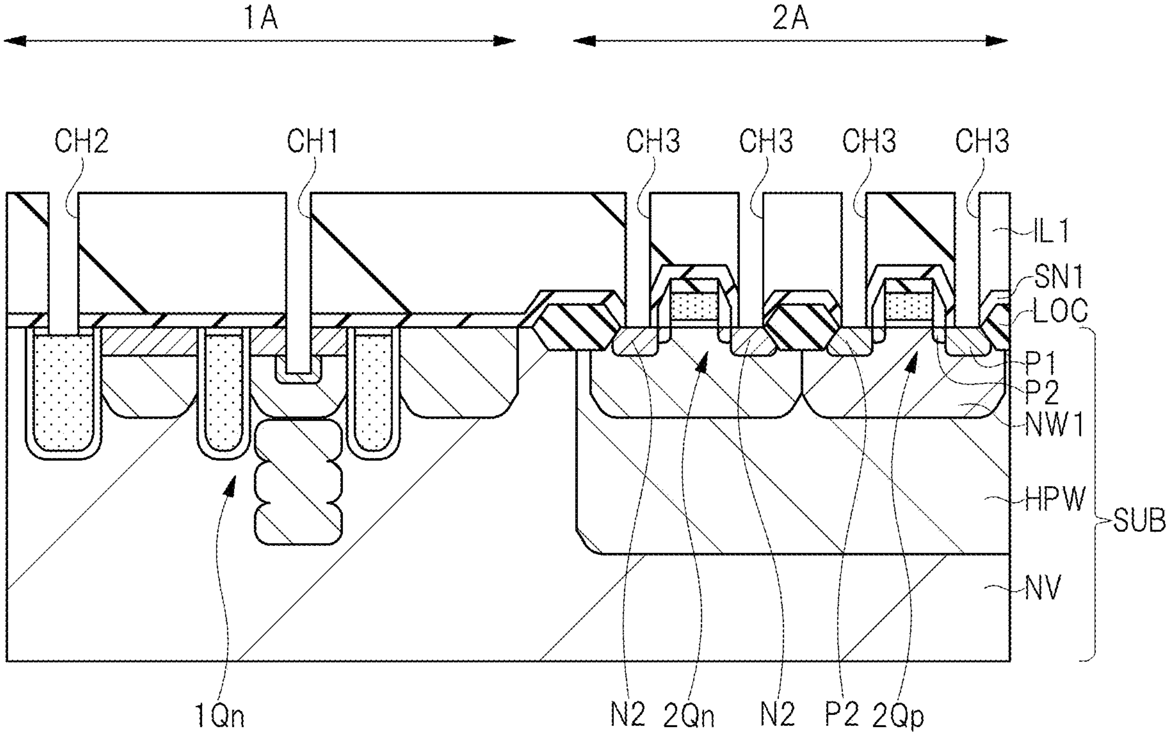
FIG. 50 is a cross-sectional view illustrating a step of manufacturing the semiconductor device continued from FIG. 48.
Figure 51:
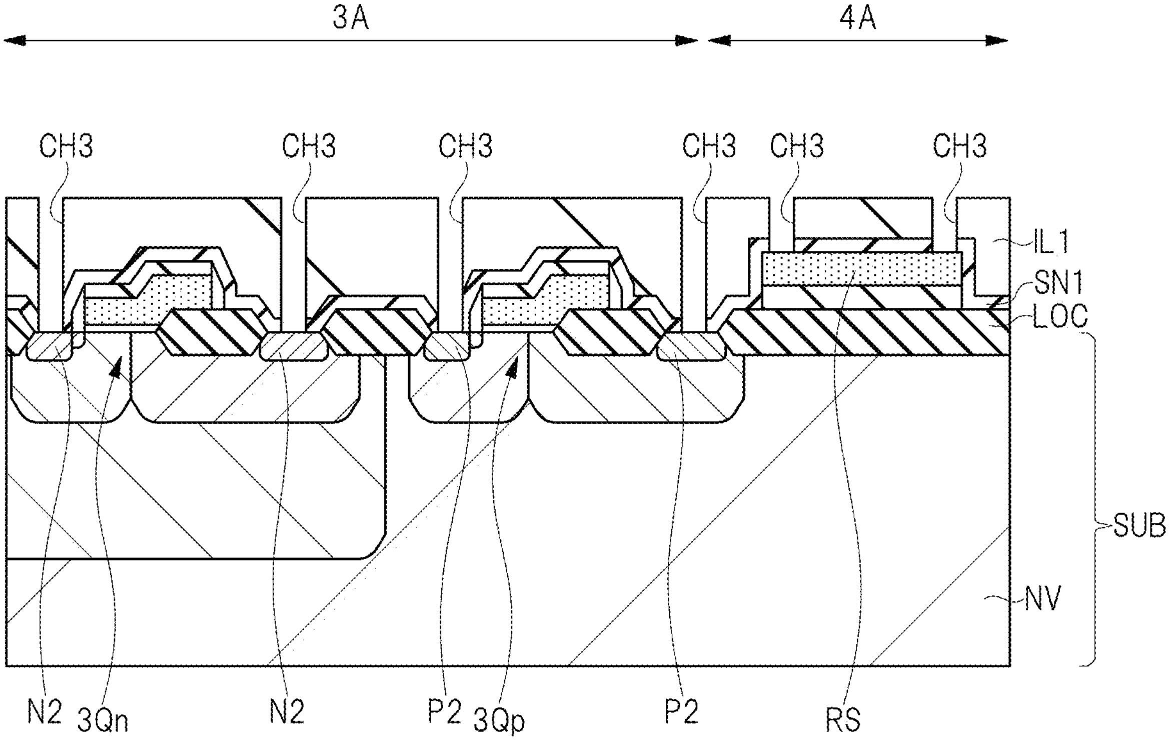
FIG. 51 is a cross-sectional view illustrating a step of manufacturing the semiconductor device continued from FIG. 49.

As illustrated in FIGS. 50 and 51, a plurality of hole CH3 are formed in the interlayer insulating film IL1 and the silicon nitride film SN1 in each of the regions 2A to 4A by a photolithography technique and anisotropic etching process. In the region 2A, the plurality of holes CH3 reach the source region and the drain region in each of the MOSFETs 2Qn and 2Qp. In the region 3A, the plurality of holes CH3 reach the source region and the drain region in each of the MOSFETs 3Qn and 3Qp. In the region 4A, the plurality of holes CH3 reach the resistor element RS. In etching of the interlayer insulating film IL1, the silicon nitride film SN1 functions as an etching stopper, as similar to the time of the step of manufacturing the hole CH1.

The holes CH3 that reach the gate electrodes GE2 and GE3 are formed in the interlayer insulating film IL1 and the silicon nitride film SN1, although not illustrated here.

The step of manufacturing the hole CH1 needs etching to a deeper position than those in a step of manufacturing the hole CH2 and a step of manufacturing the holes CH3, and the semiconductor substrate SUB needs to be etched. Further, there is a step of manufacturing the high-concentration diffusion region PR after forming the hole CH1. Accordingly, the step of manufacturing the hole CH1 is preferably a different step from the step of manufacturing the hole CH2 and the step of manufacturing the holes CH3.

In the step of manufacturing the hole CH2, the cap film CP1 is etched. Accordingly, the step of manufacturing the hole CH2 and the step of manufacturing the hole CH3 are also preferably different from each other.

However, the thickness of the cap film CP1 is relatively smaller than that of the interlayer insulating film IL1 or the like. Accordingly, if an etching damage to the source region and the drain region in each of the MOSFETs 2Qn, 2Qp, 3Qn, and 3Qp is within an allowable range, the step of manufacturing the hole CH2 and the step of manufacturing the hole CH3 may be the same as each other. Particularly, in the first embodiment, a position of the upper surface of the gate electrode GE1 is closer to a position of the upper surface of the semiconductor substrate SUB. Accordingly, a time period taken when the hole CH2 reaches the gate electrode GE1 can be shortened. Therefore, even when the step of manufacturing the hole CH2 and the step of manufacturing the hole CH3 are the same as each other, the above-described etching damage can be less than that of the study example 1 and others.

Figure 52:
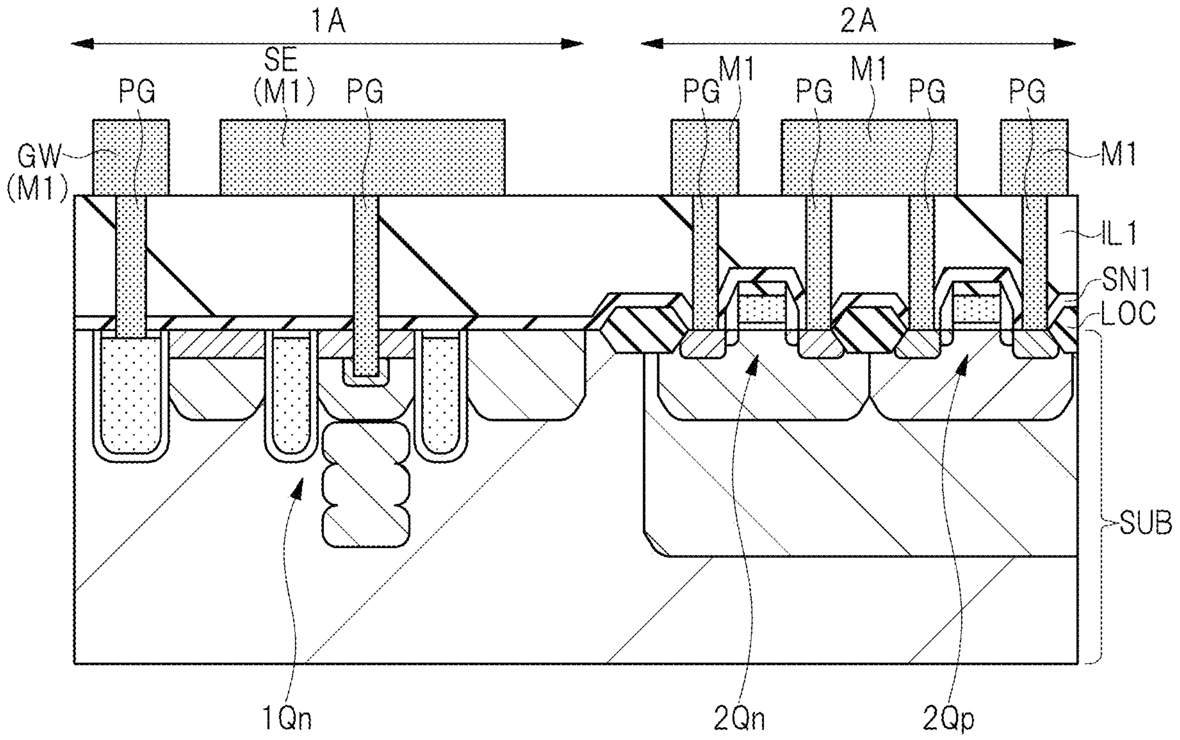
FIG. 52 is a cross-sectional view illustrating a step of manufacturing the semiconductor device continued from FIG. 50.
Figure 53:
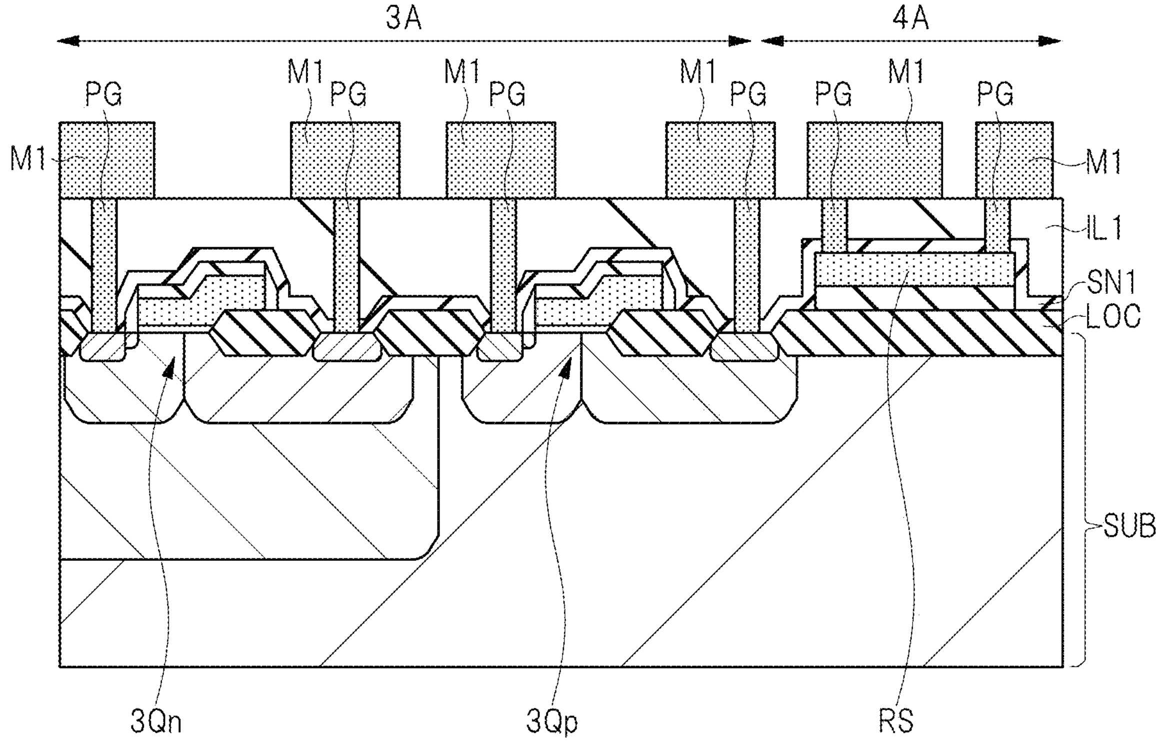
FIG. 53 is a cross-sectional view illustrating a step of manufacturing the semiconductor device continued from FIG. 51.

As illustrated in FIGS. 52 and 53, a plug PG is formed in each of the holes CH1 to CH3. First, a barrier metal film is formed in each of the holes CH1 to CH3 and on the interlayer insulating film IL1 by, for example, a sputtering method. Then, a conductive film is formed on the barrier metal film by, for example, a CVD method to be embedded into each of the holes CH1 to CH3. Then, for example, anisotropic etching process is performed to remove the barrier metal film and the conductive film formed outside each of the holes CH1 to CH3. As a result, the plug PG is formed in the interlayer insulating film IL1. The barrier metal film is, for example, a stacked film of a titanium film and a titanium nitride film. The conductive film is, for example, a tungsten film.

Then, a first barrier metal film, a conductive film, and a second barrier metal film are sequentially formed on the interlayer insulating film IL1 by, for example, a sputtering method or a CVD method. Then, the first barrier metal film, the conductive film, and the second barrier metal film are patterned, to form a wiring M1 on the interlayer insulating film IL1 to be connected to the plug PG. The first barrier metal film is, for example, a stacked film of a titanium film and a titanium nitride film. The conductive film is, for example, an aluminum film or an aluminum alloy film to which copper or silicon is added. The second barrier metal film is, for example, a stacked film of a titanium film and a titanium nitride film.

Then, a structure illustrated in FIGS. 4 and 5 is obtained through the following manufacturing steps.

An interlayer insulating film IL2 is formed on the interlayer insulating film IL1 to cover the wiring M1. In order to form the interlayer insulating film IL2, a first silicon oxide film is first formed on the interlayer insulating film IL1 by, for example, a high-density plasma CVD (HDP-CVD) method. Then, a second silicon oxide film is formed on the first silicon oxide film by, for example, a CVD method. Then, the first silicon oxide film and the second silicon oxide film are flattened by polishing process using a CMP method. As a result, the interlayer insulating film IL2 including the first silicon oxide film and the second silicon oxide film is formed.

In a step after the formation of the interlayer insulating film IL2 and before formation of a via V1 described below, hydrogen alloy process may be performed. The hydrogen alloy process is thermal process in a hydrogen atmosphere under conditions of, for example, 400° C. and 20 minutes. A dangling bond in the vicinity of the upper surface of the semiconductor substrate SUB is terminated by the hydrogen alloy process, and therefore, a variation in threshold voltage of the MOSFET 1Qn can be improved.

Then, the via V1 is formed in the interlayer insulating film IL2 to be connected to the wiring M1. In order to form the via V1, a contact hole is formed in the interlayer insulating film IL2 by a photolithography technique and anisotropic etching process. Then, a barrier metal film is formed in the contact hole and on the interlayer insulating film IL2 by, for example, a CVD method. Then, a conductive film is formed on the barrier metal film by, for example, a CVD method to be embedded into the contact hole. Then, for example, anisotropic etching process is performed, to remove the barrier metal film and the conductive film formed outside the contact hole. As a result, the via V1 is formed in the interlayer insulating film IL2. The barrier metal film is, for example, a titanium nitride film. The conductive film is, for example, a tungsten film.

Then, a wiring M2 is formed on the interlayer insulating film IL2 to be connected to the via V1. Then, an interlayer insulating film IL3 is formed on the interlayer insulating film IL2 to cover the wiring M2. Then, a via V2 is formed in the interlayer insulating film IL3 to be connected to the wiring M2. Steps of manufacturing the wiring M2, the interlayer insulating film IL3, and the via V2 are respectively performed by the same methods as those in the steps of manufacturing the wiring M1, the interlayer insulating film IL2, and the via V1.

In a step after the formation of the interlayer insulating film IL3 and before formation of the via V2, hydrogen alloy process may be performed under similar conditions to those described above. The hydrogen alloy process may be performed only after the formation of the interlayer insulating film IL2, only after the formation of the interlayer insulating film IL3, or after both of them.

Then, a wiring M3 is formed on the interlayer insulating film IL3 to be connected to the via V2. In order to form the wiring M3, a barrier metal film and a conductive film are first sequentially formed on the interlayer insulating film IL3 by, for example, a sputtering method or a CVD method. Then, the barrier metal film and the conductive film are patterned, to form the wiring M3 on the interlayer insulating film IL3. The barrier metal film is, for example, a titanium tungsten film. The conductive film is, for example, an aluminum film or an aluminum alloy film to which copper or silicon is added.

Then, a protective film PVF is formed on the interlayer insulating film IL3 by, for example, a coating method to cover the wiring M3. The protective film PVF is, for example, a polyimide film. Then, openings OP1 and OP2 (see FIGS. 67 and 70) are formed in the protective film PVF on the wiring M3 such that a part of the wiring M3 is exposed out. A part of the wiring M3 exposed out from inside of each of the opening OP1 and OP2 constitutes a source pad PADs or a pad PAD to be connected to the external connection member BW.

Then, the lower surface of the semiconductor substrate SUB is polished, as needed. Then, the lower surface of the semiconductor substrate SUB is doped with, for example, arsenic (As) by an ion implantation method to form an n-type drain region ND. Then, the drain electrode DE is formed below the lower surface of the semiconductor substrate SUB by a sputtering method.

When the semiconductor substrate SUB is a stacked body of an n-type silicon substrate and an n-type semiconductor layer, the n-type silicon substrate may be thinned by the above-described polishing. In the case, if the n-type silicon substrate is left, the left n-type silicon substrate can function as the drain region ND. Accordingly, it is unnecessary to form the drain region ND by the above-described ion implantation method.

The semiconductor device 100 is manufactured as described above.

<Pad Structure>

Features of the source pad PADs and the pad PAD in the first embodiment will be described below with reference to FIGS. 66 to 70.

Figure 66:
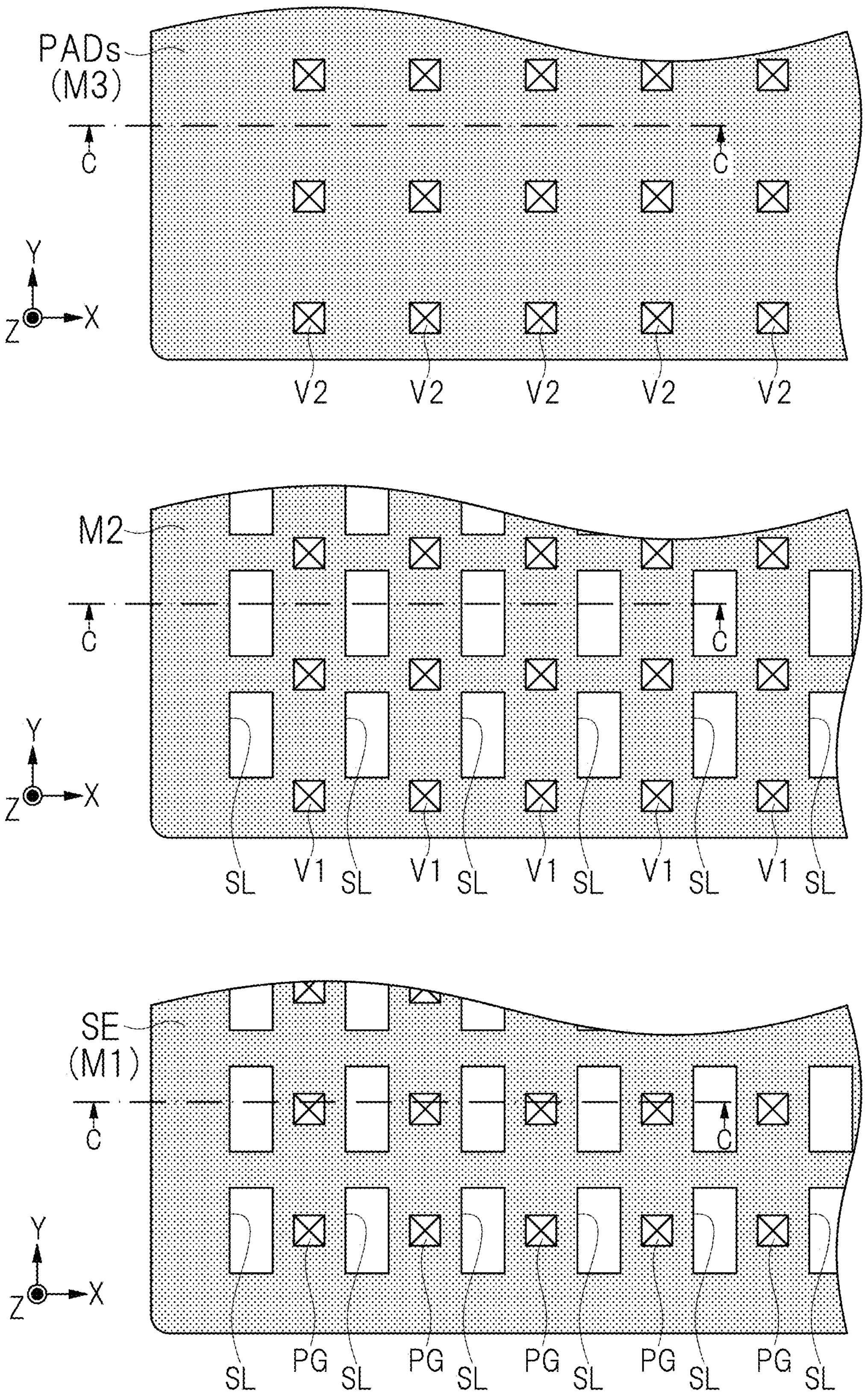
FIG. 66 is a partially enlarged plan view of the semiconductor device according to the first embodiment.

FIG. 66 is a plan view corresponding to an enlarged region 10 surrounded by a broken line in the source pad PADs illustrated in FIG. 1. FIG. 67 is a cross-sectional view taken along a line C-C illustrated in FIG. 66. A via V1 and a via V2 are each indicated by a broken line in FIG. 67 to make it easy to understand an up-down relationship among components although not practically indicated.

As illustrated in FIGS. 66 and 67, at a position overlapping the source pad PADs in a planar view, a wiring M2 is provided with a plurality of slits SL that penetrate the wiring M2, a wiring M1 is provided with a plurality of slits SL that penetrate the wiring M1, and a semiconductor substrate SUB is provided with a plurality of MOSFETs 1Qn. The source pad PADs as a part of the wiring M3 is not provided with such slits.

In each of the wiring M1 and the wiring M2, the plurality of slits SL constitute a rectangular shape in a planar view, and are provided in a matrix shape such that their respective longitudinal directions are each a column direction. In FIG. 66, a column direction is the Y-direction, and a row direction is the X-direction. The plurality of slits SL in the wiring M2 are respectively provided at positions overlapping the plurality of slits SL in the wiring M1 in a planar view. A plurality of plugs PG, a plurality of vias V1, and a plurality of vias V2 are respectively provided among columns of the plurality of slits SL.

From studies performed by the inventors of the present application, it is found out that if each of the wiring M2 and the wiring M1 below the source pad PADs is not provided with the plurality of slits SL, a crack easily occurs in the interlayer insulating film IL3 due to a stress from the external connection member BW when the external connection member BW is formed on the source pad PADs. It is also found out that a crack also easily occurs in not only an interlayer insulating film IL3 but also the interlayer insulating films IL2 and IL1 below the interlayer insulating film IL3.

Since each of the wiring M2 and the wiring M1 is provided with the plurality of slits SL, as described in the first embodiment, the stress is easy to release downward via the plurality of slits SL. Therefore, occurrence of the crack can be prevented, and therefore, the reliability of the semiconductor device 100 can be improved.

As described above, in the first embodiment, the hydrogen alloy process is performed at least either one of the step after the formation of the interlayer insulating film IL2 and before the formation of the vias V1 and the step after the formation of the interlayer insulating film IL3 and before the formation of the vias V2. The dangling bond in the vicinity of the upper surface of the semiconductor substrate SUB is terminated by the hydrogen alloy process, and therefore, a variation in threshold voltage of the MOSFET 1Qn can be improved.

However, from studies performed by the inventors of the present application, it is found out that hydrogen in the hydrogen alloy process is easily absorbed by the barrier metal film (the titanium film and the titanium nitride film) included in the wiring M1 and the wiring M2. Since tach of the wirings M1 and the wiring M2 is provided with the plurality of slits SL as described in the first embodiment, the hydrogen is easy to pass downward through the plurality of slits SL, and the hydrogen can reach the vicinity of the upper surface of the semiconductor substrate SUB.

Figure 68:
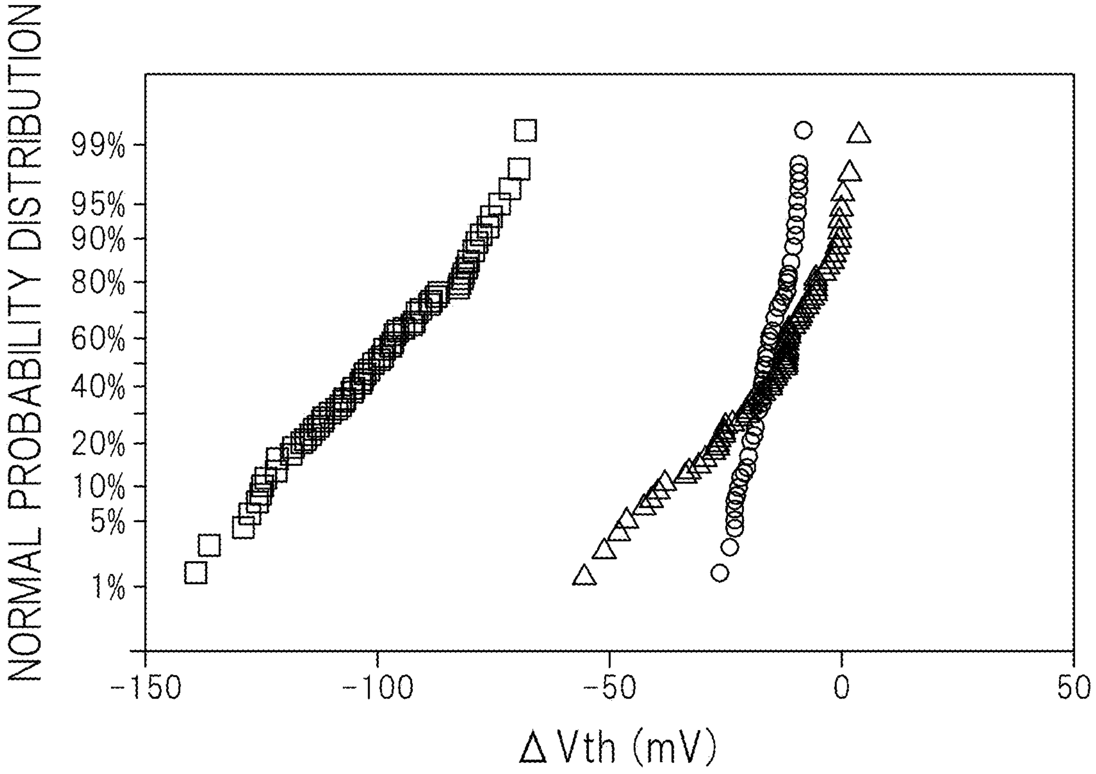
FIG. 68 is a graph illustrating experimental data obtained by the inventors of the present application.

FIG. 68 is a graph illustrating a result of an experiment performed by the inventors of the present application. In FIG. 68, the vertical axis represents a normal probability distribution, and the horizontal axis represents an amount of variation (ΔVth) in threshold voltage of the MOSFET 1Qn.

As illustrated in FIG. 68, in cases (□ and Δ) in which the hydrogen alloy process is not applied, the slope of the graph becomes gentle regardless of cases with or without the slits SL. This means that the variation of ΔVth is large in a plurality of MOSFETs 1Qn in a wafer plane.

On the other hand, in a case (0) in which the hydrogen alloy process is applied and with the slits SL, the slope of the graph is steep, and it is found out that the variation of ΔVth is improved.

Figure 69:
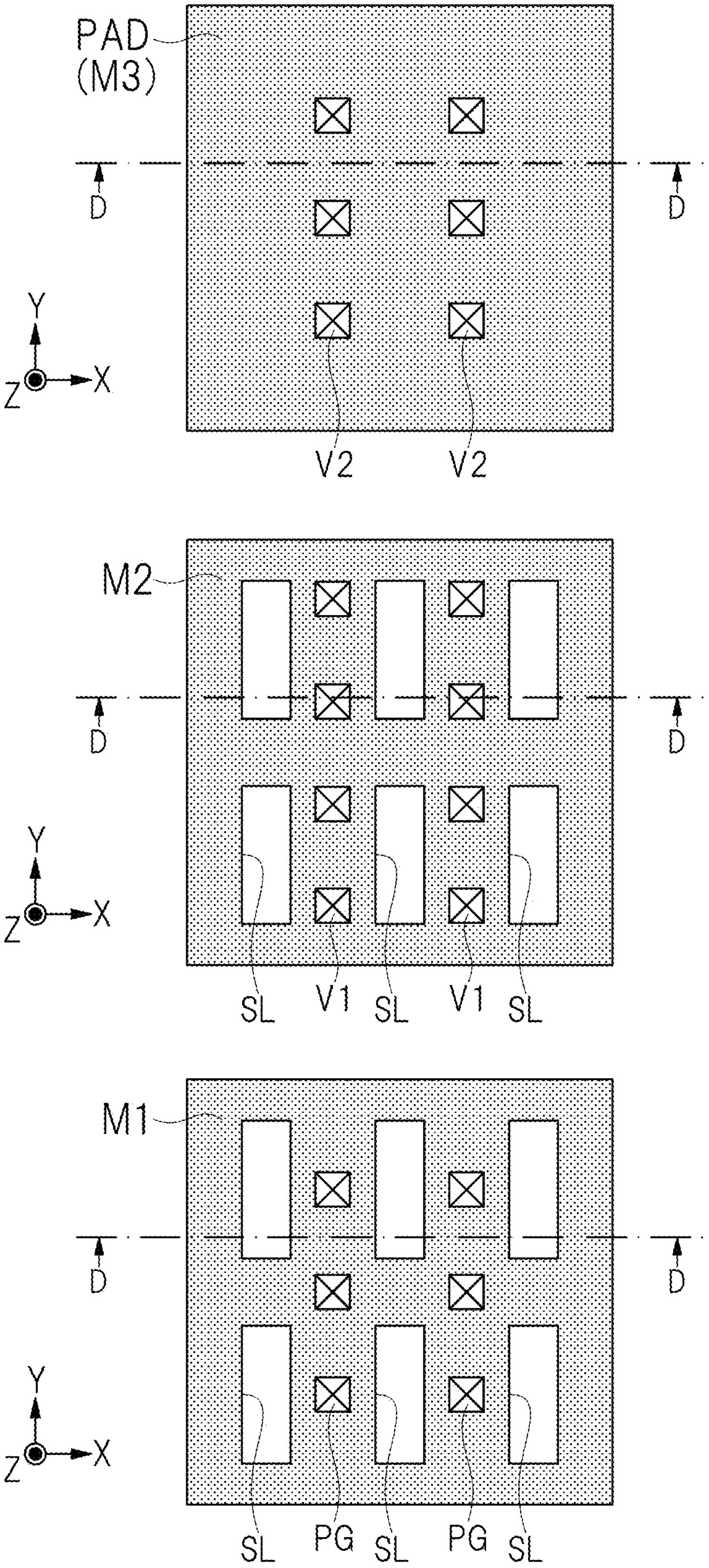
FIG. 69 is a partially enlarged plan view of a part of the semiconductor device according to the first embodiment.

FIG. 69 is a plan view corresponding to each of the pads PAD illustrated in FIG. 1. FIG. 70 is a cross-sectional view taken along a line D-D illustrated in FIG. 69. A plug PG and a via V2 are each indicated by a broken line in FIG. 70 to make it easy to understand an up-down relationship among components, although not practically indicated.

As illustrated in FIGS. 69 and 70, at a position overlapping the pad PAD in a planar view, a wiring M2 is provided with a plurality of slits SL that penetrate the wiring M2, and a wiring M1 is provided with a plurality of slits SL that penetrate the wiring M1. The pad PADs as a part of a wiring M3 is not provided with such slits SL.

At a position overlapping the pad PADs in a planar view, a semiconductor substrate SUB is not provided with MOSFETs 2Qn, 2Qp, 3Qn, and 3Qp and a resistor element RS. The MOSFETs 2Qn, 2Qp, 3Qn, and 3Qp and the resistor element RS are electrically connected to the pad PAD via the other wirings M1 to M3.

At a position overlapping the pad PAD in a planar view, the semiconductor substrate SUB is provided with an element isolation section LOC. A conductive film PL is formed on the element isolation section LOC. The conductive film PL is connected to the wiring M1 via the plugs PG. The conductive film PL is a film on the same layer as the conductive film CF2 or the conductive film CF3, and is formed by the same step as the step of forming the conductive film CF2 or CF3.

A p-type well region HPW0 and a p-type well region PW0 are formed to surround the conductive film PL and the element isolation section LOC in a planar view in the semiconductor substrate SUB positioned below the conductive film PL (below the element isolation section LOC). The well region PW0 is formed in the well region HPW0. The well region HPW0 and the well region PW0 are not electrically connected to each of the MOSFETs, the wirings M1 to M3, and the like, but are each in an electrically floating state. The well region HPW0 is formed by the same step as that of the well region HPW, and the well region PW0 is formed in the same step as that of the well regions PW1 to PW3.

Even below the pad PAD, the plurality of slits SL also each have a rectangular shape in a planar view in each of the wirings M1 and M2, and are provided in a matrix shape such that their longitudinal directions are each a column direction. The plurality of slits SL in the wiring M2 are respectively provided at positions overlapping the plurality of slits SL in the wiring M1 in a planar view. A plurality of plugs PG, a plurality of vias V1, and a plurality of vias V2 are respectively provided among columns of the plurality of slits SL.

Since each of the wiring M2 and the wiring M1 is provided with the plurality of slits SL, the stress is easy to release downward from the external connection member BW via the plurality of slits SL when the external connection member BW is formed on the pad PAD. Therefore, a crack can also be prevented from occurring even below the pad PAD, and therefore, the reliability of the semiconductor device 100 can be improved.

Second Embodiment

A semiconductor device 100 according to a second embodiment and a method of manufacturing the same will be described below with reference to FIGS. 71 to 76. In the following description, a difference from the first embodiment is mainly described, and description of the repetitive points of the first embodiment is omitted.

In the first embodiment, in the regions LA to 4A, the silicon nitride film SN1 is provided between the semiconductor substrate SUB and the interlayer insulating film IL1. In the second embodiment, a silicon nitride film SN1 in each of regions 2A to 4A is left, but a silicon nitride film SN1 in a region LA is removed.

Figure 71:
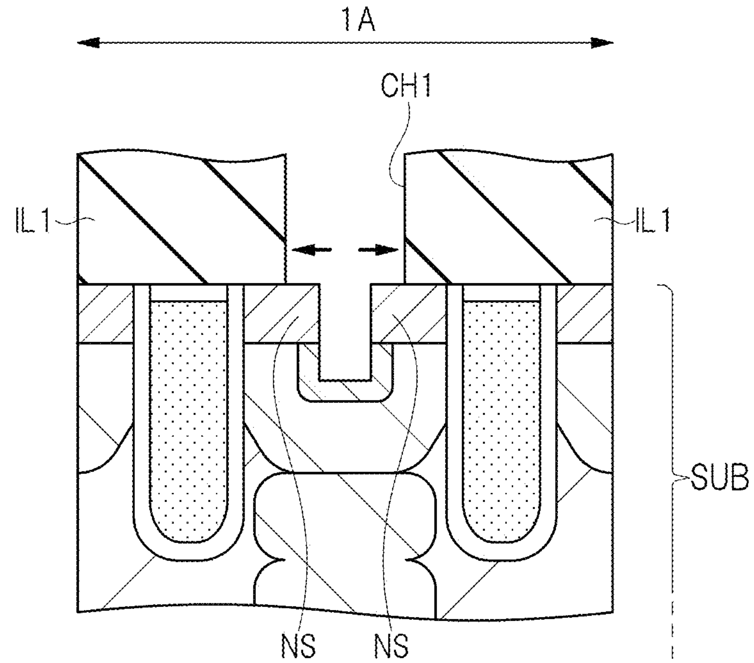
FIG. 71 is a main cross-sectional view illustrating a step of manufacturing a semiconductor device according to a second embodiment.

FIG. 71 illustrate a manufacturing step after formation of a hole CH1 illustrated in FIG. 46. As illustrated in FIG. 71, in the second embodiment, isotropic etching process is performed to an interlayer insulating film IL1 to recess the interlayer insulating film IL1. For the isotropic etching process, for example, aqueous solution containing hydrofluoric acid is used. As a result, the opening width of the hole CH1 positioned on the upper surface of the semiconductor substrate SUB is larger than the opening width of the hole CH1 in the semiconductor substrate SUB. An amount of the recessing of the interlayer insulating film IL1 caused by the isotropic etching process is, for example, 20 nm or more and 40 nm or less.

When the opening width of the hole CH1 is increased, an aspect ratio is improved when a plug PG illustrated in FIG. 52 is formed. Therefore, the plug PG is easily favorably embedded into the hole CH1. When the interlayer insulating film IL1 is recessed, an upper surface of a source region NS is exposed out. Therefore, the plug PG contacts not only a side surface of the source region NS but also the upper surface of the source region NS in the hole CH1. This makes it possible to reduce a contact resistance between the plug PG and the source region NS.

Figure 72:
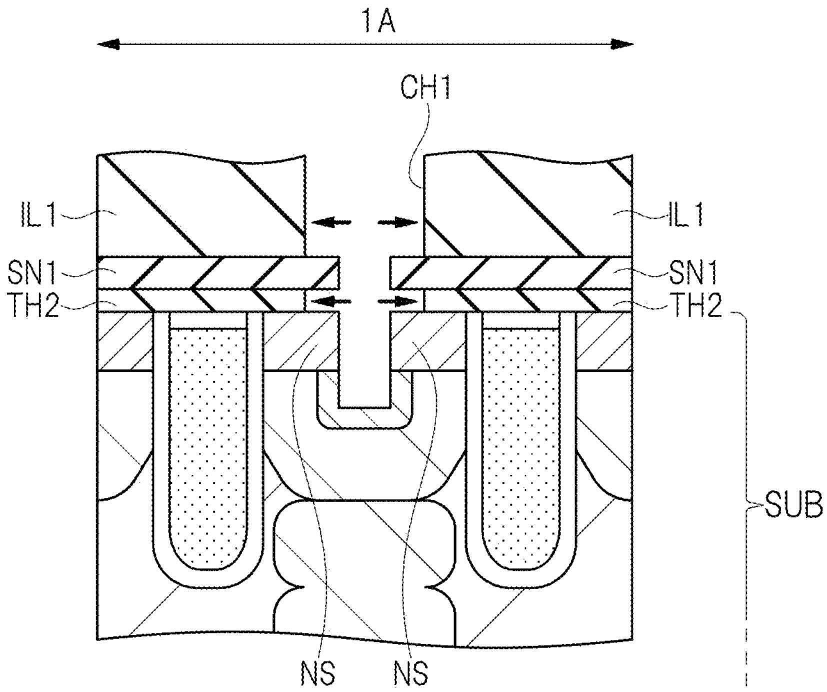
FIG. 72 is a main cross-sectional view illustrating a step of manufacturing a semiconductor device in a study example 4.

FIG. 72 illustrates a step of manufacturing a semiconductor device in a study example 4. The study example 4 is not a related art but new findings obtained from studies performed by the inventors of the present application.

First, in order to obtain a hole CH1 as illustrated in FIG. 71, it is necessary to remove the silicon nitride film SN1 in the region 1A. However, if a silicon oxide film is formed between the semiconductor substrate SUB and the silicon nitride film SN1 as described in the study example 4, not only the interlayer insulating film IL1 but also the silicon oxide film are recessed by isotropic etching process. As the silicon oxide film, a through film used when the source region NS or the like is formed by the ion implantation illustrated in FIG. 36 can be used. Here, the silicon oxide film used in the ion plantation illustrated in FIG. 36 is described as a through film TH2.

When the through film TH2, together with the interlayer insulating film IL1, is also recessed, an upper surface of the source region NS is exposed out. However, the silicon nitride film SN1 is left in an eave shape. Accordingly, when a barrier metal film in the plug PG is formed, a portion in the hole CH1 where the barrier metal film is difficult to be deposited occurs. For example, the barrier metal film is difficult to uniformly be deposited in a space between the eaves-shaped silicon nitride film SN1 and the upper surface of the semiconductor substrate SUB. Therefore, a portion in the hole CH1 where the barrier metal film is disconnected easily occurs, and the portion causes a defect. In consideration of such a problem, the silicon nitride film SN1 in the region 1A is preferably removed when the opening width of the hole CH1 is increased.

FIGS. 73 to 76 illustrate manufacturing steps performed between the manufacturing step illustrated in FIG. 36 and the manufacturing step illustrated in FIG. 38, and illustrate a step of selectively removing the silicon nitride film SN1 in the region 1A. Concepts of the region 3A and the region 4A are described substantially similarly to those of the region 2A, and therefore, illustration thereof is omitted. In a state illustrated in FIG. 73, the through film TH2 may be left or may be removed. Here, the case of the removal of the through film TH2 is exemplified.

Figure 73:
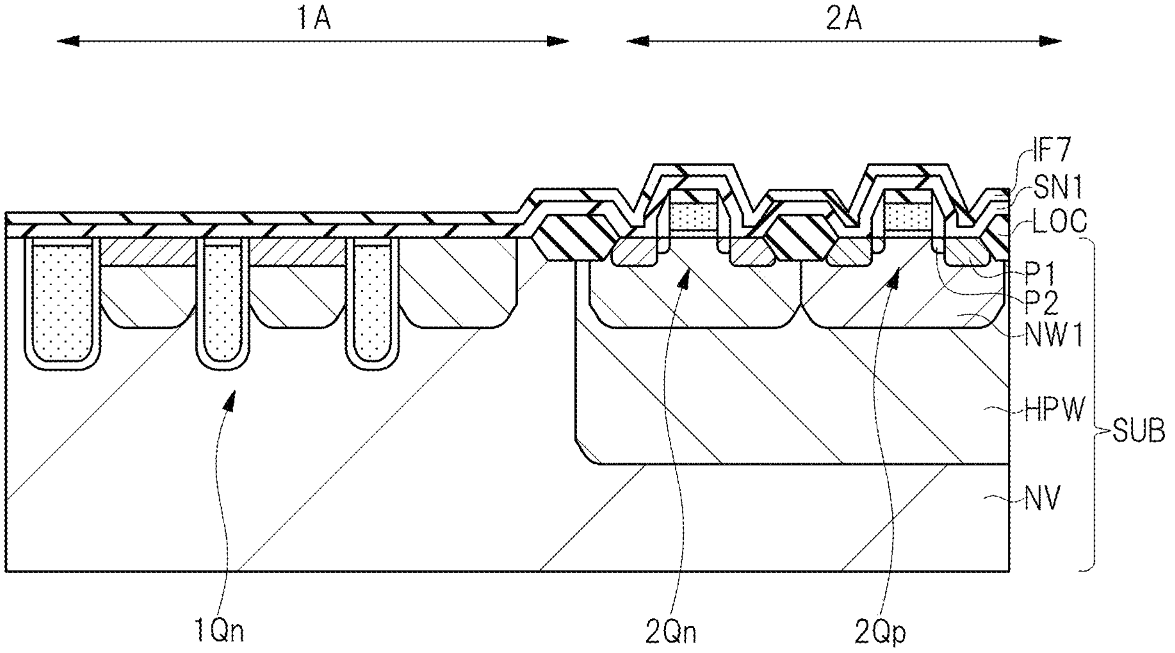
FIG. 73 is a cross-sectional view illustrating a step of manufacturing the semiconductor device according to the second embodiment.

As illustrated in FIG. 73, after the silicon nitride film SN1 is formed in FIG. 36, an insulating film IF7 composed of a silicon oxide film is formed on the silicon nitride film SN1 by, for example, a CVD method. The thickness of the insulating film IF7 is, for example, 10 nm or more and 30 nm or less.

Figure 74:
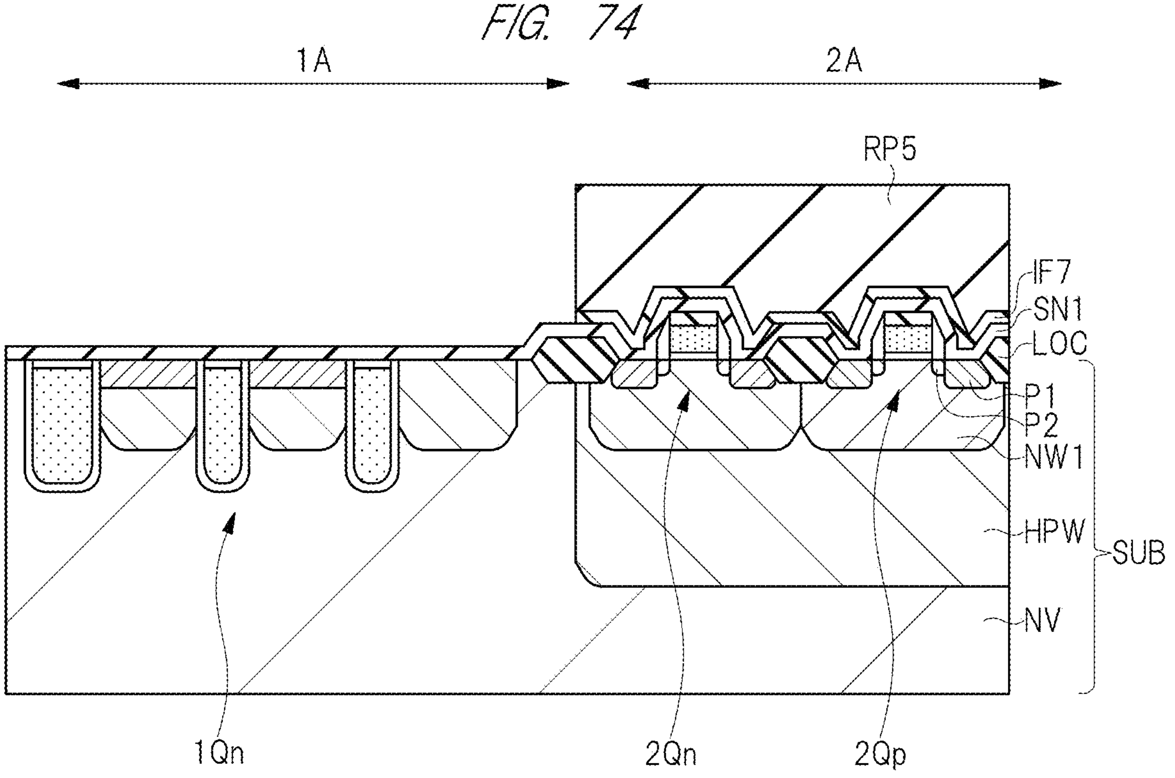
FIG. 74 is a main cross-sectional view illustrating a step of manufacturing the semiconductor device continued from FIG. 73.

As illustrated in FIG. 74, a resist pattern RP5 is first formed on the insulating film IF7 to open the region 1A and cover the regions 2A to 4A. Then, anisotropic etching process is performed using the resist pattern RP5 as a mask, to remove the insulating film IF7 in the region 1A. Then, the resist pattern RP5 is removed by asking process.

Figure 75:
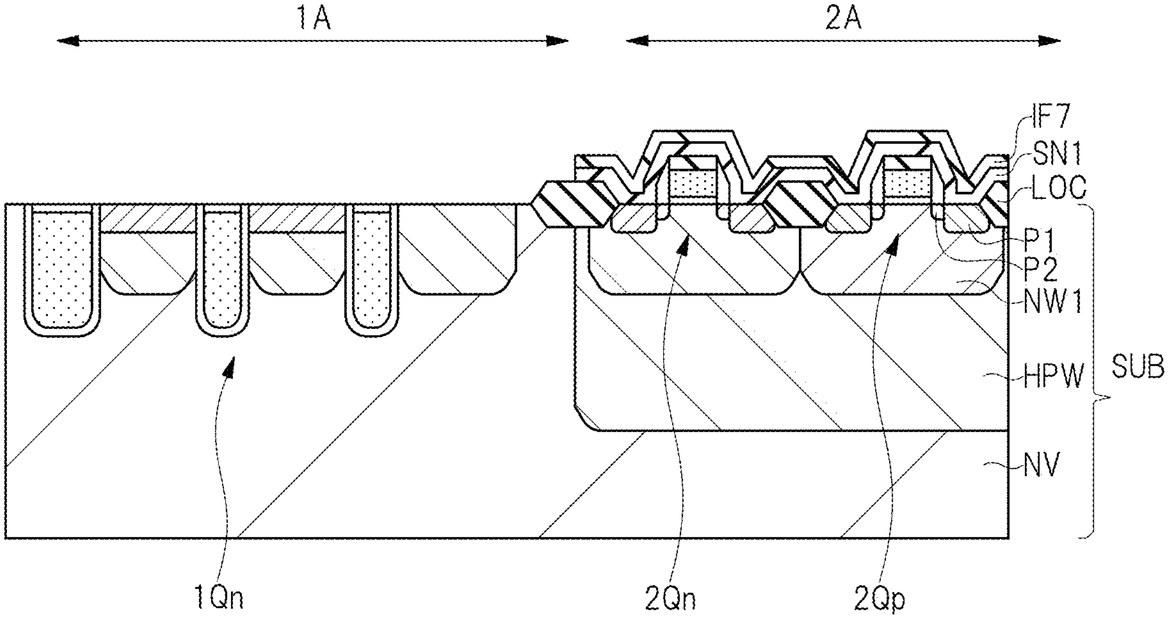
FIG. 75 is a main cross-sectional view illustrating a step of manufacturing the semiconductor device continued from FIG. 74.

As illustrated in FIG. 75, isotropic etching process using aqueous solution containing hydrofluoric acid is performed by using the insulating film IF7 in the regions 2A to 4A as a mask, to remove the silicon nitride film SN1 in the region 1A. Then, although the insulating film IF7 may be removed by performing isotropic etching process using aqueous solution containing hydrofluoric acid, the insulating film IF7 may be left in the regions 2A to 4A. If the insulating film IF7 is left, the insulating film IF7 constitutes a part of the interlayer insulating film IL1 as similar to the insulating film IF5.

Figure 76:
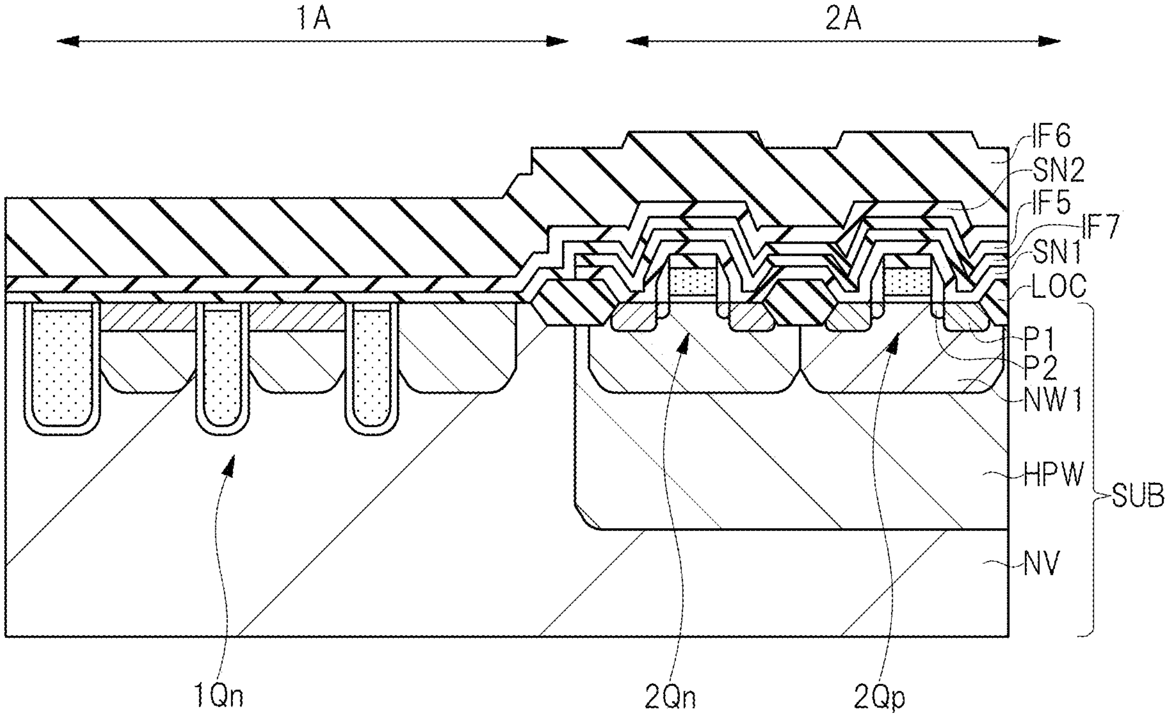
FIG. 76 is a main cross-sectional view illustrating a step of manufacturing the semiconductor device continued from FIG. 75.

In the manufacturing step illustrated in FIGS. 75 and subsequent manufacturing steps, similar manufacturing steps to those in the first embodiment are performed. FIG. 76 illustrates a state in which an insulating film IF5, a silicon nitride film SN2, and an insulating film IF6 composed of a silicon oxide film are sequentially formed, as described in FIG. 38.

In the foregoing, the present invention has been concretely described on the basis of the embodiments. However, the present invention is not limited to the foregoing embodiments, and various modifications can be made within the scope of the present invention.

What is claimed is:

1. A method of manufacturing a semiconductor device comprising steps of:

(a) preparing a semiconductor substrate of a first conductivity type having an upper surface and a lower surface;

(b) after the step (a), forming a first hard mask on the upper surface of the semiconductor substrate to selectively cover the upper surface of the semiconductor substrate;

(c) after the step (b), forming a trench in the semiconductor substrate exposed out from the first hard mask;

(d) after the step (c), forming a first gate insulating film in the trench;

(e) after the step (d), forming a first conductive film on the first gate insulating film and the first hard mask;

(f) after the step (e), removing the first conductive film on the first hard mask and forming a first gate electrode in the trench to be embedded into the trench to interpose the first gate insulating film therebetween by performing anisotropic etching process to the first conductive film;

(g) after the step (f), forming a first cap film composed of an insulating film on an upper surface of the first gate electrode;

(h) after the step (g), removing the first hard mask;

(i) after the step (h), forming a second gate insulating film on the upper surface of the semiconductor substrate;

(j) after the step (i), forming a second conductive film on the second gate insulating film and the first cap film; and (k) after the step (j), removing the second conductive film on the first cap film and forming a second gate electrode on the upper surface of the semiconductor substrate to interpose the second gate insulating film therebetween by patterning the second conductive film.

2. The method of manufacturing the semiconductor device according to claim 1, wherein in the step (k), a position of an upper surface of the first cap film is higher than a position of the upper surface of the semiconductor substrate.

3. The method of manufacturing the semiconductor device according to claim 2, wherein in the step (f), a position of the upper surface of the first gate electrode is lower than the position of the upper surface of the semiconductor substrate.

4. The method of manufacturing the semiconductor device according to claim 2, wherein in the step (k), a thickness of the first cap film is larger than a thickness of the first gate insulating film or a thickness of the second gate insulating film.

5. The method of manufacturing the semiconductor device according to claim 1, wherein in the step (g), the first cap film is formed by first thermal oxidation process of oxidizing a part of the first gate electrode, and an upper portion of the first gate electrode is rounded by the first thermal oxidation process.

6. The method of manufacturing the semiconductor device according to claim 1, wherein a material contained in the second conductive film has a lower sheet resistance than a sheet resistance of a material contained in the first conductive film.

7. The method of manufacturing the semiconductor device according to claim 1 further comprising steps of:

(l) between the step (a) and the step (b), forming a first through film composed of a silicon oxide film on the upper surface of the semiconductor substrate;

(m) between the step (l) and the step (b), forming a first well region in the semiconductor substrate by performing ion implantation from an upper surface side of the semiconductor substrate to pass through the first through film; and (n) between the step (m) and the step (b), forming a first insulating film composed of a silicon nitride film on the first through film, wherein in the step (b), the first hard mask is formed by patterning the first through film and the first insulating film.

8. The method of manufacturing the semiconductor device according to claim 7 further comprising a step of (o) between the step (m) and the step (n), performing first thermal process to the first well region.

9. The method of manufacturing the semiconductor device according to claim 7 further comprising a step of (p) between the step (n) and the step (b), forming a second insulating film composed of a silicon oxide film on the first insulating film, wherein in the step (b), the first hard mask is formed by patterning the first through film, the first insulating film, and the second insulating film, and wherein between the step (c) and the step (d), the second insulating film is removed.

10. The method of manufacturing the semiconductor device according to claim 7 further comprising steps of:

(q) between the step (a) and the step (l), forming a second hard mask on the upper surface of the semiconductor substrate to selectively cover the upper surface of the semiconductor substrate;

(r) between the step (q) and the step (l), forming an element isolation section in the semiconductor substrate exposed out from the second hard mask by performing second thermal oxidation process; and (s) between the step (r) and the step (l), removing the second hard mask, wherein the element isolation section is formed between a first region where a first MOSFET including the first gate electrode is formed and a second region where a second MOSFET including the second gate electrode is formed.

* * * * *